US008725475B2

(12) United States Patent
Zhang et al.

(10) Patent No.: US 8,725,475 B2
(45) Date of Patent: May 13, 2014

(54) PNEUMATIC DEVICE SELECTION SYSTEM, PNEUMATIC DEVICE SELECTION METHOD, RECORDING MEDIUM, AND PNEUMATIC DEVICE SELECTION PROGRAM

(75) Inventors: Huping Zhang, Moriya (JP); Mitsuru Senoo, Moriya (JP); Naotake Oneyama, Kashiwa (JP)

(73) Assignee: SMC Kabushiki Kaisha, Tokyo (JP)

( * ) Notice: Subject to any disclaimer, the term of this patent is extended or adjusted under 35 U.S.C. 154(b) by 1115 days.

(21) Appl. No.: 11/718,977

(22) PCT Filed: Nov. 11, 2005

(86) PCT No.: PCT/JP2005/020752
§ 371 (c)(1),
(2), (4) Date: May 9, 2007

(87) PCT Pub. No.: WO2006/051919
PCT Pub. Date: May 18, 2006

(65) Prior Publication Data
US 2008/0109745 A1 May 8, 2008

(30) Foreign Application Priority Data

Nov. 12, 2004 (JP) ................................. 2004-329413

(51) Int. Cl.
*G06G 7/50* (2006.01)
(52) U.S. Cl.
USPC ............................................................ 703/9
(58) Field of Classification Search
USPC ............................................................ 703/9
See application file for complete search history.

(56) References Cited

U.S. PATENT DOCUMENTS

| 6,282,463 | B1 | 8/2001 | Oneyama et al. |
| 6,507,792 | B1 | 1/2003 | Senoo et al. |
| 7,162,399 | B2 | 1/2007 | Zhang et al. |
| 2003/0069720 | A1* | 4/2003 | Zhang et al. ...................... 703/7 |

FOREIGN PATENT DOCUMENTS

| JP | 53-21320 | 7/1978 |
| JP | 10-207925 | 8/1998 |
| JP | 11-110426 | 4/1999 |
| JP | 2000-179503 | 6/2000 |
| JP | 2001-117953 | 4/2001 |

(Continued)

OTHER PUBLICATIONS

Chiaming Yen et al., "A web-based computer-aided pneumatic circuit design software", 2003, Simulation Modeling Practice and Theory, vol. 11, pp. 285-295.*

(Continued)

*Primary Examiner* — Kamini S Shah
*Assistant Examiner* — Russ Guill
(74) *Attorney, Agent, or Firm* — Paul A. Guss

(57) ABSTRACT

A pneumatic device selection system includes a standard circuit selection processor for selecting a cylinder operating system based on input data, an independent characteristic calculation processor for calculating characteristics of the cylinder operating system based on entered usage conditions, a branching and joining circuit processor for selecting a branching and joining circuit based on input data and calculating characteristics of the selected branching and joining circuit, a manifold circuit processor for selecting a manifold circuit based on input data and calculating characteristics of the selected manifold circuit, and a shock absorber selection processor for selecting a shock absorber based on input data and/or a selection result from the standard circuit selection processor.

13 Claims, 57 Drawing Sheets

(56) References Cited

FOREIGN PATENT DOCUMENTS

| JP | 2003-113808 | 4/2003 |
|----|-------------|--------|
| JP | 2003-113885 | 4/2003 |
| JP | 2003-114913 | 4/2003 |

OTHER PUBLICATIONS

Parker Fluidpower, "Industrial Pneumatic Technology", 1980, Parker Hannifin Corporation, p. 115.*
Famic Technologies, Automation Studio, downloaded from the Wayback Machine at web.archive.org web address http://www.pneusimpro.com, archived results from Jun. 9, 2004, including screen captures from downloaded movie sample from Industrial Pneumatics, four pages.*
B. Chadwick, "Design and simulate air circuits on your PC", 1997, Hydraulics & Pneumatics, vol. 50, No. 2, pp. 38-39.*
Dr. Ing T. Hong et al., "A unified approach for design and analysis of engineered systems using HyPneu", 1993, SAE Off-Road Machinery Conference, pp. 1-11.*
Dr. Ing T. Hong et al., "The dynamic analysis of pneumatic systems using HyPneu", 1996, International Fluid Power Exposition and Technical Conference, pp. 1-11.*
BarDyne Inc., "Pneumatic System Analysis Software", 2004, downloaded from the Wayback Machine at web.archive.org web address http://www.bardyne.com, archived results from Jun. 9, 2004, 3 pages.*
Famic Technologies, Automation Studio Brochure, downloaded from the Wayback Machine at web.archive.org web address http://www.pneusimpro.com, archived results from Oct. 15, 2004, 27 pages.*
AMESim Libraries Pneumatic, 2003, Imagine SA, two pages.*
Frank M. White, "Fluid Mechanics", 1999, McGraw-Hill, pp. 375-381.*
Harry L. Stewart, "Hydraulic and pneumatic power for production", 1970, Industrial Press Inc., single p. 15-24 (chapter 15, p. 24).*
Harry L. Stewart, "Pneumatics and hydraulics", 1976, Theodore Audel & Co., p. 375.*
M.Sorli et al., "Dynamic analysis of pneumatic actuators," 1999, Simulation and Practice Theory, vol. 7, pp. 589-602.*
A. Anglani et al., "A CAD environment for the numerical simulation of servo pneumatic actuator systems," 2002, 7th International Workshop on Advanced Motion Control, pp. 593-598.*
Chris Goodlet, "Software Aids Design, Simulation," Hydraulics & Pneumatics, Penton Media, Cleveland, Ohio, U.S., vol. 57, No. 9, Sep. 2004, pp. 32-34, XP-001210675 (entire document).
B. Chadwick, "Software Makes Pneumatic Circuit Design Easy," Hydraulics & Pneumatics, Penton Media, Cleveland, Ohio, U.S., vol. 49, No. 3 Mar. 1996, pp. 163-164 and 190, XP-01149901 (entire document).

* cited by examiner

FIG. 8

SYSTEM CHARACTERISTIC (Velocity [mm/s], Pressure [MPa], Displacement [mm], Acceleration [m/s²] vs TIME [s])

| | | |
|---|---|---|
| FULL STROKE TIME | 0.790 | s |
| PISTON STARTUP TIME | 0.084 | s |
| 90 % OUTPUT TIME | 0.084 | s |
| MEAN VELOCITY | 253 | mm/s |
| MAXIMUM VELOCITY | 598 | mm/s |
| STROKE END VELOCITY | 598 | mm/s |
| MAXIMUM ACCELERATION | 1.12 | m/s2 |
| MAXIMUM PRESSURE | 0.514 | MPa |
| AIR CONSUMPTION PER CYCLE | 4.98 | dm3 (ANR) |
| REQUIRED AIR FLOW RATE | 176.8 | dm3/min (ANR) |

[BASIC] [CUSHION CALCULATION] [MOISTURE CONDENSATION CALCULATION]

[TO SHOCK ABSORBER SELECTION] [TO CHARACTERISTIC CALCULATION]

RESULTS OF DEVICE SELECTION

| DEVICE | PRODUCT NUMBER | MANAGEMENT |
|---|---|---|
| CYLINDER | XXXX-XXX | XXXXX |
| SOLENOID VALVE | XX-XXXX | X |
| MANIFOLD | XXXXXX | XX |
| SILENCER | XXXX-XXX | XXXXX |
| FLOW CONTROL DEVICE | XXXXX | XXXX-XXXX |
| TUBE | XX-XXXX | XX-XXXX |

INPUT VALUES/CIRCUIT CONFIGURATION

| | | |
|---|---|---|
| STROKE | XXX | mm |
| OPERATING DIRECTION | X | |
| FULL STROKE TIME | XXX | s |
| SUPPLY PRESSURE | XXX | MPa |
| AMBIENT TEMPERATURE | XX | °C |
| TOTAL TUBE LENGTH (RIGHT) | XX | m |
| TOTAL TUBE LENGTH (LEFT) | XX | m |
| FLOW CONTROL DEVICE LAYOUT (RIGHT) | XXXX | |
| FLOW CONTROL DEVICE LAYOUT (LEFT) | XXXX | |
| LOAD MASS | XXX | kg |
| REQUIRED THRUST | XXX | N |
| MOUNTING ANGLE | XXX | deg |
| REQUIRED THRUST | XXX | N |
| APPLICATION/LOAD FACTOR | XXX | XXX |
| FRICTION FACTOR | XXX | XXX |

[RETURN] [PRINT] [PRINT INPUT COMMENT] [SAVE] [CANCEL]

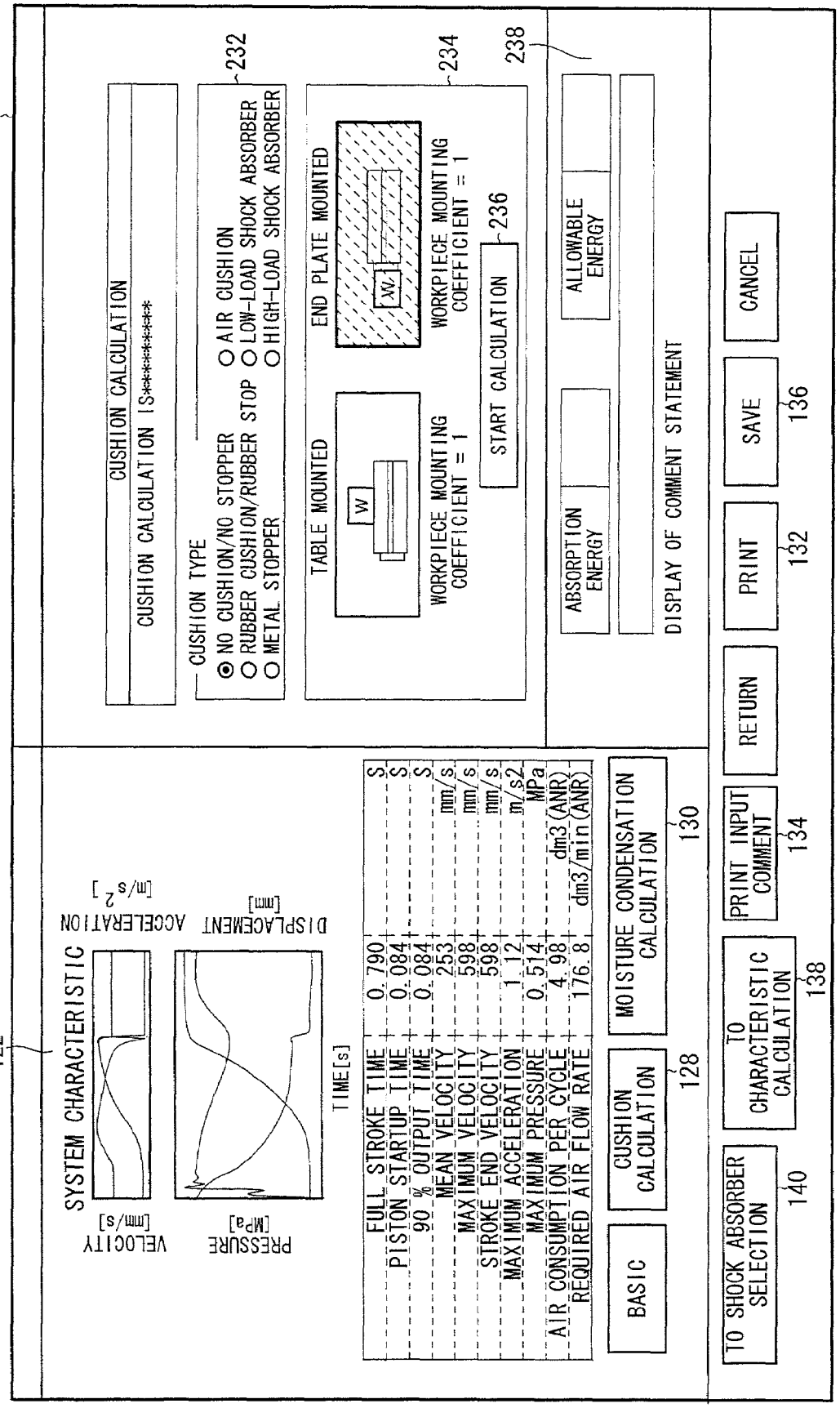

MAIN ROUTINE (PART 1)

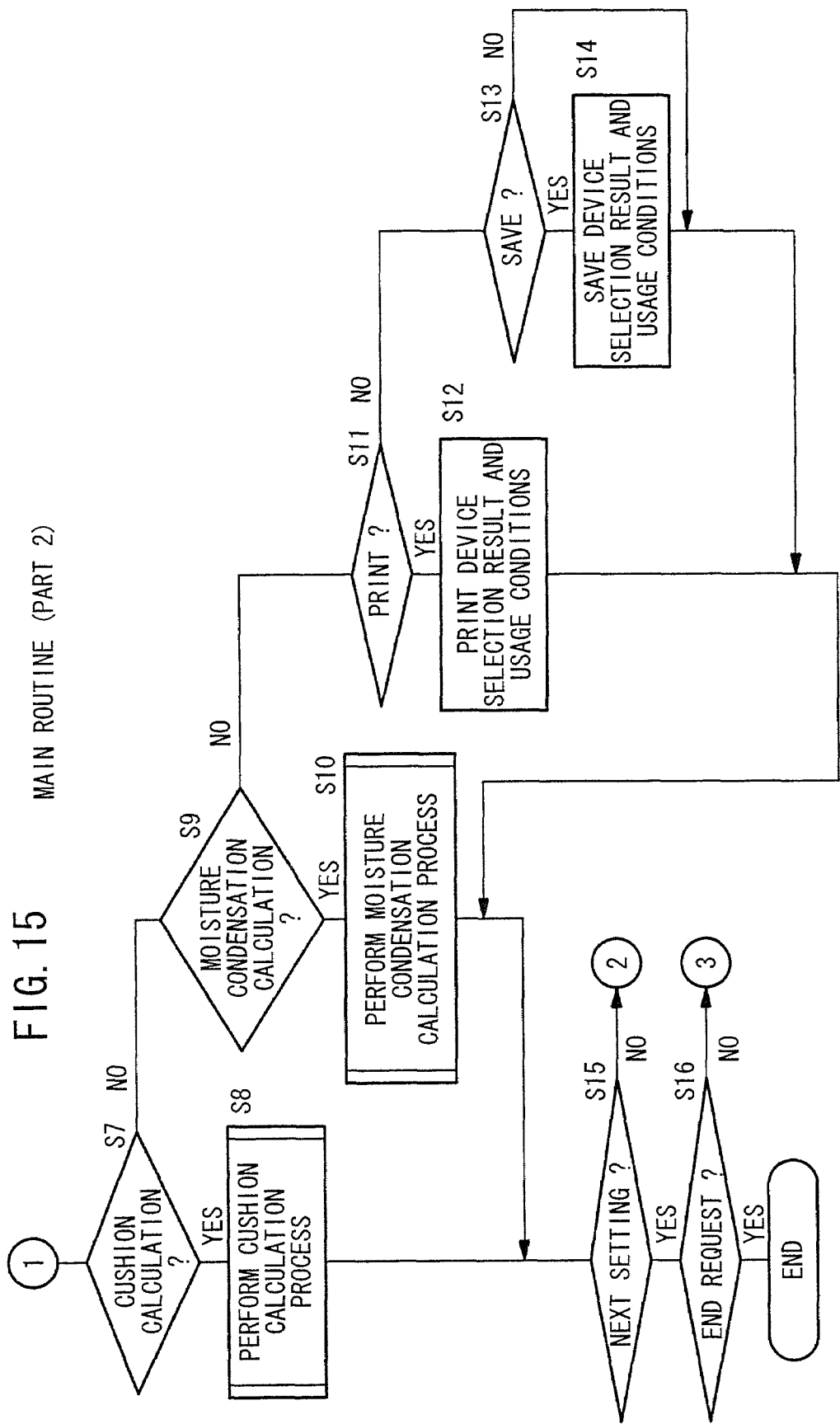
FIG. 15  MAIN ROUTINE (PART 2)

FIG. 16A

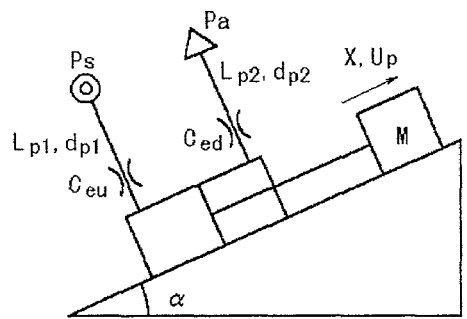

FIG. 16B $$q_m = Cp_1\rho_0\sqrt{\frac{T_0}{T_1}} \qquad (1a)$$

$$q_m = Cp_1\rho_0\sqrt{\frac{T_0}{T_1}}\sqrt{1-\left(\frac{\frac{p_2}{p_1}-b}{1-b}\right)^2} \qquad (1b)$$

FIG. 16C

STATE EQUATION $\qquad PV = wR\theta \qquad (2)$

↓ DIFFERENTIATED

DISCHARGE CHAMBER $\quad \dfrac{dD_d}{dt} = \dfrac{1}{V_d}\left(\dfrac{P_d V_d}{\theta_d}\dfrac{d\theta_d}{dt} + R\theta_d G_d - P_d\dfrac{dV_d}{dt}\right) \qquad (3)$ CHARGE CHAMBER $\quad \dfrac{dD_u}{dt} = \dfrac{1}{V_u}\left(\dfrac{P_u V_u}{\theta_u}\dfrac{d\theta_u}{dt} + R\theta_u G_u - P_u\dfrac{dV_u}{dt}\right) \qquad (4)$ ENERGY EQUATION $\quad \dfrac{t}{dt}(C_v w\theta) = Q + CpG\theta_i + P\dfrac{dV}{dt} \qquad (5)$

↓

DISCHARGE CHAMBER $\quad \dfrac{d\theta_d}{dt} = \dfrac{1}{C_v w_d}\left(S_{hd}h_d(\theta_a - \theta_d) + RG_d\theta_d - P_d\dfrac{dV_d}{dt}\right) \qquad (6)$ CHARGE CHAMBER $\quad \dfrac{d\theta_u}{dt} = \dfrac{1}{C_v w_u}\left(S_{hu}h_u(\theta_a - \theta_u) + C_p G_u\theta_i - C_v G_u\theta_u - P_u\dfrac{dV_u}{dt}\right) \qquad (7)$ KINETIC EQUATION $\quad M\dfrac{dU_p}{dt} = P_u S_u - P_d S_d + P_a(S_d - S_u) - Mg\sin\alpha - cu_p - Fq \qquad (8)$ $$\alpha = \frac{C_1}{C_1 \cdot b_1} \quad (1)$$

$$\alpha \leq 1 \Rightarrow C_{1,2} = C_1$$

$$\alpha > 1 \Rightarrow C_{1,2} = C_2 \cdot \alpha \cdot \frac{\alpha \cdot b_1 + (1-b_1) \cdot \sqrt{\alpha^2 + \left(\frac{1-b_1}{b_1}\right)^2 - 1}}{\alpha^2 + \left(\frac{1-b_1}{b_1}\right)^2} \quad (2)$$

$$b_{1,2} = 1 - C_{1,2}^2 \cdot \left[\left(\frac{1-b_1}{C_1^2}\right) + \left(\frac{1-b_2}{C_2^2}\right)\right] \quad (3)$$

FIG. 20A

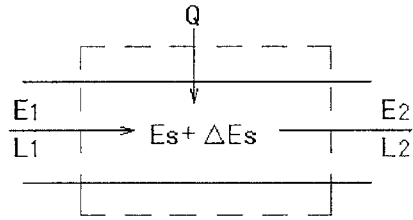

FIG. 20B  BASIC EQUATIONS FOR MANAGEMENT

CONTINUOUS EQUATION $\quad \dfrac{\partial \rho}{\partial t} + \rho \dfrac{\partial u}{\partial z} + u \dfrac{\partial \rho}{\partial z} = 0 \quad (9)$ STATE EQUATION $\quad V\dfrac{dP}{dt} = R\theta \dfrac{dW}{dt} + wR \dfrac{d\theta}{dt} \quad (10)$ KINETIC EQUATION $\quad \dfrac{\partial u}{\partial t} + u\dfrac{\partial u}{\partial z} + \dfrac{1}{\rho}\dfrac{\partial \rho}{\partial z} + f = 0 \quad (11)$ $$f = \dfrac{\lambda}{2dp}u|u| \qquad \lambda = \dfrac{64}{Re} \quad Re < 2.5 \times 10^3$$

$$\lambda = 0.3164 Re^{-0.25} \quad Re \geq 2.5 \times 10^3$$

ENERGY EQUATION $\quad \Delta E_s = E_1 - E_2 + L_1 - L_2 + Q \quad (12)$

FIG. 20C

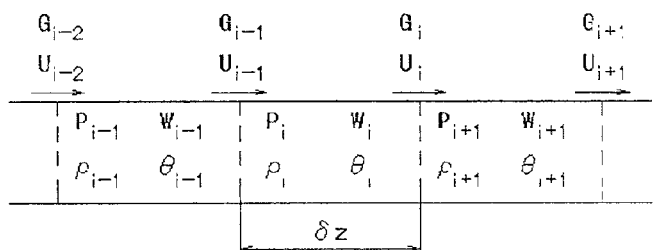

TUBE LINE
DISCRETE
MODEL

FIG. 20D

BASIC EQUATIONS MADE DISCRETE

CONTINUOUS EQUATION $\quad \dfrac{\partial w_i}{\partial t} = G_{i-1} - G_i \qquad G = \rho A u \quad (13)$ STATE EQUATION $\quad \dfrac{dP_i}{dt} = \dfrac{R\theta_i}{V}(G_{i-1} - G_i) + \dfrac{Rw_i}{V}\dfrac{d\theta_i}{dt} \quad (14)$ KINETIC EQUATION $\quad \dfrac{\partial u}{\partial t} = \dfrac{P_i - P_{i+1}}{\hat\rho \partial z} - \dfrac{\lambda}{2d}u_i|u_i| - |u_i|\dfrac{\partial u_i}{\partial z} \quad (15)$ $$\hat\rho = \dfrac{\rho_i + \rho_{i+1}}{2} \quad \dfrac{\partial u_i}{\partial z} = \dfrac{u_{i-1} - u_{i+1}}{2\partial z}$$

ENERGY EQUATION $$\dfrac{d\theta_i}{dt} = \dfrac{1}{C_v w_i}\left\{ E_1 - E_2 + L_1 - L_2 + Q - \dfrac{d}{dt}\left[\dfrac{1}{2}C_1 w_1\left(\dfrac{u_{i-1} - u_i}{2}\right)^2\right]\right\} \quad (16)$$

FIG. 21

| [SYMBOLS] | |
|---|---|
| C | VISCOUS FRICTION FACTOR |
| Cv | CONSTANT VOLUME RATIO |
| d | TUBE INSIDE DIAMETER |
| Fq | MAXIMUM STATIC FRICTIONAL FORCE |
| G | MASS FLOW RATE |
| h | HEAT TRANSFER COEFFICIENT |
| M | LOAD MASS |
| P | PRESSURE |
| Pa | ATMOSPHERIC PRESSURE |
| Ps | SUPPLY PRESSURE |
| $S_h$ | HEAT TRANSFER AREA |
| t | TIME |
| u | FLOW VELOCITY IN TUBE |
| V | VOLUME |
| w | AIR MASS |
| z | TUBE COORDINATE |
| $\theta$ | TEMPERATURE |
| $\theta a$ | ATMOSPHERIC TEMPERATURE |
| $\kappa$ | SPECIFIC HEAT RATIO |
| $\Delta Es$ | ENERGY NEWLY ACCUMULATED IN SYSTEM |
| E1, E2 | TOTAL ENERGY BROUGHT IN AND OUT WITH FLUID |
| L1, L2 | FLOW WORK DONE IN AND OUT OF SYSTEM BY FLUID |
| Q | ENERGY FLOWING IN BY HEAT TRANSFER |
| L | LENGTH OF TUBE, FLOW WORK DONE IN AND OUT OF SYSTEM BY FLUID |
| P1 | PRESSURE DOWNSTREAM OF RESTRICTION |
| Ph | PRESSURE UPSTREAM OF RESTRICTION |
| $t_{req}$ | SPECIFIED RESPONSE TIME |
| A | EFFECTIVE TUBE AREA |
| b | CRITICAL PRESSURE RATIO |
| C | SONIC CONDUCTANCE |
| p | ABSOLUTE STATIC PRESSURE |
| $q_m$ | MASS FLOW RATE |
| $q_v$ | VOLUMETRIC FLOW RATE CONVERTED AT STANDARD STATE |
| R | GAS CONSTANT |
| s | COMPRESSION EFFECT COEFFICIENT |
| T | ABSOLUTE TEMPERATURE |
| $\Delta p$ | PRESSURE DROP ($p_1 - p_2$) |
| $\rho$ | DENSITY |

| [SUFFIX] | |
|---|---|
| d | DISCHARGE SIDE |
| u | CHARGE SIDE |
| p | TUBE |

CALCULATED RESULTS

| ABSORPTION ENERGY | XXXXXX |
|---|---|
| KINETIC ENERGY | XXXXXX |
| THRUST ENERGY | XXXX |
| IMPACT OBJECT EQUIVALENT MASS | XXXXXXX |

SELECTION RESULTS

| TYPE | MAXIMUM ABSORPTION ENERGY |
|---|---|
| XXXXXXX | XXXXXX |
| XXXXXXX | XXXX |
| XXXXXXX | XXXXXXX |

| MAXIMUM ABSORPTION ENERGY | | J |
|---|---|---|
| ABSORPTION STROKE | | mm |
| IMPACT VELOCITY | | mm/s |
| SPRING FORCE (WHEN EXTENDED) | | N |
| SPRING FORCE (WHEN COMPRESSED) | | N |
| AMBIENT TEMPERATURE RANGE | | °C |

MAXIMUM USAGE FREQUENCY [ ] N
MAXIMUM ALLOWABLE THRUST [ ] N
MASS [ ] kg

[RETURN] [PRINT] [SAVE] [CANCEL]

[PRINT INPUT COMMENT]

FIG. 53

| NUMBER | DROP-DOWN LIST OF ITEMS |
|---|---|
| 100 | FULL STROKE TIME |
| 110 | STROKE |
| 120 | AMBIENT TEMPERATURE |
| 130 | SUPPLY PRESSURE |
| 140 | LOAD MASS |
| 150 | LOAD FORCE |
| 160 | MOUNTING ANGLE |
| 170 | APPLICATION/LOAD FACTOR |
| 181 | FRICTION FACTOR |
| 210 | TOTAL LENGTH RIGHT |
| 220 | TOTAL LENGTH LEFT |
| 230 | FLOW CONTROL DEVICE LAYOUT RIGHT |
| 240 | FLOW CONTROL DEVICE LAYOUT LEFT |
| 270 | NAME OF REGISTRANT |

UNIT OF SELECTION ITEMS SECONDS [s]
INPUT RANGE 0.1–100

| NUMBER | NUMERICAL DATA |
|---|---|
| 100 | |
| 110 | |
| 120 | |
| 130 | |

Tabs: DEVICE SELECTION | BRANCHING CIRCUIT | MANIFOLD CIRCUIT | SHOCK ABSORBER

Buttons: ADD, DELETE, OK, CANCEL

FIG. 54

| PRESENT STANDARDS IN USE | |
|---|---|
| [UNIT SYSTEM] SI TEST :SI TEST | |

| UNIT NAME | STANDARD NAME |
|---|---|
| [UNIT SYSTEM]SI | SI |
| [UNIT SYSTEM]SI TEST | SI TEST |

622

[SELECT] 626

| INPUT VALUE/CIRCUIT CONFIGURATION | UNIT IN USE |
|---|---|
| STROKE | mm |
| SUPPLY PRESSURE | MPa |
| AMBIENT TEMPERATURE | °C |
| LOAD MASS | kg |
| LOAD FORCE | N |
| MOUNTING ANGLE | deg |
| FULL STROKE TIME | s |
| TOTAL LENGTH (TOTAL TUBE LENGTH) RIGHT | m |
| TOTAL LENGTH (TOTAL TUBE LENGTH) LEFT | m |
| INTER-CYLINDER DISTANCE RIGHT | m |
| INTER-CYLINDER DISTANCE LEFT | m |
| MAXIMUM STROKE | mm |
| FULL STROKE TIME | s |
| PISTON STARTUP TIME | s |
| MEAN VELOCITY | mm/s |
| MAXIMUM VELOCITY | mm/s |
| STROKE END VELOCITY | mm/s |
| MAXIMUM ACCELERATION | m/s2 |
| MAXIMUM PRESSURE | MPa |

624

620

[OK] [CANCEL]

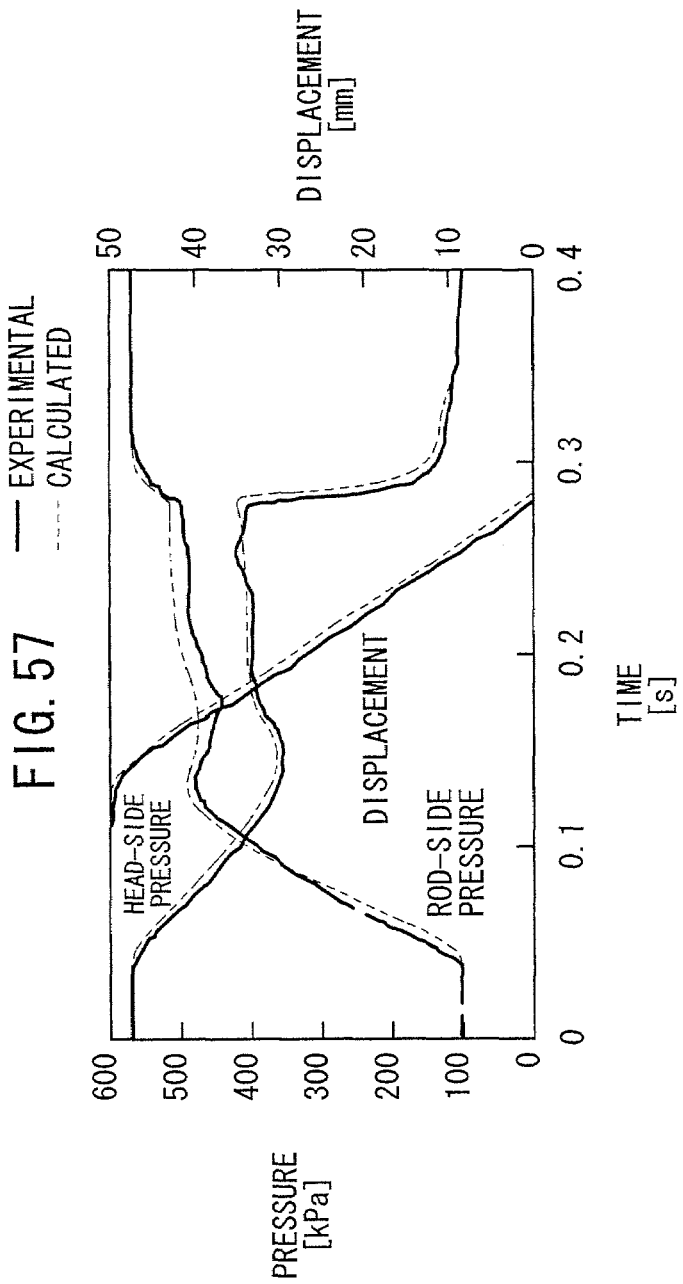

PNEUMATIC DEVICE SELECTION SYSTEM, PNEUMATIC DEVICE SELECTION METHOD, RECORDING MEDIUM, AND PNEUMATIC DEVICE SELECTION PROGRAM

TECHNICAL FIELD

The present invention relates to a system for selecting a pneumatic device, a method of selecting a pneumatic device, a recording medium, and a pneumatic device selection program, and more particularly to a pneumatic device selection system, a pneumatic device selection method, a recording medium, and a pneumatic device selection program which are suitable for selecting a branching and joining circuit having at least two pneumatic circuits having at least one cylinder, and one solenoid valve, and for selecting a manifold circuit having at least two pneumatic circuits having at least a cylinder and a solenoid valve, and at least one manifold.

BACKGROUND ART

In order to construct a pneumatic system (a terminal system including components from a directional control valve to an air cylinder) which is specified by a user, there has been devised a slide rule for designing a pneumatic pressure control system (e.g., see Patent Document 1).

The slide rule has fixed and slidable scales marked on their face and back sides with graduations to satisfy a formula for determining a stroke time of a double-acting cylinder, a formula for determining a cylinder output, a formula for determining an amount of air consumed by the cylinder and a tube connected thereto, and other formulas. In combination with cursor operations, the slide rule can quickly calculate specifications required for designing the pneumatic pressure control system.

Heretofore, it has been customary to select pneumatic devices according to approximate simple calculations on the slide rule because accurate dynamic simulations of a desired pneumatic pressure control system have not been possible. Therefore, the results of a conventional process of selecting pneumatic devices satisfy required values with considerably low probability, making it impossible to construct a desired pneumatic pressure control system of a minimum group of pneumatic devices and to achieve a minimum energy consumption and a minimum cost.

For the above reasons, there has been a demand for a process of quickly selecting a group of optimum pneumatic devices which satisfy conditions specified by the user, using highly accurate and reliable calculating methods. For selecting a pneumatic device, it is necessary to satisfy (1) a load condition (a dynamic condition for a selected system to operate sufficiently under input conditions, such as a load mass and thrust, an application, and a supplied air pressure, of a specified operating unit (pneumatic actuator)), (2) a velocity condition (a condition for a selected system to reach a stroke end of an output member (e.g., the piston of a cylinder) of a pneumatic actuator within a specified full stroke time), (3) a strength condition (a condition for a selected system to satisfy the specified load condition while preventing the pneumatic actuator from being buckled, deformed, or broken), and (4) a connecting condition (a condition for devices making up a selected system to be connected normally).

The applicant of the present application has proposed a method of selecting a pneumatic device in order to satisfy the above conditions (e.g., see Patent Documents 2 through 5). The proposed method is advantageous in that it can select a pneumatic device highly accurately by using a dynamic characteristic analyzing process, unlike a conventional effective area method.

Patent Document 1: Japanese Patent Publication No. 53-21320;
Patent Document 2: Japanese Laid-Open Patent Publication No. 2000-179503;
Patent Document 3: Japanese Laid-Open Patent Publication No. 2003-113808;
Patent Document 4: Japanese Laid-Open Patent Publication No. 2003-113885; and
Patent Document 5: Japanese Laid-Open Patent Publication No. 2003-114913.

DISCLOSURE OF THE INVENTION

It is an object of the present invention to provide a pneumatic device selection system, a pneumatic device selection method, a recording medium, and a pneumatic device selection program which increase the accuracy of a process of selecting a pneumatic device and also increase the ease with which to select various pneumatic devices, by further improving the functions and calculating processes of the proposed methods of selecting a pneumatic device.

A pneumatic device selection system according to the present invention has a computer, an input unit connected to the computer, for entering input data based on an input action of an operator into the computer, and a display unit connected to the computer, for displaying processed information from the computer, wherein the pneumatic device selection system comprises a branching and joining circuit selecting means for selecting a branching and joining circuit having one solenoid valve and at least two pneumatic circuits each having at least one cylinder, based on input data from the input unit, and a characteristic calculating means for calculating characteristics of the branching and joining circuit selected by the branching and joining circuit selecting means, based on input data from the input unit.

A pneumatic device selection method according to the present invention for use in a pneumatic device selection system having a computer, an input unit connected to the computer, for entering input data based on an input action of an operator into the computer, and a display unit connected to the computer, for displaying processed information from the computer, comprises the steps of selecting a branching and joining circuit having one solenoid valve and at least two pneumatic circuits each having at least one cylinder, based on input data from the input unit, and calculating characteristics of the branching and joining circuit selected in the branching and joining circuit selecting step, based on input data from the input unit.

A computer-readable recording medium according to the present invention records therein a program for enabling a pneumatic device selection system having a computer, an input unit connected to the computer, for entering input data based on an input action of an operator into the computer, and a display unit connected to the computer, for displaying processed information from the computer, to function as a branching and joining circuit selecting means for selecting a branching and joining circuit having one solenoid valve and at least two pneumatic circuits each having at least one cylinder, based on input data from the input unit, and a characteristic calculating means for calculating characteristics of the branching and joining circuit selected by the branching and joining circuit selecting means, based on input data from the input unit.

A pneumatic device selection program according to the present invention enables a pneumatic device selection system having a computer, an input unit connected to the computer, for entering input data based on an input action of an operator into the computer, and a display unit connected to the computer, for displaying processed information from the computer, to function as a branching and joining circuit selecting means for selecting a branching and joining circuit having one solenoid valve and at least two pneumatic circuits each having at least one cylinder, based on input data from the input unit, and a characteristic calculating means for calculating characteristics of the branching and joining circuit selected by the branching and joining circuit selecting means, based on input data from the input unit.

With the above arrangement, the accuracy as to a process of selecting not only a pneumatic circuit alone, but also a pneumatic device having a branching and joining circuit including a plurality of pneumatic circuits is increased, and the ease with which to select various devices is increased.

A pneumatic device selection system according to the present invention having a computer, an input unit connected to the computer, for entering input data based on an input action of an operator into the computer, and a display unit connected to the computer, for displaying processed information from the computer, comprises a manifold circuit selecting means for selecting a manifold circuit having at least one manifold and at least two pneumatic circuits each having at least a cylinder and a solenoid valve, based on input data from the input unit, and a characteristic calculating means for calculating characteristics of the manifold circuit selected by the manifold circuit selecting means, based on input data from the input unit.

A pneumatic device selection method according to the present invention for use in a pneumatic device selection system having a computer, an input unit connected to the computer, for entering input data based on an input action of an operator into the computer, and a display unit connected to the computer, for displaying processed information from the computer, comprises the steps of selecting a manifold circuit having at least one manifold and at least two pneumatic circuits each having at least a cylinder and a solenoid valve, based on input data from the input unit, and calculating characteristics of the manifold circuit selected in the manifold circuit selecting step, based on input data from the input unit.

A computer-readable recording medium according to the present invention records therein a program for enabling a pneumatic device selection system having a computer, an input unit connected to the computer, for entering input data based on an input action of an operator into the computer, and a display unit connected to the computer, for displaying processed information from the computer, to function as a manifold circuit selecting means for selecting a manifold circuit having at least one manifold and at least two pneumatic circuits each having at least a cylinder and a solenoid valve, based on input data from the input unit, and a characteristic calculating means for calculating characteristics of the manifold circuit selected by the manifold circuit selecting means, based on input data from the input unit.

A pneumatic device selection program according to the present invention enables a pneumatic device selection system having a computer, an input unit connected to the computer, for entering input data based on an input action of an operator into the computer, and a display unit connected to the computer, for displaying processed information from the computer, to function as a manifold circuit selecting means for selecting a manifold circuit having at least one manifold and at least two pneumatic circuits each having at least a cylinder and a solenoid valve, based on input data from the input unit, and a characteristic calculating means for calculating characteristics of the manifold circuit selected by the manifold circuit selecting means, based on input data from the input unit.

With the above arrangement, the accuracy as to a process of selecting not only a pneumatic circuit alone, but also a pneumatic device having a manifold circuit including a plurality of pneumatic circuits is increased, and the ease with which to select various devices is increased.

A pneumatic device selection system according to the present invention has a computer, an input unit connected to the computer, for entering input data based on an input action of an operator into the computer, and a display unit connected to the computer, for displaying processed information from the computer, wherein the pneumatic device selection system comprises a branching and joining circuit selecting means for selecting a branching and joining circuit having one solenoid valve and at least two pneumatic circuits each having at least one cylinder, based on input data from the input unit, a manifold circuit selecting means for selecting a manifold circuit having at least one manifold and at least two pneumatic circuits each having at least a cylinder and a solenoid valve, based on input data from the input unit, and a characteristic calculating means for calculating characteristics of the branching and joining circuit selected by the branching and joining circuit selecting means, or characteristics of the manifold circuit selected by the manifold circuit selecting means, based on input data from the input unit.

A pneumatic device selection method according to the present invention for use in a pneumatic device selection system having a computer, an input unit connected to the computer, for entering input data based on an input action of an operator into the computer, and a display unit connected to the computer, for displaying processed information from the computer, comprises the steps of selecting a branching and joining circuit having one solenoid valve and at least two pneumatic circuits each having at least one cylinder, based on input data from the input unit, selecting a manifold circuit having at least one manifold and at least two pneumatic circuits each having at least a cylinder and a solenoid valve, based on input data from the input unit, and calculating characteristics of the branching and joining circuit selected in the branching and joining circuit selecting step, or characteristics of the manifold circuit selected in the manifold circuit selecting step, based on input data from the input unit.

A computer-readable recording medium according to the present invention records therein a program for enabling a pneumatic device selection system having a computer, an input unit connected to the computer, for entering input data based on an input action of an operator into the computer, and a display unit connected to the computer, for displaying processed information from the computer, to function as a branching and joining circuit selecting means for selecting a branching and joining circuit having one solenoid valve and at least two pneumatic circuits each having at least one cylinder, based on input data from the input unit, a manifold circuit selecting means for selecting a manifold circuit having at least one manifold and at least two pneumatic circuits each having at least a cylinder and a solenoid valve, based on input data from the input unit, and a characteristic calculating means for calculating characteristics of the branching and joining circuit selected by the branching and joining circuit selecting means, or characteristics of the manifold circuit selected by the manifold circuit selecting means, based on input data from the input unit.

A pneumatic device selection program according to the present invention enables a pneumatic device selection system having a computer, an input unit connected to the computer, for entering input data based on an input action of an operator into the computer, and a display unit connected to the computer, for displaying processed information from the computer, to function as a branching and joining circuit selecting means for selecting a branching and joining circuit having one solenoid valve and at least two pneumatic circuits each having at least one cylinder, based on input data from the input unit, a manifold circuit selecting means for selecting a manifold circuit having at least one manifold and at least two pneumatic circuits each having at least a cylinder and a solenoid valve, based on input data from the input unit, and a characteristic calculating means for calculating characteristics of the branching and joining circuit selected by the branching and joining circuit selecting means, or characteristics of the manifold circuit selected by the manifold circuit selecting means, based on input data from the input unit.

With the above arrangement, the accuracy as to a process of selecting not only a pneumatic circuit alone, but also a pneumatic device having a branching and joining circuit and a manifold circuit each including a plurality of pneumatic circuits is increased, and the ease with which to select various devices is increased.

The invention described above may further have a means for (the step of) displaying the branching and joining circuit which is being selected or has been selected by the branching and joining circuit selecting means (step), and a means for (the step of) displaying results calculated by the characteristic calculating means (step).

The invention described above may further have a means for (the step of) displaying the manifold circuit which is being selected or has been selected by the manifold circuit selecting means (step), and a means for (the step of) displaying results calculated by the characteristic calculating means (step).

The branching and joining circuit selecting means (step) may have a common selecting means for (the step of) selecting a common item of a selected pneumatic circuit, and an individual selecting means for (the step of) selecting an individual item of the selected pneumatic circuit.

The manifold circuit selecting means (step) may have a common selecting means for (the step of) selecting a common item of a selected pneumatic circuit, and an individual selecting means for (the step of) selecting an individual item of the selected pneumatic circuit.

The characteristic calculating means (step) for the branching and joining circuit may have a flow volume adding means for (the step of) adding flow volumes from the selected two or more pneumatic circuits at predetermined time intervals, and a repeating means for (the step of) performing calculations at the flow volume adding means (step) until all the selected two or more pneumatic circuits reach a stroke end.

The characteristic calculating means (step) for the manifold circuit may have a flow volume adding means for (the step of) adding flow volumes from respective solenoid valves of the selected two or more pneumatic circuits at predetermined time intervals, a dynamic characteristic calculating means for (the step of) calculating dynamic characteristics of the manifold based on the sum of the flow volumes at each of the predetermined time intervals, and a repeating means for (the step of) performing calculations at the flow volumes adding means (step) and calculations at the dynamic characteristic calculating means (step) until all the selected two or more pneumatic circuits reach a stroke end.

As described above, the pneumatic device selection system, the pneumatic device selection method, the recording medium, and the pneumatic device selection program according to the present invention can increase the accuracy of a process of selecting a pneumatic device and also increase the ease with which to select various pneumatic devices, by further improving the functions and calculating processes of the conventional methods of selecting a pneumatic device.

BRIEF DESCRIPTION OF THE DRAWINGS

FIG. 8 is a diagram showing a displayed example of a device selection result screen;

FIG. 9 is a diagram showing a displayed example of a cushion calculation screen;

FIG. 15 is a flowchart (part 2) of the processing sequence of the standard circuit selection processing means:

FIG. 16A is a diagram showing a physical model of a cylinder operating system, FIG. 16B is a diagram showing basic equations for a restriction, and FIG. 16C is a diagram showing basic equations for an air cylinder;

FIG. 20A is a diagram showing a tube line model used in characteristic calculations, FIG. 20B is a diagram showing basic equations for a tube line, FIG. 20C is a diagram of a tube line discrete model of an ith element of n elements into which the tube line is divided, and FIG. 20D is a diagram showing basic equations for the ith element of the tube line discrete model;

FIG. 21 is a diagram showing explanations of symbols and suffixes in the basic equations shown in FIGS. 16A through 16C and FIGS. 20A through 20D;

FIG. 33 is a diagram showing a displayed example of an individual selection screen;

FIG. 50 is a diagram showing a displayed example of a second shock absorber selection input screen;

FIG. 51 is a diagram showing a displayed example of a shock absorber selection result screen;

FIG. 53 is a diagram showing a displayed example of a general-purpose master screen;

FIG. 54 is a diagram showing a displayed example of a unit master screen;

FIG. 57 is a characteristic diagram showing calculated results and experimental results at the time the 20-50-diameter cylinder in the branching and joining circuit has its piston rod retracted.

BEST MODE FOR CARRYING OUT THE INVENTION

A pneumatic device selection system, a pneumatic device selection method, a recording medium, and a pneumatic device selection program according to an embodiment of the present invention will be described below with reference to FIGS. 1 through 57.

Figure 1:
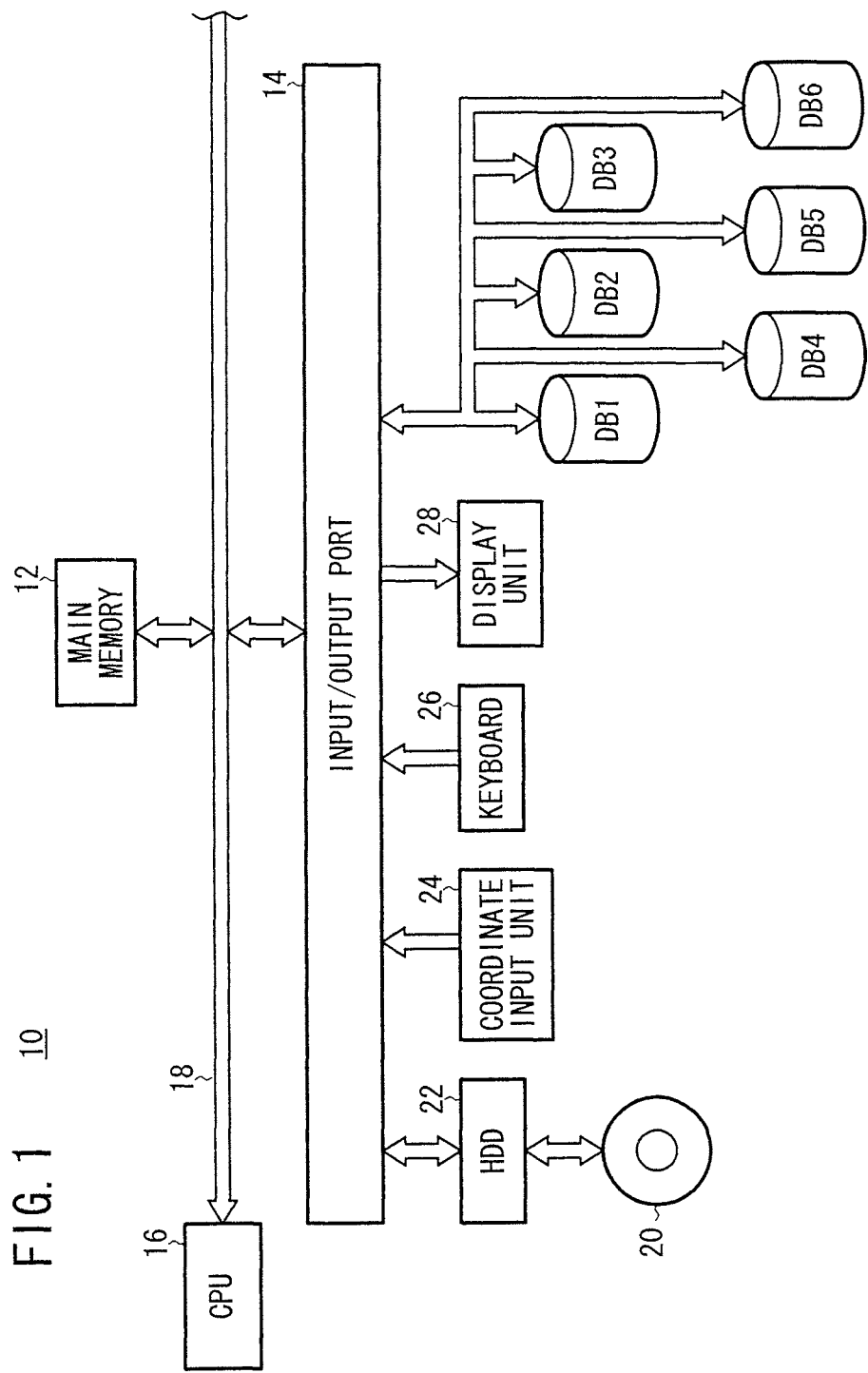
FIG. 1 is a block diagram of a pneumatic device selection system according to an embodiment of the present invention.

As shown in FIG. 1, a pneumatic device selection system 10 according to the present embodiment has a main memory 12 for running a program and transferring data, an input/output port 14 for exchanging data with external devices, and a CPU 16 for executing the program. The main memory 12, the input/output port 14, and the CPU 16 are connected to each other by a system bus 18.

To the input/output port 14, there are connected at least a hard disk drive (HDD) 22 for accessing a hard disk 20 based on instructions from the CPU 16, a coordinate input unit (e.g., a mouse) 24 operable by the user, a keyboard 26 operable by the user to enter data, a display unit 28 for displaying images generated by the program and images recorded on the hard disk 20, and a plurality of databases DB1 through DB6.

The databases DB1 through DB6 include a first database DB1 storing information about cylinders, a second database DB2 storing information about solenoid valves and silencers, a third database DB3 storing information about drive devices, a fourth database DB4 storing information about tubes, a fifth database DB5 storing information about fittings, and a sixth database DB6 storing information about shock absorbers.

The hard disk 20 records thereon an OS, application programs, and various data. The application programs include an existing document generating program, an existing table calculation program, and a pneumatic device selection program 50 (see FIG. 3) for carrying out a pneumatic device selection method according to the present embodiment.

Figure 2:
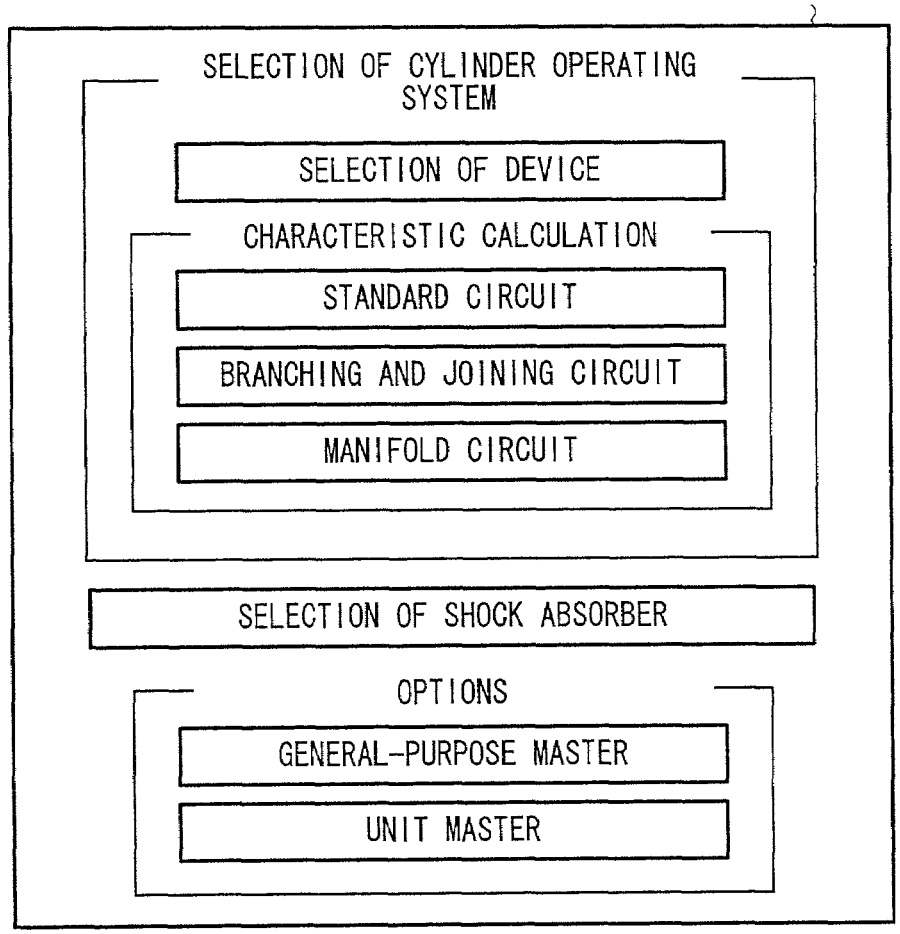
FIG. 2 is a diagram showing a menu screen.

When the pneumatic device selection program 50 is activated, it displays a menu screen 52 shown in FIG. 2. The menu screen 52 includes large items, i.e., "SELECTION OF CYLINDER OPERATING SYSTEM", "SELECTION OF SHOCK ABSORBER", and "OPTIONS". The item "SELECTION OF CYLINDER OPERATING SYSTEM" includes middle items "DEVICE SELECTION" and "CHARACTERISTIC CALCULATION", and the item "CHARACTERISTIC CALCULATION" includes small items "STANDARD CIRCUIT", "BRANCHING AND JOINING CIRCUIT", and "MANIFOLD CIRCUIT".

The item "OPTIONS" includes "GENERAL-PURPOSE MASTER" for registering highly frequently used input values in a drop-down list of input items for the selection of a cylinder operating system and the selection of a shock absorber, and "UNIT MASTER" for selecting a unit standard to be used.

Figure 3:
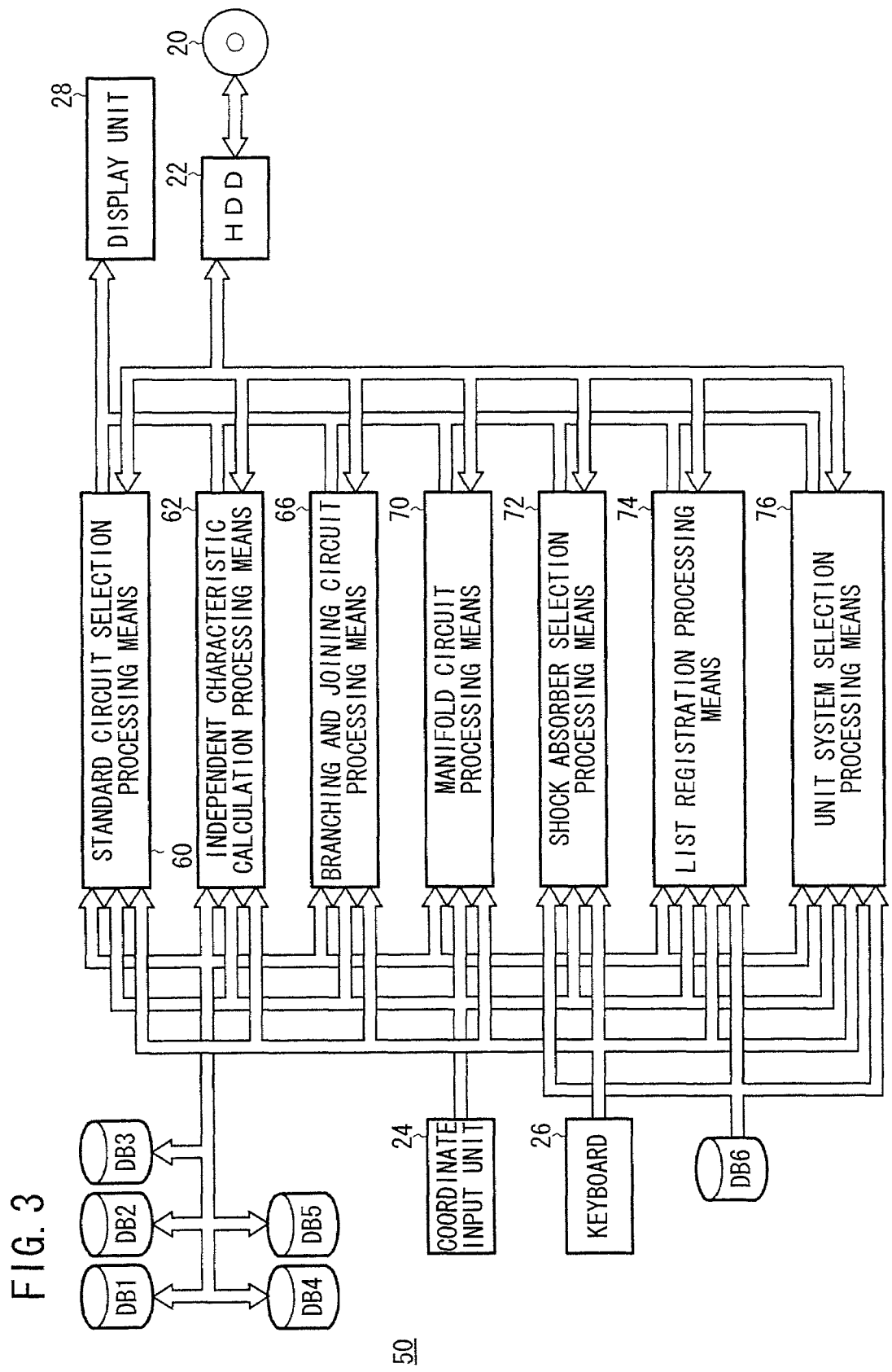
FIG. 3 is a functional block diagram of the pneumatic device selection system according to the embodiment.

As shown in FIG. 3, the pneumatic device selection program 50 has a standard circuit selection processing means 60 for selecting a cylinder operating system based on input data from the coordinate input unit 24 or the like, an independent characteristic calculation processing means 62 for calculating characteristics of the cylinder operating system based on usage conditions input from the coordinate input unit 24 or the like, a branching and joining circuit processing means 66 for selecting a branching and joining circuit 64 (see FIG. 4) based on input data from the coordinate input unit 24 or the like and calculating characteristics of the selected branching and joining circuit 64, a manifold circuit processing means 70 for selecting a solenoid valve manifold circuit 68 (manifold circuit 68, see FIG. 5) based on input data from the coordinate input unit 24 or the like and calculating characteristics of the selected manifold circuit 68, a shock absorber selection processing means 72 for selecting a shock absorber based on input data from the coordinate input unit 24 or the like and/or the selected result from the standard circuit selection processing means 60, a list registration processing means 74 for providing the general-purpose master, and a unit system selection processing means 76 for providing the unit master.

The standard circuit selection processing means 60 is activated when the item "STANDARD CIRCUIT" under the item "DEVICE SELECTION" of the menu screen 52 shown in FIG. 2 has been selected, and has a function to automatically select the product numbers of a cylinder, a solenoid valve, a speed control valve, and a tube which are of optimum and minimum sizes, based on entered usage conditions.

The independent characteristic calculation processing means 62 is activated when the item "STANDARD CIRCUIT" under the item "CHARACTERISTIC CALCULATION" of the menu screen 52 shown in FIG. 2 has been selected, and has a function to calculate characteristics of a pneumatic circuit set based on input data from the coordinate input unit 24 or the like, characteristics of a device selected in relation to the pneumatic circuit, and characteristics of the cylinder operating system based on usage conditions input from the coordinate input unit 24 or the like.

The branching and joining circuit processing means 66 is activated when the item "BRANCHING AND JOINING CIRCUIT" under the item "CHARACTERISTIC CALCULATION" of the menu screen 52 shown in FIG. 2 has been selected, selects a branching and joining circuit 64 (see FIG. 4) made up of a plurality of pneumatic circuits set based on input data from the coordinate input unit 24 or the like, and calculates characteristics of the branching and joining circuit 64 based on a device selected in relation to the branching and joining circuit 64 and operating conditions input from the coordinate input unit 24 or the like.

Figure 4:
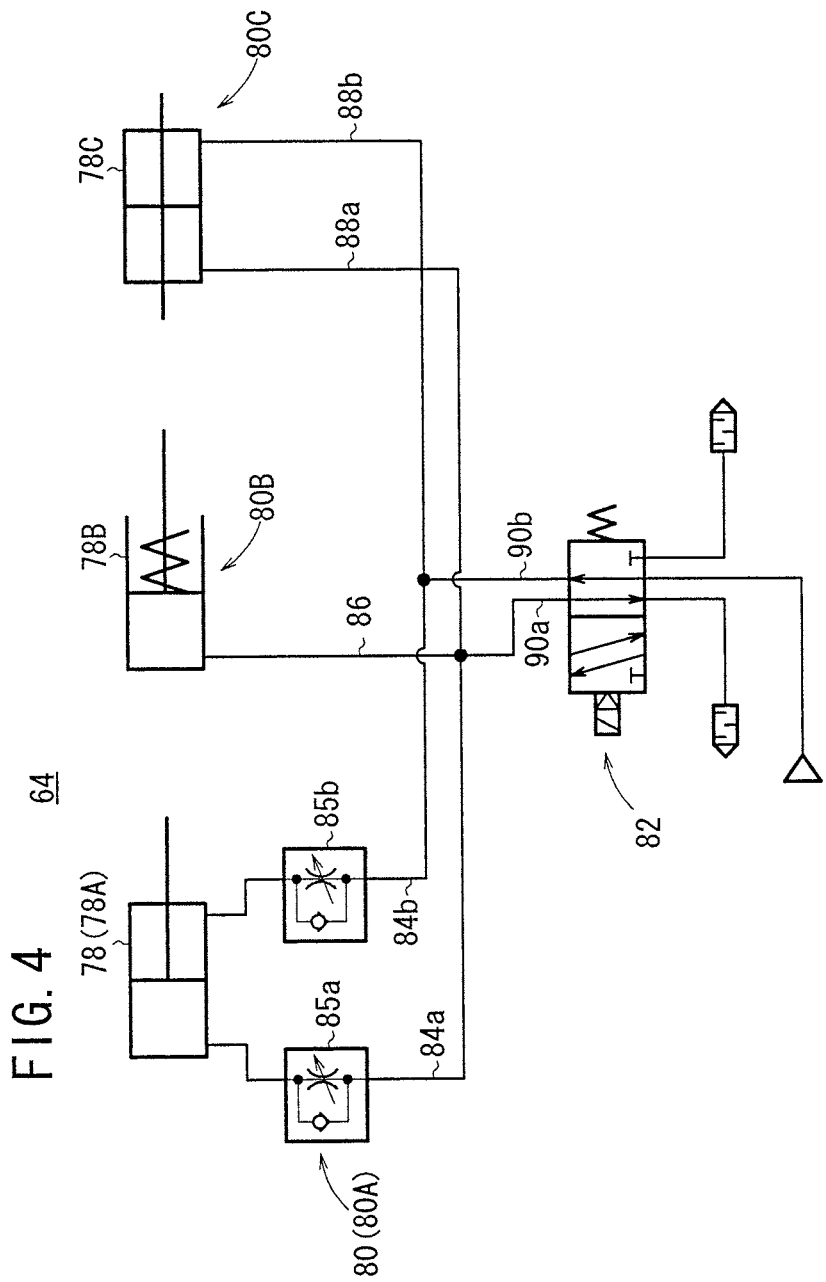
FIG. 4 is a circuit diagram showing an example of a branching and joining circuit.

As shown in FIG. 4, the branching and joining circuit 64 has at least two pneumatic circuits 80 having at least one cylinder 78, and one solenoid valve 82. According to the example shown in FIG. 4, three pneumatic circuits 80A, 80B, 80C have respective cylinders 78A through 78C, and flow control devices 85a, 85b are connected respectively to tubes 84a, 84b of the first pneumatic circuit 80A. In the branching and joining circuit 64, the tube 84a of the first pneumatic circuit 80A, a tube 86 of the second pneumatic circuit 80B, and a tube 88a of the third pneumatic circuit 80C are connected to the solenoid valve 82 by a first joining tube 90a, and the tube 84b of the first pneumatic circuit 80A and a tube 88b of the third pneumatic circuit 80C are connected to the solenoid valve 82 by a second joining tube 90b.

The manifold circuit processing means 70 is activated when the item "MANIFOLD CIRCUIT" under the item "CHARACTERISTIC CALCULATION" of the menu screen 52 shown in FIG. 2 has been selected, selects a manifold circuit 68 (see FIG. 5) comprising a plurality of pneumatic circuits (each having a solenoid valve) and a manifold set based on input data from the coordinate input unit 24 or the like, and calculates characteristics of the manifold circuit 68 based on a device selected in relation to the manifold circuit 68 and operating conditions input from the coordinate input unit 24 or the like.

Figure 5:
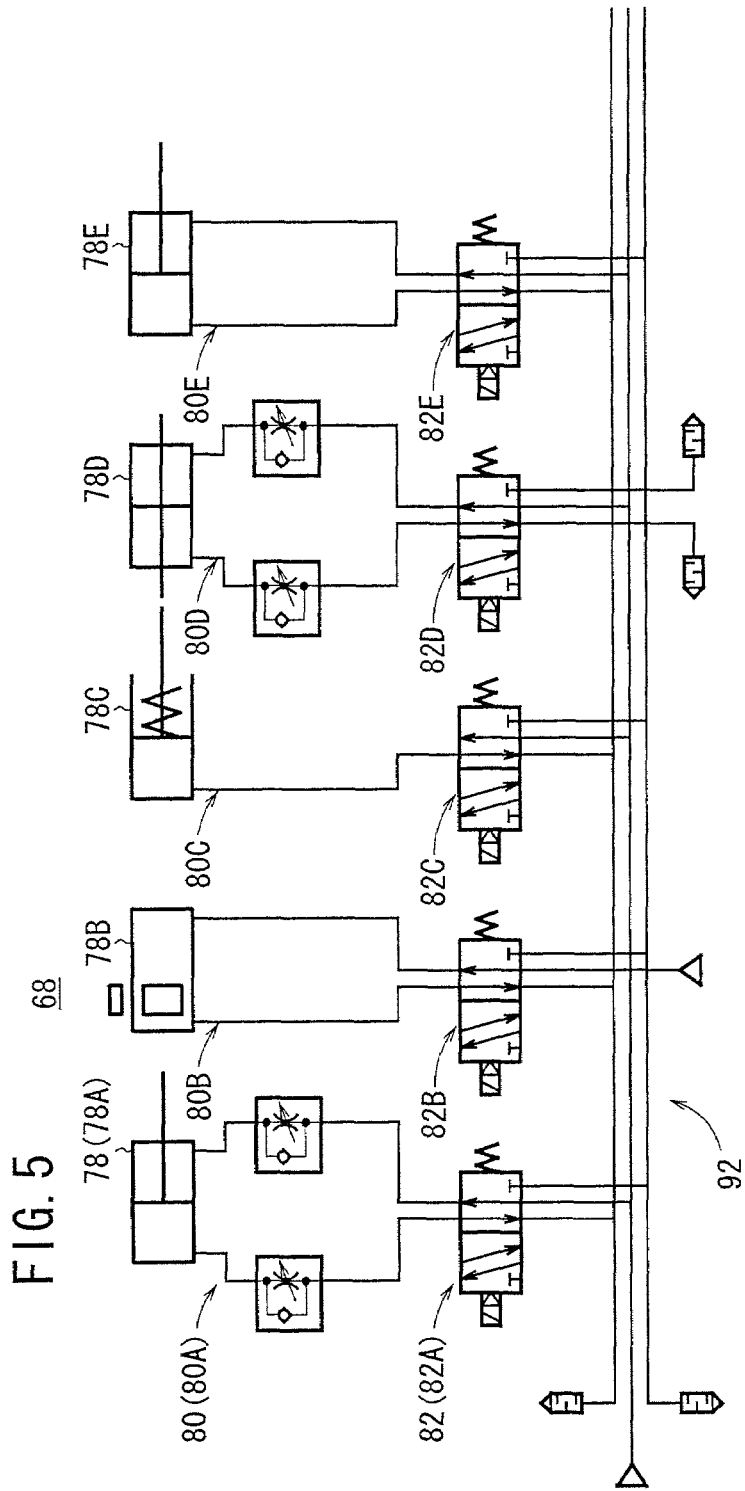
FIG. 5 is a circuit diagram showing an example of a manifold circuit.

As shown in FIG. 5, the manifold circuit 68 has at least two pneumatic circuits 80 having at least a cylinder 78 and a solenoid valve 82, and at least one manifold 92. According to the example shown in FIG. 5, five pneumatic circuits 80A through 80E are connected to one manifold 92 by respective solenoid valves 82A through 82E.

The shock absorber selection processing means 72 is activated when the item "SELECTION OF SHOCK ABSORBER" in the menu screen 52 shown in FIG. 2 has been selected, and has a function to select a shock absorber optimally according to entered usage conditions and impact conditions. The shock absorber selection processing means 72 is capable of handling various impact patterns including linear impact, rotation impact, cylinder operating, motor drive, and free dropping.

Figure 6:
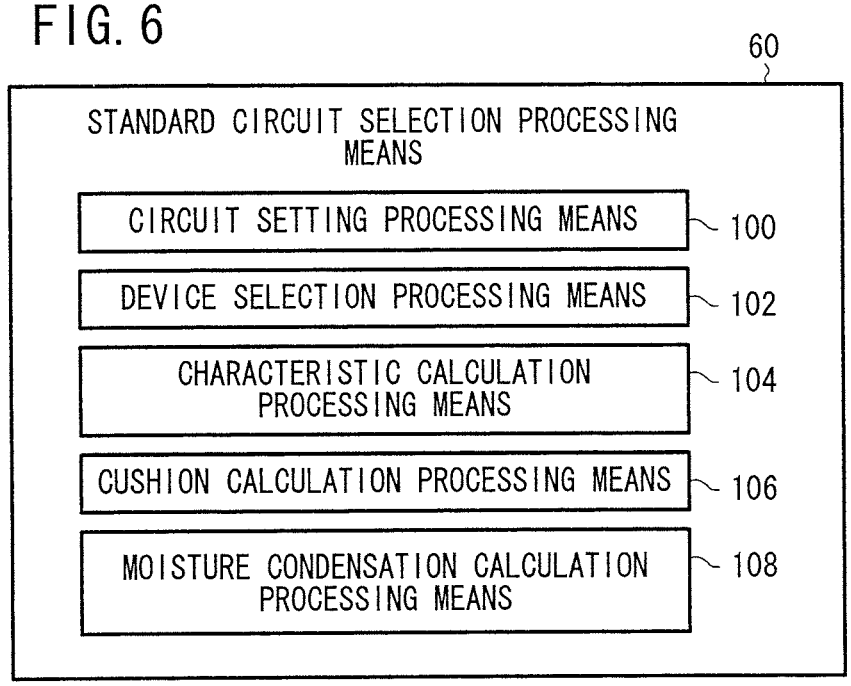
FIG. 6 is a functional block diagram of a standard circuit selection processing means.

As shown in FIG. 6, the standard circuit selection processing means 60 has a circuit setting processing means 100 for setting a configuration of a pneumatic circuit 80 based on input data from the coordinate input unit 24 or the like, a device selection processing means 102 for automatically selecting a device related to the set pneumatic circuit 80, which device satisfies usage conditions entered through the coordinate input unit 24 or the like, based on information about devices registered in various databases, and a characteristic calculation processing means 104 for calculating characteristics of a cylinder operating system based on a device selected through the coordinate input unit 24 or the like and the set pneumatic circuit 80.

The standard circuit selection processing means 60 employs a dynamic characteristic analyzing process for solving simultaneous equations of fluid dynamics including tubes, rather than a standard process according to a conventional combined effective area method, and is capable of accurately calculating characteristic differences due to different mounting positions of a speed controller.

The standard circuit selection processing means 60 has a cushion calculation processing means 106 for calculating an energy to be absorbed by a cylinder based on the cylinder operating system which has been calculated, and a moisture condensation calculation processing means 108 for calculating the probability of moisture condensation produced in the cylinder operating system based on the calculated characteristics of the cylinder operating system and moisture information entered through the coordinate input unit 24 or the like.

The cushion calculation processing means 106 has a function to calculate an absorption energy from the result of the device selection or characteristic calculations of the cylinder operating system, and determines the cushioning capability of a cylinder 78. The cushion calculation processing means 106 can shift its operation to the shock absorber selection processing means 72 for the selection of an optimum shock absorber. The cushion calculation processing means 106 can achieve more accurate calculations because it employs a stroke end velocity and a stroke end pressure (a velocity and a pressure at the time a load impinges upon a cushion if the cylinder has the cushion) according to dynamic characteristic calculations for the calculation of kinetic energy and thrust energy of the cylinder 78.

The moisture condensation calculation processing means 108 employs a moisture condensation decision standard taking into account not only the sizes of a cylinder 78 and a tube, but also the moisture, temperature, and pressure of the supplied air. The moisture condensation calculation processing means 108 introduces a moisture condensation probability for predicting the possibility of moisture condensation because of the indefiniteness of a phenomenon of moisture condensation in experiments. Specifically, the moisture condensation calculation processing means 108 calculates the amount of a water mist produced in the system and the volume ratio of the cylinder 78 to the tube from the result of the device selection or characteristic calculations of the cylinder operating system, and predicts the probability that a moisture condensation will occur.

The pneumatic device selection program 50 is applicable to not only typical double-acting cylinder/meter-out circuits, but also meter-in circuits, meter-in-out circuits, single-acting cylinder circuits, and circuits using quick exhaust valves.

In the pneumatic device selection program 50, the display and calculation of flow rate characteristics of pneumatic devices such as solenoid valves are in accordance with flow rate characteristic display process according to ISO6358.

Specifically, flow rate characteristics are displayed as a pair of sonic conductance and critical pressure ratio. The sonic conductance represents a value produced by dividing a passage mass flow rate of the device which is in a choked flow mode, by the product of an upstream absolute pressure and the density of a standard state. The critical pressure ratio refers to a pressure ratio (downstream pressure/upstream pressure) below which a choked flow is caused and above which a subsonic flow is caused.

The choked flow is a flow in which the upstream pressure is higher than the downstream pressure and the fluid velocity reaches a sound velocity in a certain portion of the device. The mass flow rate of a gas is proportional to the upstream pressure and does not depend on the downstream pressure. The subsonic flow refers to a flow equal to or higher than the critical pressure ratio. The standard state refers to a state of air having a temperature of 20° C., an absolute pressure of 0.1 MPa (=100 kPa=1 bar), and a relative humidity of 65%. The unit of the amount of air is followed by an acronym ANR.

Figure 7:
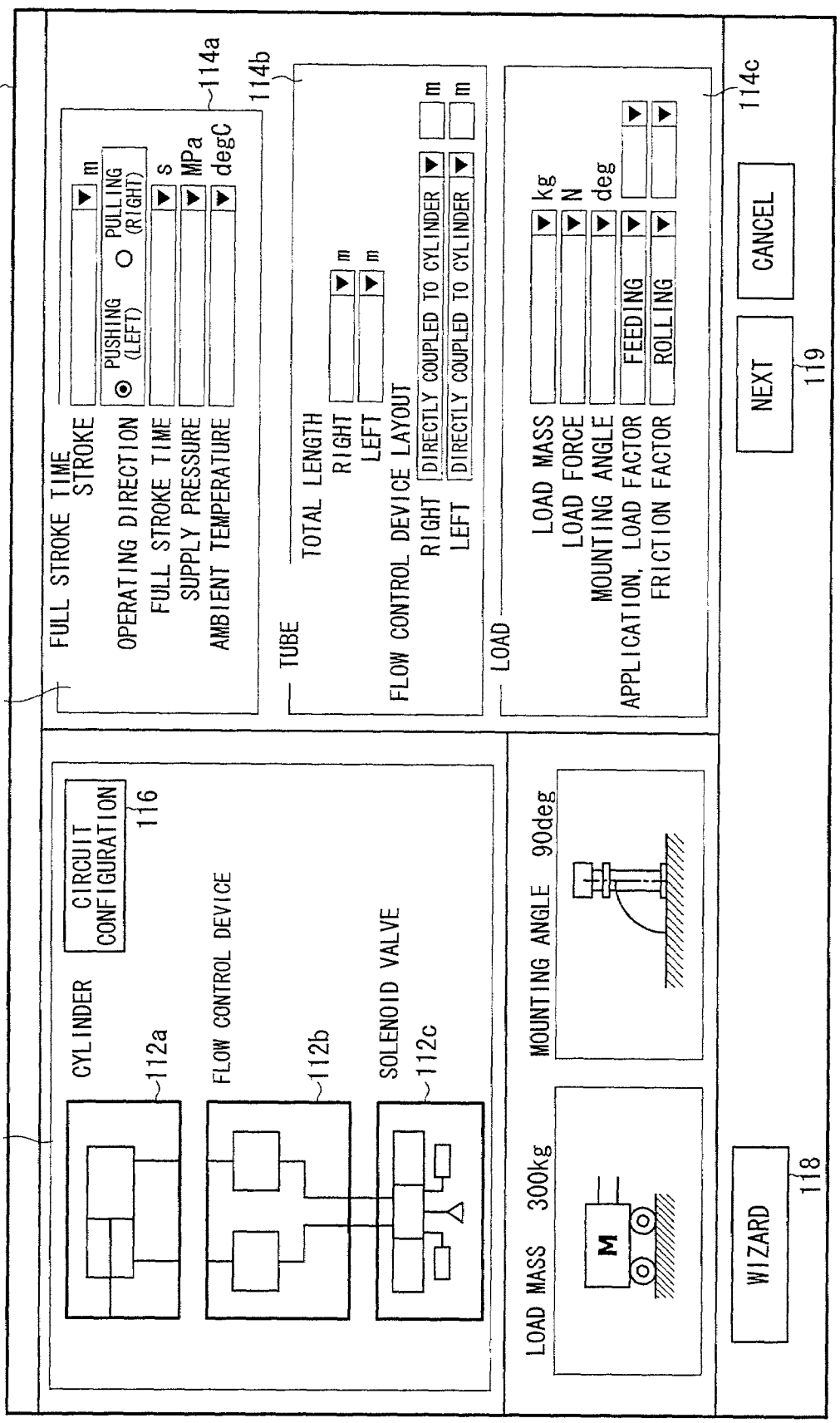
FIG. 7 is a diagram showing a displayed example of a device selection input screen.

The standard circuit selection processing means 60 displays a device selection input screen 110 shown in FIG. 7. The device selection input screen 110 has a circuit setting area 112 for displaying a circuit configuration which is being set, and a condition setting area 114 for entering usage conditions.

The circuit setting area 112 displays a circuit diagram 112a corresponding to the type of a selected cylinder, a circuit diagram 112b corresponding to the type of a selected flow control device, a circuit diagram 112c corresponding to the type of a selected solenoid valve, and a circuit configuration request button 116 for activating the circuit setting processing means 100 (see FIG. 6).

The condition setting area 114 is divided into three large items, i.e., an item 114a for a full stroke time, an item 114b for a tube, and an item 114c for a load. The item 114a for a full stroke time displays input boxes for entering a stroke, a moving direction, a full stroke time, a supply pressure, and an ambient temperature. The item 114b for a tube displays input boxes for entering a total length (right, left) and a speed controller position (right, left). The item 114c for a load displays input boxes for entering a load mass, a load force (requested thrust), a mounting angle, an application, a load factor, and a friction factor.

The full stroke time refers to a time consumed after the solenoid valve is energized (de-energized) until the piston (rod) of the cylinder reaches a stroke end. The load acting on the cylinder may be of various types including an inertial load, a force load, a resilient load, and a viscous load. According to the pneumatic device selection program 50, the inertial load and the force load used in the cylinder operating system are handled by the input items "LOAD MASS" and "LOAD FORCE".

The load force acting in the direction of operation of the piston is the sum of (a) a gravitational force component of the load mass, (b) a frictional force, and (c) another external force acting on the cylinder. According to the pneumatic device selection program 50, the load force is defined as a force load other than (a) and (b), i.e., (c) the other external force acting on the cylinder. For example, if the application is for feeding, then the load mass is moved only, and there is no other load than the gravitational force component and the frictional force, so that the load force is "0".

If the application is for clamping an object or applying a pressure, then since a resistive force is imposed when an object is clamped or a pressure is applied, in addition to moving the load mass, a clamping force or an applied pressure is entered as the load force.

The load factor is usually used as a safety ratio (margin ratio) for the cylinder output in static operations, and as a parameter for determining the velocity (acceleration) of the piston in dynamic operations. For example, the load factor is 0.7 or less for static operations, 1 or less for horizontal motion in dynamic operations, and 0.5 or less for vertical motion in dynamic operations. It is recommended that the load factor be further reduced for high-speed operations.

According to the pneumatic device selection program 50, since the velocity of the cylinder is automatically calculated and judged and the cylinder size is automatically changed, the user is not required to take into account the effect of the load factor on the velocity of the piston, but may consider the load factor as the safety ratio (margin ratio) for the cylinder output. Therefore, the process of entering data is simplified.

The standard circuit selection processing means 60 displays a device selection result screen 120 shown in FIG. 8. As shown in FIG. 8, the device selection result screen 120 has a system characteristic display area 122 for displaying the dynamic behavior (graphic representation) and major characteristic values of a selected cylinder operating system, a circuit configuration display area 124 for displaying a circuit configuration diagram which has been set, a condition display area 126 for displaying entered usage conditions, and a product number display area 127 for displaying the product numbers of selected devices. The graphic representation in the system characteristic display area 122 is produced based on characteristic values obtained by the characteristic calculation processing means 104.

The displayed characteristic values include a full stroke time, a piston startup time, a 90% output time, a mean velocity, a maximum velocity, a stroke end velocity, a maximum acceleration, a maximum pressure, a maximum flow rate, an air consumption per cycle, and a required air flow rate.

The piston startup time is a time consumed after the solenoid valve is energized (de-energized) until the piston (rod) of the cylinder starts to move. The piston startup time is accurately determined by the time when an acceleration curve starts to rise.

The 90% output time is a time consumed after the solenoid valve is energized (de-energized) until the cylinder output force reaches 90% of a theoretical output value.

The mean velocity is represented by a value produced by dividing the stroke by the full stroke time. The maximum velocity is represented by a maximum value of the piston velocity while the piston is in motion. The stroke end velocity is a piston velocity when the piston (rod) of the cylinder reaches a stroke end. If the cylinder has an adjustable cushion, then the stroke end velocity is a piston velocity at the inlet of the cushion, and is used to judge the cushioning capability and select a cushioning mechanism. The maximum acceleration refers to a maximum value of the piston acceleration while the piston is in motion. The maximum pressure is a maximum value of the air pressure in the piston.

The air consumption per cycle refers to an amount of air converted to a value in the standard state, which is required to move the cylinder in one cycle of reciprocating motion, and is determined according to the Boyle-Charles law. The air consumption per cycle includes an amount of air consumed by the cylinder itself and an amount of air consumed by the tube which interconnects the cylinder and the solenoid valve. If the cylinder is a double-acting cylinder, then the air consumption per cycle represents the sum of an amount of air discharged from the cylinder and an amount of air drawn into the cylinder. If the cylinder is a single-acting cylinder, then the air consumption per cycle represents an amount of air either discharged from or drawn into the cylinder.

The total air consumption of the system is determined by integrating the amounts of air consumed by all cylinders of the system according to an operation time chart of the system. The total air consumption is an important marker for recognizing the running cost of the system, and serves as a reference for selecting an air compressor while taking into account an appropriate margin ratio.

The required air flow rate refers to an air flow rate to be supplied downstream to the system within a given time. Since the required air flow rate differs depending on the direction in which the cylinder operates, the required air flow rate of a greater value is employed. If the system includes a plurality of cylinders, then a maximum value of the required air flow rates of the cylinders which operate simultaneously is used. The required air flow rate serves as a flow rate indicator for selecting the types and sizes of upstream components (FRL, a pressure-boosting valve, etc.) of the actuator system.

The device selection result screen 120 shown in FIG. 8 has icons simulating a plurality of operating buttons, in addition to the above display areas. The operating buttons simulated by these icons include a cushion calculation button 128 for requesting cushion calculations, a moisture condensation calculation button 130 for requesting moisture condensation calculations, a print button 132 for requesting the printing of the results of the device selection, the cushion calculations, the moisture condensation calculations, and the usage conditions, a print comment input button 134 for shifting to an input screen for entering comments to be printed on a lower portion of the printed sheet, a save button 136 for requesting the saving of the results of the device selection, the cushion calculations, the moisture condensation calculations, and the usage conditions (on a hard disk, or an optical disk such as a CD-R or a DVD-RAM, etc.), a characteristic calculation button 138 for requesting a shift to an independent characteristic calculation process, and a shock absorber selection button 140 for requesting a shift to the shock absorber selection processing means 72.

The circuit setting processing means 100 of the standard circuit selection processing means 60 is activated base on a selecting action on the circuit configuration request button 116 in the device selection input screen 110 shown in FIG. 7. The circuit setting processing means 100 displays a list of information (product numbers, etc.) of various devices such as cylinder classifications registered in the first database DB1 and flow control device classifications registered in the third database DB3, together with a circuit configuration diagram.

The device selection processing means 102 displays a list of devices which satisfy entered usage conditions among the devices related to a pneumatic circuit which has been set, and displays at least outer profile images and specifications of devices selected from the displayed list of devices.

The cushion calculation processing means 106 is activated based on a selecting action on the cushion calculation button 128 in the device selection result screen 120 shown in FIG. 8. The cushion calculation processing means 106 displays a cushion calculation screen 230 shown in FIG. 9. The cushion calculation screen 230 has, displayed in a left half area thereof, data identical to those in the left half area of the device selection result screen 120, and also has, displayed in a right half area thereof, a first type selector 232 for selecting a cushion type, a second type selector 234 for selecting a workpiece mounting type, a calculation start button (icon) 236, and a result display area 238 for displaying calculated results (the values of an energy to be absorbed by the cylinder, and an allowable energy, and a comment message corresponding to the calculated results).

Figure 10:
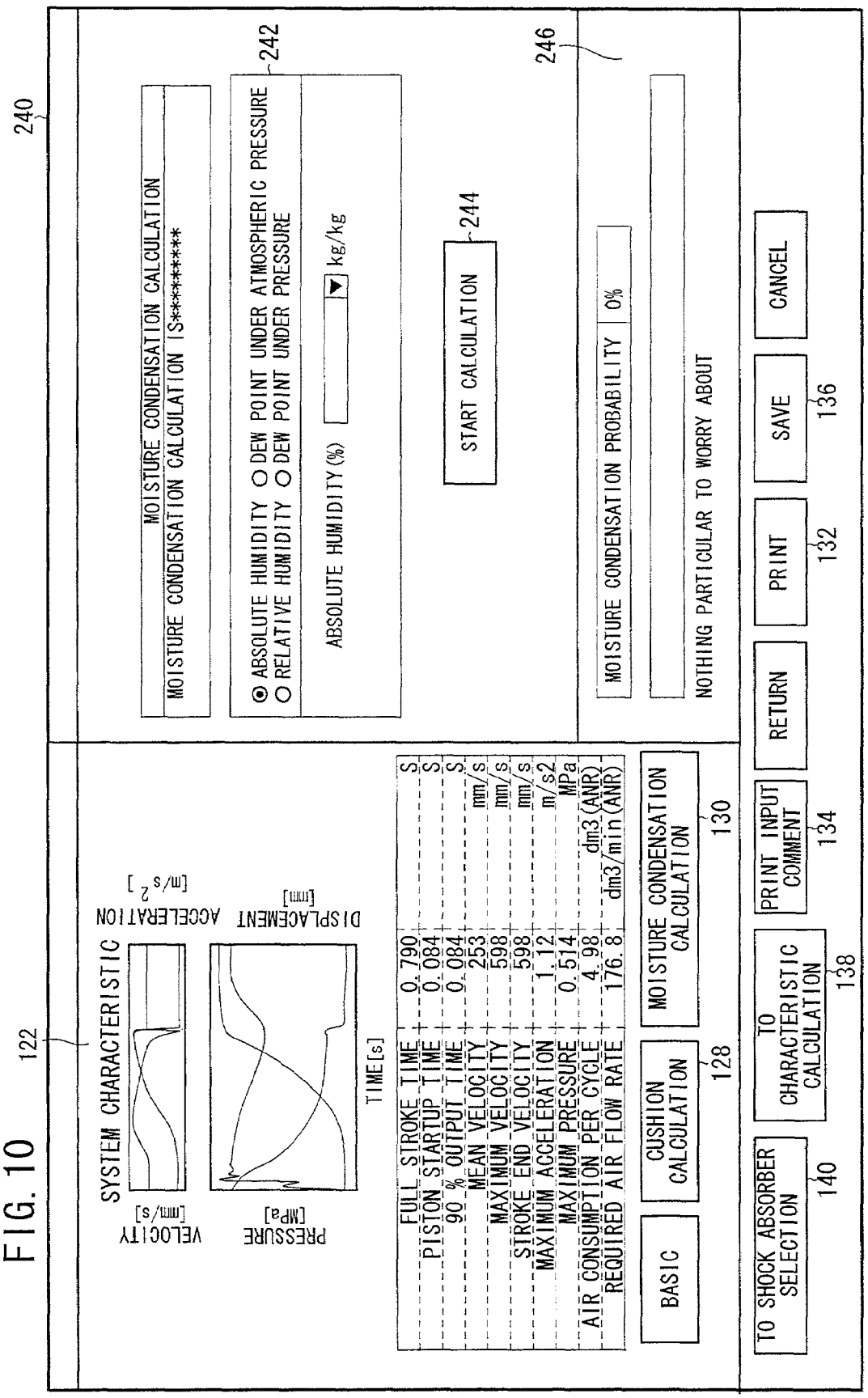
FIG. 10 is a diagram showing a displayed example of a moisture condensation calculation screen.

The moisture condensation calculation processing means 108 is activated based on a selecting action on the moisture condensation calculation button 130 in the device selection result screen 120 shown in see FIG. 8. The moisture condensation calculation processing means 108 displays a moisture condensation calculation screen 240 shown in FIG. 10. As shown in FIG. 10, the moisture condensation calculation screen 240 has, displayed in a left half area thereof, data identical to those in the left half area of the device selection result screen 120, and also has, displayed in a right half area thereof, a moisture selector 242 for selecting an air moisture, a calculation start button (icon) 244, and a result display area 246 for displaying calculated results (the value of a moisture condensation probability and a comment message corresponding to the calculated results).

The air moisture is selected by selecting either an absolute moisture, a relative moisture, an atmospheric dew point, or a pressure dew point as the moisture of air supplied to the solenoid valve.

A phenomenon of moisture condensation, a mechanism of moisture condensation, and a countermeasure to prevent moisture condensation will be described below.

Usually, moisture condensation in a cylinder operating system refers to moisture condensation which is caused by compressed air that has been adjusted in moisture while the cylinder is in operation. The moisture condensation occurs in two different phenomena, i.e., internal moisture condensation and external moisture condensation. The internal moisture condensation is a phenomenon in which moisture in the air is condensed within pneumatic devices or tubes due to a drop in the temperature of the air. The external moisture condensation is a phenomenon in which the air at a low temperature cools pneumatic devices which it contacts, condensing moisture contained in the air on outer surfaces of the pneumatic devices.

It is generally known that moisture condensation is basically caused by a reduction in the temperature of the air due to an adiabatic change of the air. In addition to the different phenomena of internal moisture condensation and external moisture condensation, the moisture condensation also occurs as moisture condensation on smaller-size cylinders and moisture condensation on larger-size cylinders.

Figure 11:
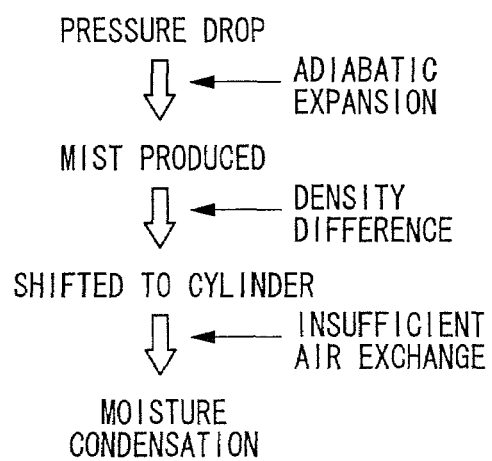
FIG. 11 is a diagram showing a mechanism of moisture condensation due to an insufficient air exchange.
Figure 12:
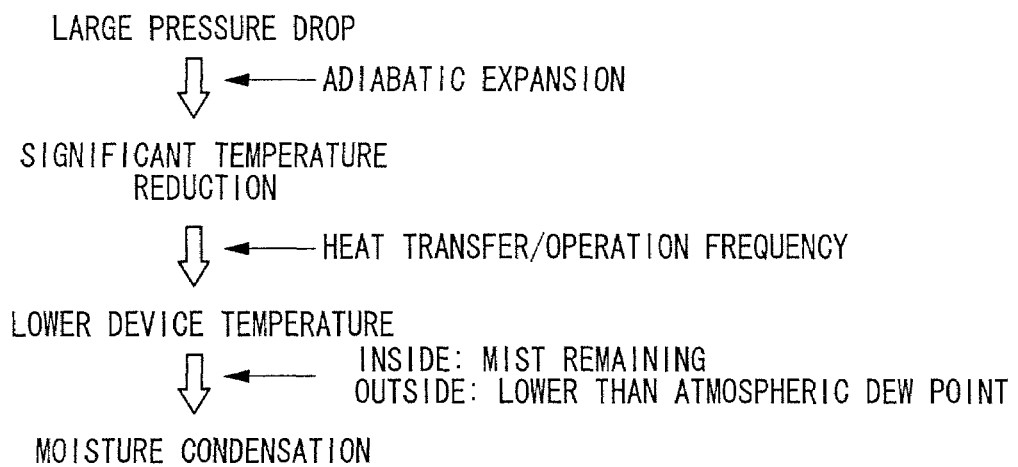
FIG. 12 is a diagram showing a mechanism of moisture condensation due to a low temperature on a device surface.

Internal moisture condensation tends to occur in a long tube or a small-size cylinder because of an insufficient air exchange. FIG. 11 shows a mechanism of moisture condensation due to an insufficient air exchange. If a large-size cylinder actuates a large load or a meter-in circuit is used, then moisture condensation tends to occur owing to a low temperature at the surface of the device. FIG. 12 shows a mechanism of moisture condensation due to a low temperature on a device surface.

A first process of preventing moisture condensation from occurring is to prevent a mist from being produced. A mist is prevented from being produced by lowering the moisture of supplied air, reducing the pressure of supplied air, or reducing an effective area of a speed control valve. However, these solutions often fail because of the ability of existing dehumidifiers and limited usage conditions.

A second process of preventing moisture condensation from occurring is to prevent a produced mist from staying undischarged. For preventing moisture condensation due to an insufficient air exchange, there are available a tube method, a quick exhaust valve method, and a bypass tube method. According to the tube method, the proportion of the volume of the tube is selected to be smaller than the volume of the cylinder for sufficiently mixing the remaining air in the cylinder and the tube with supplied fresh air and discharging the remaining air. Generally, the volumes of the cylinder and the tube are selected to satisfy the following expression:

$$\text{Volume of the air in the cylinder as converted at the atmospheric pressure} \times 0.7 \geq \text{internal volume of the tube} \quad (1)$$

Figure 13:
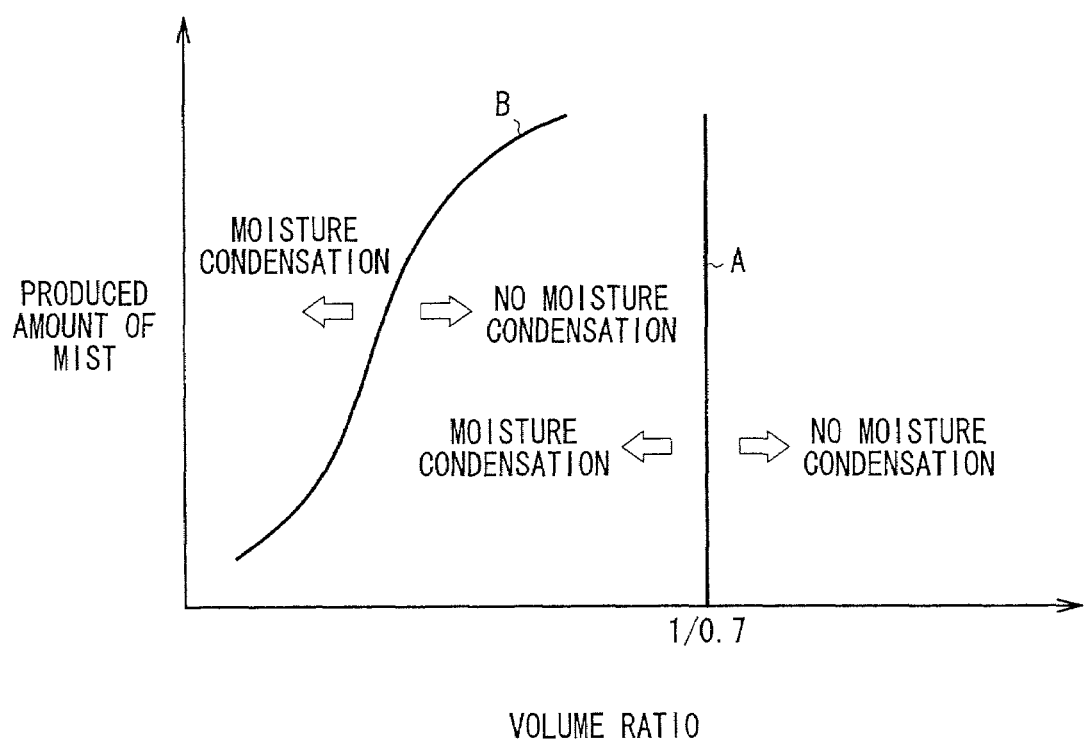
FIG. 13 is a characteristic diagram showing the relationship between a volume ratio and a produced amount of mist.

As indicated by a straight-line curve A in FIG. 13, it is judged that moisture condensation will take place if the volume ratio is smaller than 1/0.7, and no moisture condensation will take place if the volume ratio is greater than 1/0.7.

The above expression takes into account only the supply pressure, the size of the cylinder, and the size of the tube, as elements that affect moisture condensation, but not whether a mist is produced or not as a precondition for moisture condensation.

According to the present embodiment, a countermeasure for preventing moisture condensation from occurring is taken based on the following expression which takes into account, in addition to the supply pressure, the size of the cylinder, and the size of the tube, whether a mist is produced or not depending on the moisture of the supplied air and the ambient temperature, and the amount of a mist which is produced, as elements that affect moisture condensation.

$$\text{Volume of the air in the cylinder as converted at the atmospheric pressure} \geq \text{internal volume of the tube} \times \text{critical amount of mist} \quad (2)$$

This process does not consider a safety coefficient, but introduces a moisture condensation probability depending on a moisture condensation uncertainty zone based on experimentation.

As shown in FIG. 13, it is judged that moisture condensation will take place in a region smaller than a characteristic curve B which is plotted as representing the relationship between the volume ratio and the amount of the mist, and no moisture condensation will take place in a region greater than the characteristic curve B. In this manner, the occurrence of moisture condensation can be judged more accurately.

According to the quick exhaust valve method, a quick exhaust valve is installed near the cylinder for discharging air in the cylinder directly into the atmosphere thereby to prevent highly humid air from staying undischarged in the cylinder. If the tube method cannot be employed due to the device layout, then it is preferable to prevent moisture condensation from taking place with the quick exhaust valve method.

According to the bypass tube method, a check valve and a bypass tube are used to supply air in one direction and discharge air in one direction for achieving a sufficient air exchange.

Moisture condensation which tends to occur owing to a low temperature at the surface of the device may be prevented by turning down a speed controller or reducing an operation frequency so that the temperature of the air will not be lowered quickly. In this case, it is preferable to avoid use of a meter-in circuit.

Processing operation of the standard circuit selection processing means 60 will be described below with reference to FIGS. 14 through 21.

Figure 14:
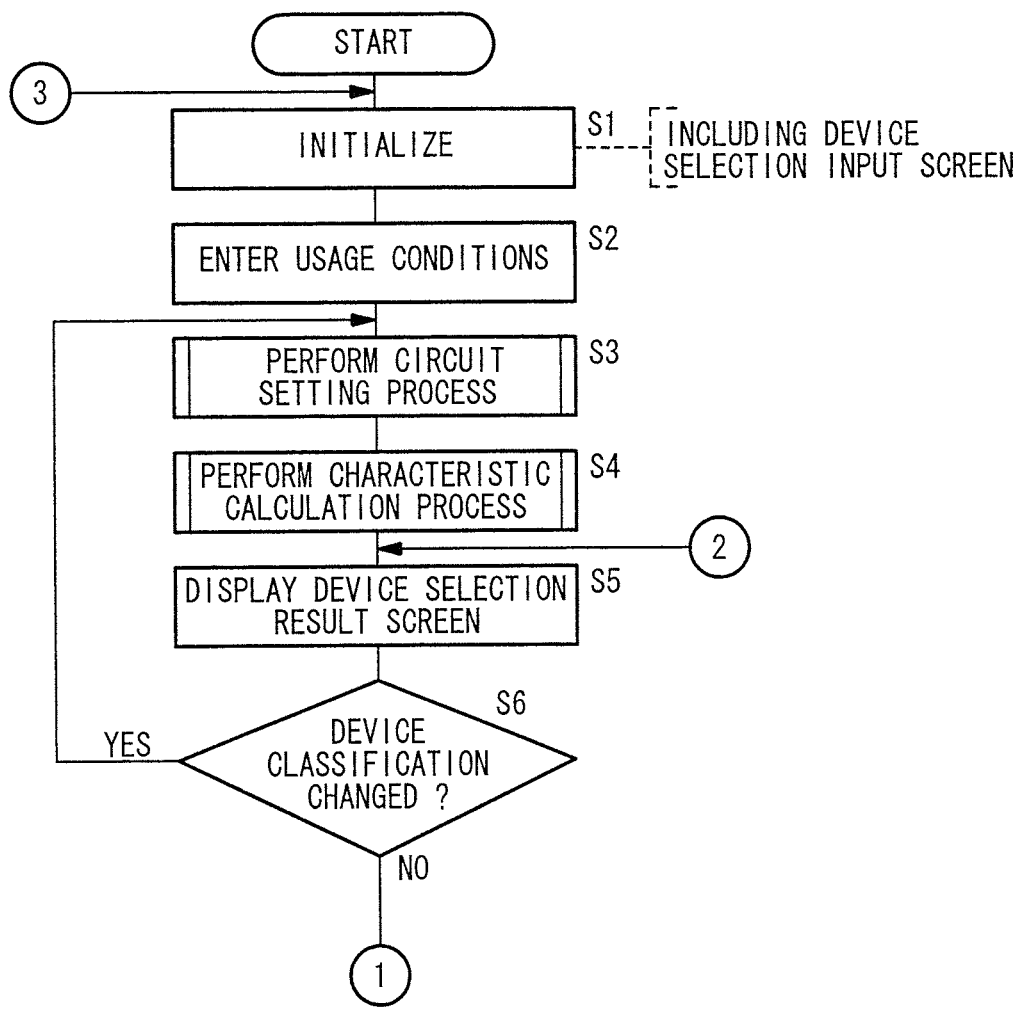
FIG. 14 is a flowchart (part 1) of a processing sequence of the standard circuit selection processing means.

In step S1 shown in FIG. 14, an initializing process is carried out. In the initializing process, working areas are logically assigned to a main memory and various parameters are set therein, and the device selection input screen 110 is displayed on the display screen of the display unit 28.

In step S2, the user operates the coordinate input unit 24 and the keyboard 26 to enter various usage conditions while seeing the device selection input screen 110 displayed on the display unit 28. The user may enter the usage conditions using the wizard button 118 shown in FIG. 7. The usage conditions that are entered include a stroke, a full stroke time, a moving direction (pushing or pulling), a supply pressure, an ambient temperature, a load mass, a load force (requested thrust), a mounting angle, an application (feeding or clamping), a load factor, a load friction factor, and a tube length.

Since no circuit configuration is set in the initial stage, no circuit diagram is displayed in the circuit setting area 112 of the device selection input screen 110. After the usage conditions have been entered, the circuit setting processing means 100 performs its processing sequence in step S3. The user selects the circuit configuration request button 116 or selects a button 119 representing "NEXT" to have the circuit setting processing means 100 perform its processing sequence.

In the processing sequence of the circuit setting processing means 100, the circuit setting processing means 100 reads information about cylinder classifications, solenoid valve classifications, and flow control device classifications registered in the databases.

If the user selects one of cylinder classifications, then the circuit setting processing means 100 reads information of a circuit diagram corresponding to the selected cylinder classification. If the selected cylinder classification is OK, then the device selection processing means 102 performs its cylinder selecting sequence.

In the cylinder selecting sequence, the device selection processing means 102 searches for a cylinder which satisfies the usage conditions among one or more cylinders included in the selected cylinder classification.

Specifically, the device selection processing means 102 carries out calculations according to a programmed formula for calculating the inside diameter of the cylinder, a programmed formula for calculating cylinder buckling, a programmed formula for calculating a lateral load on the cylinder, and the basic equations shown in FIG. 16C, and retrieves, from the first database DB1, a minimum-size cylinder which satisfies (a) a load condition (a dynamic condition for a selected system to operate sufficiently under input conditions, such as a load mass and thrust, an application, and a supplied air pressure, of a specified pneumatic actuator (cylinder)), (b) a velocity condition (a condition for a selected system to reach a stroke end of an output member (e.g., the piston of a cylinder) of a pneumatic actuator within a specified full stroke time, and (c) a strength condition (a condition for a selected system to satisfy the specified load condition while preventing the pneumatic actuator from being buckled, deformed, or broken).

If the user selects the cylinder, then the device selection processing means 102 reads an image (e.g., a photographic image or a computer graphic image) of the selected cylinder, a description of the specifications of the selected cylinder, and graphic symbols showing mounting types and load connection types for the selected cylinder. A mounting type and a load connection type for the selected cylinder are selected and set by the user.

If the user has decided on the selected cylinder, then the device selection processing means 102 calculates a target value Coa for the combined sonic conductance of the cylinder (the response time of the system is mainly determined from the sonic conductance and critical pressure ratio of a device on a fluid passage of the cylinder), allocates the target value Coa according to a certain rule, and determines the sizes of the devices based on the divided target value Coa. This is to make the sonic conductance of each device as close to an optimum value as possible for thereby reducing the number of calculations required to make an optimum selection (see steps S202 through S206 shown in FIG. 19) in the characteristic calculation processing means 104.

The target value Coa for the combined sonic conductance represents a combined value (see FIG. 17B) of sonic conductances of all restrictions in the flow passage required for the specified response time of the system (when the response time t is exactly a specified response time treq).

Figures 17A, 17B:
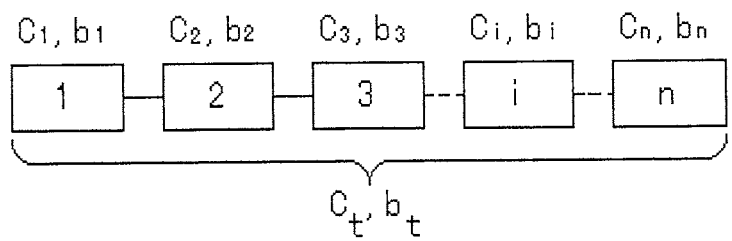
FIG. 17A is a diagram showing an equation for combining sonic conductances and critical pressure ratios of all restrictions of a fluid passage required for the response time of a system.
FIG. 17B is a diagram showing equations for weighting respective devices.

An equation for combining sonic conductances and critical pressure ratios as shown in FIG. 17A will be described below. As shown in FIG. 17A, a system of series-connected pneumatic devices is assumed.

A combined sonic conductance Ct and a combined critical pressure ratio bt of the system are determined on the basis of sonic conductances Ci and critical pressure ratios bi of the individual pneumatic devices, as follows:

A dimensionless number a defined according to the equation (1) in FIG. 17B is determined with respect to two devices 1, 2 shown in FIG. 17A. When $\alpha<1$, if the sum of pressure drops in the devices 1, 2 is normal, the flow through the device 1 is of the sound velocity, and only if the sum of pressure drops in the devices 1, 2 is very large, the flow through the device 2 is of the sound velocity.

When $\alpha>1$, the flow through only the device 2 is of the sound velocity, and when $\alpha=1$, the flows through both the devices 1, 2 are of the sound velocity.

Using the dimensionless number $\alpha$, the combined sound sonic conductance $C_{1,2}$ of the devices 1, 2 is expressed by the equation (2) shown in FIG. 17B. The combined critical pressure ratio $b_{1,2}$ of the devices 1, 2 is expressed by the equation (3) shown in FIG. 17B irrespective of the dimensionless number $\alpha$.

In a next step, the above procedure is repeated to determine the combined sonic conductance $C_{1,2,3}$ and the combined critical pressure ratio $b_{1,2,3}$ of the devices 1, 2, 3, using the combined sonic conductance $C_{1,2}$ and the combined critical pressure ratio $b_{1,2}$ of the devices 1, 2, and the sound sonic conductance $C_3$ and critical pressure ratio $b_3$ of the device 3. The above procedure is repeated (n−1) times to determine the combined sonic conductance Ct and the combined critical pressure ratio bt of the system.

Figure 18:
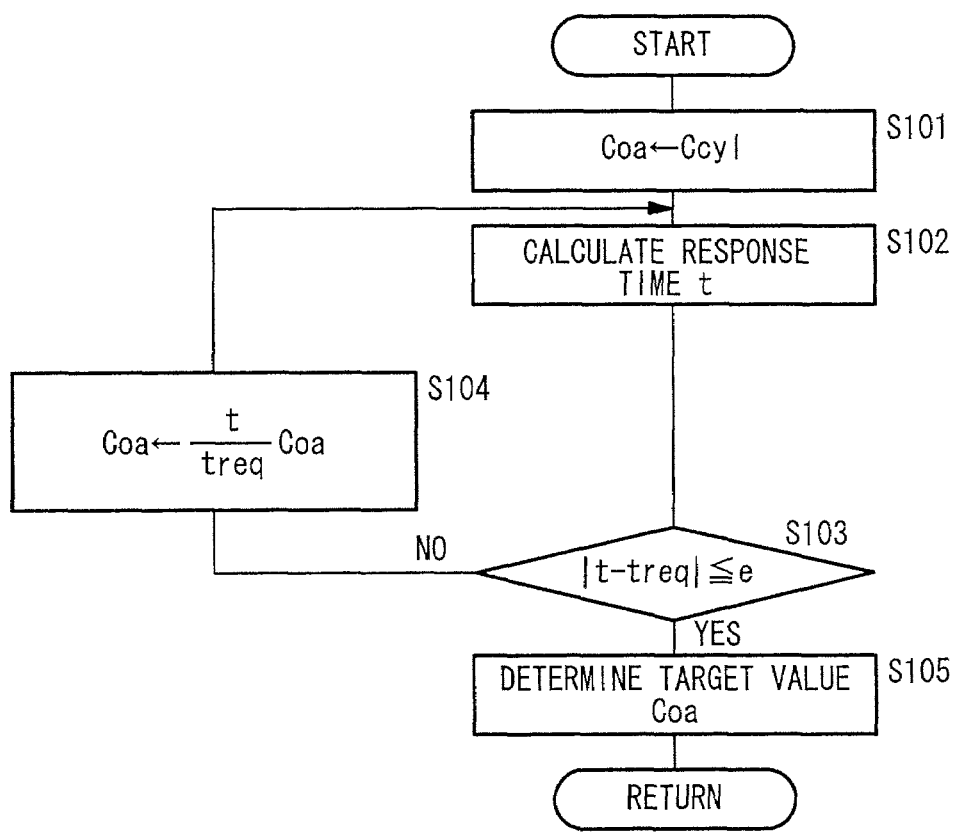
FIG. 18 is a flowchart of a sequence for determining a target value for a combined sonic conductance.
Figure 19:
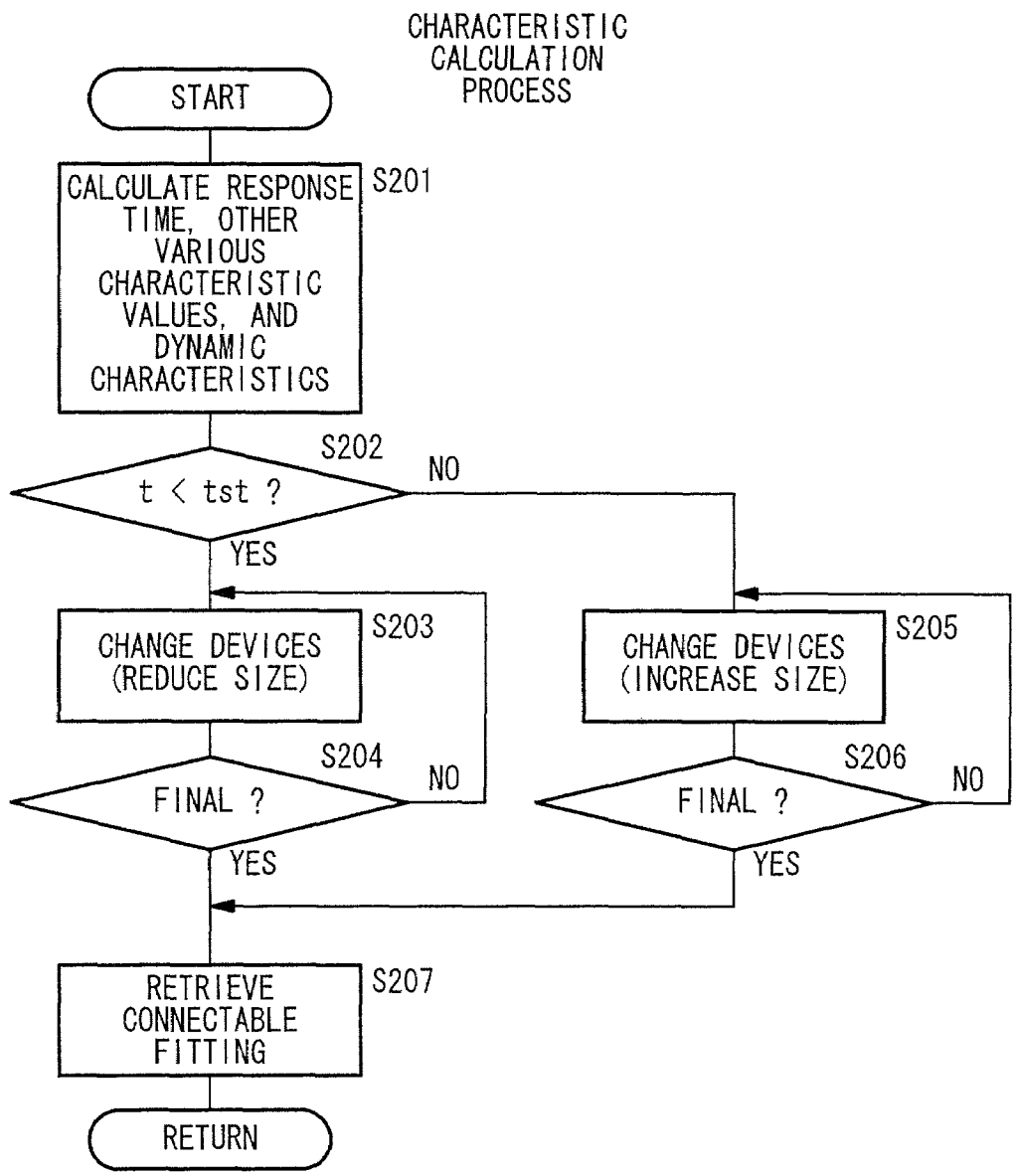
FIG. 19 is a flowchart of a processing sequence of a characteristic calculation processing means.

A process of calculating the target value Coa for the combined sonic conductance is shown in the flowchart (steps S101 through S105) of FIG. 18.

In step S101, a sonic conductance Ccyl of a cylinder port is inputted as an initial value of the target value Coa for the combined sonic conductance. Then, the response time t is calculated using the target value Coa as the sonic conductance of the cylinder port according to a simulation in step S102.

In step S103, it is determined whether the calculated response time t falls in a deviation e of the specified response time treq or not. If the calculated response time t falls in the deviation e, then the target value Coa is determined in step S105. If it is judged in step S103 that the calculated response time t does not fall in the deviation e, then the target value Coa is reduced stepwise in step S104, after which control returns to step S102.

When the target value Coa for the combined sonic conductance is determined, the target value Coa for the combined sonic conductance is allocated to other devices than the cylinder, using the equation (1) for combining sonic conductances and critical pressure ratios as shown in FIG. 17B, thus determining the sizes of the other devices than the cylinder. In order to allocate the target value Coa for the combined sonic conductance appropriately to the devices, each of the devices is weighted by the equation (2) in FIG. 17B.

If the user selects one of solenoid valve classifications, then information of a circuit diagram corresponding to the selected solenoid valve classification is read. If the selected cylinder classification is OK, then the device selection processing means 102 performs its solenoid valve selecting sequence.

In the solenoid valve selecting sequence, the device selection processing means 102 searches for a solenoid valve which satisfies the usage conditions among one or more solenoid valves included in the selected solenoid valve classification. Specifically, the device selection processing means 102 retrieves, from the second database DB2, a minimum solenoid valve whose sonic conductance Csol satisfies the following expression:

$$Csol > f1(tst, Ccyl)$$

where tst represents the specified response time and Ccyl represents the sonic conductance of the cylinder.

Since a manifold and an exhaust processing device (silencer) are ancillary to a solenoid valve, if a manifold and an exhaust processing device need to be selected, then a solenoid valve is retrieved, and a manifold and an exhaust processing device are further retrieved.

If the user selects a solenoid valve, then an image (e.g., a photographic image or a computer graphic image) of the selected solenoid valve, and a description of the specifications of the selected solenoid valve are read.

If the user selects one of flow control device classifications, then information of a circuit diagram corresponding to the selected flow control device classification is read. If the selected flow control device classification is OK, then the device selection processing means 102 performs its flow control device selecting sequence.

In the flow control device selecting sequence, the device selection processing means 102 searches for a flow control device which satisfies the usage conditions among one or more flow control devices included in the selected flow control device classification.

Specifically, the device selection processing means 102 retrieves, from the third database DB3, a minimum flow control device whose sonic conductance Cspi satisfies the following expression:

$$Cspi > f2(tst, Ccyl, Csol)$$

where tst represents the specified response time, Ccyl represents the sonic conductance of the cylinder, and Csol represents the sonic conductance of the solenoid valve.

Thereafter, the device selection processing means 102 performs its tube selecting sequence. In the tube selecting sequence, the device selection processing means 102 searches for a tube which satisfies the usage conditions among one or more tubes included in the selected flow control device classification. Specifically, the device selection processing means 102 retrieves, from the fourth database DB4, a minimum tube whose sonic conductance of the tube Ctub satisfies the following expression:

$$Ctub > f3(tst, Ccyl, Csol, Cspi)$$

where tst represents the specified response time, Ccyl represents the sonic conductance of the cylinder, Ssol represents the sonic conductance of the solenoid valve, and Cspi represents the sonic conductance of the flow control device.

If the user requests the selection of a tube, then an image (e.g., a photographic image or a computer graphic image) of the selected tube, and a description of the specifications of the selected tube are read.

If the selection of a cylinder, a solenoid valve, a flow control device, and a tube is ended, then the processing sequence of the circuit setting processing means 100 is put to an end.

When the processing sequence of the circuit setting processing means 100 is ended, the characteristic calculation processing means 104 performs its processing sequence in step S4 shown in FIG. 14.

In the processing sequence of the characteristic calculation processing means 104, the characteristic calculation processing means 104 calculates a response time t, other various characteristic values, and dynamic characteristics of the selected cylinder operating system, based on the product numbers, the circuit configurations in the circuit configuration setting screens, and the entered usage conditions of the cylinder, the solenoid valve (including the exhaust processing device), the flow control device, and the tube which have been selected as described above, in step S201 shown in FIG. 19.

The characteristic calculation processing means 104 calculates numerical values according to simultaneous basic equations for the cylinder, the solenoid valve, the flow control device, the tube, the fittings, etc. as shown in FIGS. 16A through 16C and FIGS. 20A through 20D.

Specifically, in a physical model of the cylinder operating system shown in FIG. 16A, a flow rate qm through a restriction is expressed by basic equations (1a), (1b) shown in FIG. 16B. For a choked flow, i.e., if $p2/p1 \leq b$, then the flow rate qm is expressed by the equation (1a). For a subsonic flow, i.e., if $p2/p1 > b$, then the flow rate qm is expressed by the equation (1b).

Equations of the flow rates through the solenoid switching valve, the flow control device, the fittings, etc. are obtained from the equations (1a), (1b) shown in FIG. 16B. In view of changes in the temperature of the air, state equations (2) through (4), energy equations (5) through (7), and a kinetic equation (8) shown in FIG. 16C are satisfied as basic equations for an air cylinder.

For a tube line model shown in FIG. 20A, basic equations for a tube line (piping) shown in FIG. 20B are expressed as a continuous equation (9), a state equation (10), a kinetic equation (11), and an energy equation (12).

The tube line is divided into n elements as shown in FIG. 20C, and basic equations for the ith element are expressed as a continuous equation (13), a state equation (14), a kinetic equation (15), and an energy equation (16) as shown in FIG. 20(D). The symbols and suffixes of the basic equations shown in FIGS. 16A through 16C and FIGS. 20A through 20D are described in FIG. 21.

In step S202, the characteristic calculation processing means 104 determines whether the response time t of the selected cylinder operating system is shorter than the specified response time tst or not. If the response time t is shorter than the specified response time tst (t<tst), then control goes to steps S203, S204. In steps S203, S204, since the sizes of the selected devices have margins as described above, the sizes of the selected devices are reduced to a level closest to the specified response time tst.

In steps S203, S204, specifically, (a) the size of the largest device (the solenoid switching valve, the flow control device, the tube, the fitting, and the exhaust processing device) other than the cylinder is reduced, then (b) if good results are obtained from the size reduction, the reduction of the size of the largest device is continued, and (c) when the size of a certain device has reached a lower limit, this device is removed from the devices to be reduced in size, and the size of another device is reduced, and when there are no longer any devices to be reduced in size, the results obtained so far are used as final results, and (d) when t≥tst for the first time owing to a reduction in the size of a certain device, the device changing process is finished, and the results immediately prior to the end of the device changing process are used as final results.

If it is judged in step S202 that the response time t of the cylinder operating system is equal to or greater than the specified response time tst (t≥tst), then control goes to steps S205, S206. In steps S205, S206, since the sizes of the selected devices are too small, the sizes of the selected devices are increased to a level closest to the specified response time tst.

In steps S205, S206, specifically, (e) the size of the smallest device (the solenoid switching valve, the flow control device, the tube, the fitting, and the exhaust processing device) other than the cylinder is increased, then (f) if poor results are obtained from the size increase, the size is returned to the value immediately prior to the size increase, and this device is removed from the devices to be increased in size, then (g) when the size of a certain device reaches an upper limit, since no devices to be increased in size are available, the selection is stopped, then (h) the selection is stopped when the minimum sonic conductance of those of the solenoid switching valve, the flow control device, the tube, and the fitting becomes a multiple of the sonic conductance of the cylinder, and (i) when t<tst for the first time owing to an increase in the size of a certain device, the device changing process is finished, and the results at the end of the device changing process are used as final results.

On the assumption that the cylinder has been selected according to an optimum selection in steps S202 through S206, the minimum sizes of the solenoid valve, the flow control device, the tube, the fitting, and the exhaust processing device are selected while satisfying the specified response time tst.

In step S207, a connectable fitting is retrieved from the fifth database DB5 based on the results of the above characteristic calculations. When the retrieval of the fitting is finished, the processing sequence of the characteristic calculation processing means 104 is put to an end.

Control then goes back to the main routine shown in FIG. 14. In step S5, the device selection result screen 120 shown in FIG. 8 is displayed on the display screen of the display unit 28. In the device selection result screen 120, various characteristic values and dynamic characteristics obtained by the characteristic calculation processing means 104 are displayed as graphs, and numerical values are displayed at locations corresponding to the respective items of the results.

In step S6, it is determined whether the cylinder classification, the solenoid valve classification, or the flow control device classification is to be changed or not based on whether there is an input which means "going back to the preceding screen" or not. If there is a command for changing the classification, then control returns to step S3 in which the circuit setting processing means 100 performs its processing sequence again.

If there is no command for changing the classification, then control goes to step S7 in FIG. 15 which determines whether there is a cushion calculation request or not based on whether the cushion calculation button 128 in the device selection result screen 120 is selected or not.

If there is a cushion calculation request, then control proceeds to step S8 in which the cushion calculation processing means 106 performs its processing sequence. In the processing sequence of the cushion calculation processing means 106, the cushion calculation processing means 106 displays the cushion calculation screen 230 shown in FIG. 9 on the display screen of the display unit 28. When the user selects a cushion style and a workpiece mounting type, the cushion calculation processing means 106 keeps the cushion style and the workpiece mounting type which have been selected.

When the user clicks the calculation start button 236 to enter a calculation start request, the cushion calculation processing means 106 calculates a kinetic energy E1, a thrust energy E2, and an absorption energy E of the cylinder based on the cylinder product number, the load mass, the mounting angle, the supply pressure, the stroke end velocity, the cushion type, and the workpiece mounting type. Then, the cushion calculation processing means 106 calculates an allowable energy Er. The cylinder product number, the load mass, the mounting angle, the supply pressure, and the stroke end velocity are represented by values entered as usage conditions and values obtained from characteristic calculations.

The cushion calculation processing means 106 determines whether the calculated absorption energy E is smaller than the allowable energy Er or not. If the calculated absorption energy E is smaller than the allowable energy Er, then the cushion calculation processing means 106 displays corresponding values at the respective items of the absorption and allowable energies and also displays a message that the absorption energy is in an allowable range as a comment statement, in the result display area 238.

If the calculated absorption energy is equal to or greater than the allowable energy, then the cushion calculation processing means 106 displays corresponding values at the respective items of the absorption and allowable energies and also displays a message that the absorption energy is outside an allowable range as a comment statement, in the result display area.

Control goes back to the main routine shown in FIG. 15. If it is judged in step S7 that there is no cushion calculation request, then control goes to step S9 which determines whether there is a moisture condensation calculation request or not based on whether a moisture condensation calculation button 130 in the device selection result screen 120 shown in FIG. 8 is selected or not.

If there is a moisture condensation calculation request, then control goes to step S10 in which the moisture condensation calculation processing means 108 performs its processing sequence. In the processing sequence of the moisture condensation calculation processing means 108, the moisture condensation calculation processing means 108 displays the moisture condensation calculation screen 240 shown in FIG. 10 on the display screen of the display unit 28.

When the user selects a supplied air moisture, the moisture condensation calculation processing means 108 keeps the selected supplied air moisture. Subsequently, when the user clicks the calculation start button 244 to enter a calculation start request, the moisture condensation calculation processing means 108 calculates a low ambient temperature based on the cylinder product number, the tube product number, the tube length, the ambient temperature, the supply pressure, and the supplied air moisture. Then, the moisture condensation calculation processing means 108 calculates a produced amount M of mist. The tube product number, the tube length, the ambient temperature, and the supply pressure are represented by values entered as usage conditions and values obtained from characteristic calculations.

Thereafter, the moisture condensation calculation processing means 108 determines whether a mist is produced or not, i.e., whether the produced amount of mist is greater than 0 or not. If the produced amount of mist is greater than 0, then the moisture condensation calculation processing means 108 calculates a volume ratio Rv between the volume of the air in the cylinder as converted under the atmospheric pressure and the volume in the tube. Then, the moisture condensation calculation processing means 108 calculates a critical produced amount Mc of mist.

The moisture condensation calculation processing means 108 determines how the produced amount M of mist is related to the critical produced amount Mc of mist. If M>Mc+b (b is a constant), then the moisture condensation calculation processing means 108 displays a moisture condensation probability and a message that a moisture condensation will occur, in the result display area 246.

If the produced amount M of mist is related to the critical produced amount Mc of mist by Mc−b≤M≤Mc+b, then the moisture condensation calculation processing means 108 displays a moisture condensation probability and a message that a moisture condensation is indefinite, in the result display area 246.

If the produced amount M of mist is related to the critical produced amount Mc of mist by M<Mc−b, or if the produced amount of mist is 0, then the moisture condensation calculation processing means 108 displays a moisture condensation probability and a message that a moisture condensation will not occur in the result display area 246.

Figure 23:
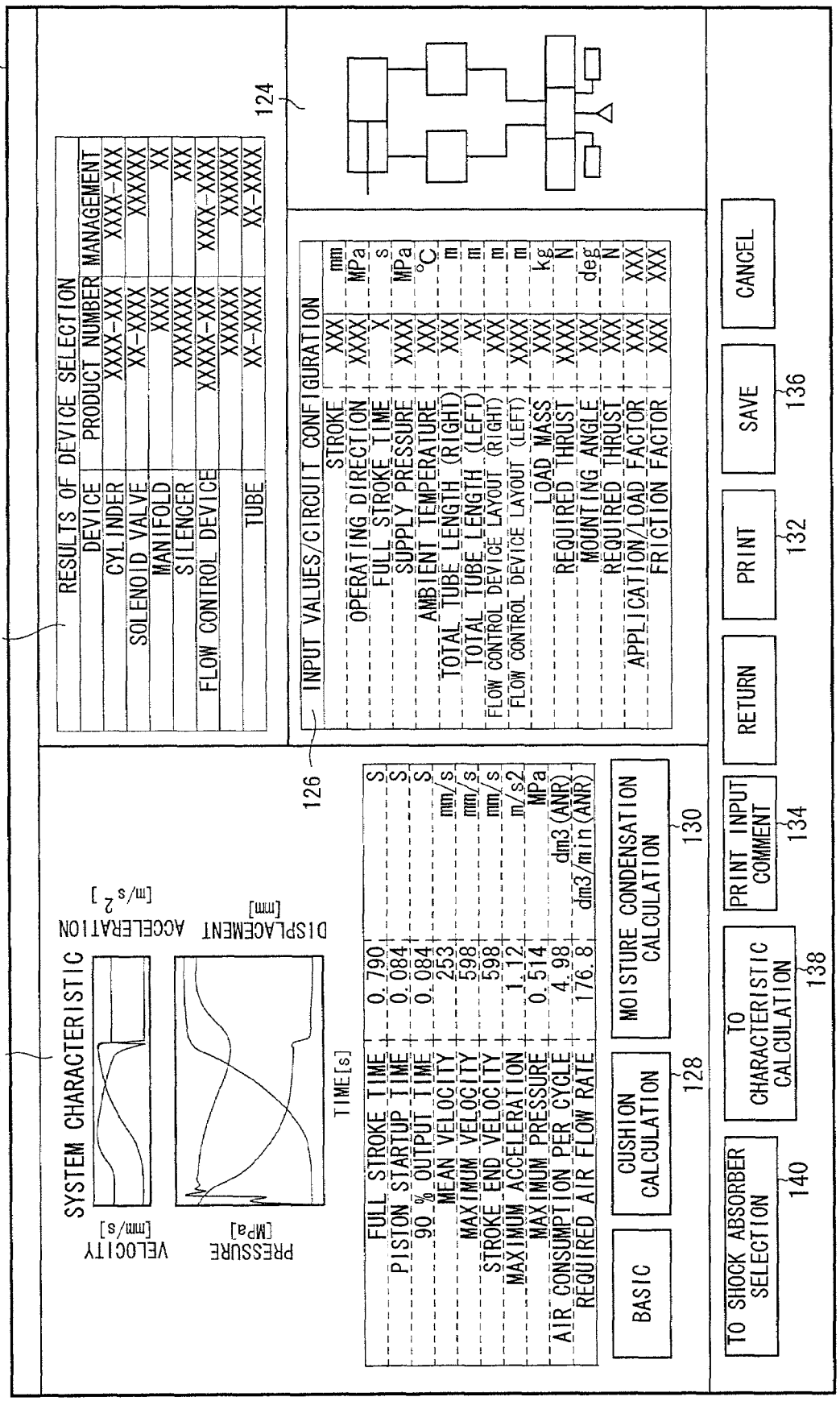
FIG. 23 is a diagram showing a displayed example of a characteristic calculation result screen.

Control goes back to the main routine shown in FIG. 23. If it is judged in step S9 that there is no moisture condensation calculation request, then control goes to step S11 which determines whether there is a print request or not based on whether the print button 132 in the device selection result screen 120 shown in FIG. 8 is selected or not.

If there is a print request, then control proceeds to step S12 in which the results (the various characteristic values and the dynamic characteristics) of the device selection and the usage conditions are printed.

If it is judged in step S11 that there is no print request, then control goes to step S13 which determines whether there is a save request or not based on whether the save button 136 in the device selection result screen 120 shown in FIG. 8 is selected or not.

If there is a save request, then control goes to step S14 in which the results (the various characteristic values and the dynamic characteristics) of the device selection and the usage conditions are recorded on a hard disk or an optical disk, for example.

When the processing in step S8, the processing in step S10, the processing in step S12, or the processing in step S14 is finished, control goes to step S15 which determines whether a new cylinder operating system is to be set or not. If the setting process or confirming process for the presently set cylinder operating system is to be continued, then control goes back to step S5 and following steps shown in FIG. 14. If a new cylinder operating system is to be set, then control goes to step S16 shown in FIG. 15 which determines whether there is an end request for the standard circuit selection processing means 60 or not. If there is no end request, control returns to step S1 shown in FIG. 14 to wait for an input of new usage conditions. If there is an end request, then the processing sequence of the standard circuit selection processing means 60 is put to an end.

The independent characteristic calculation processing means 62 has a function to calculate and display dynamic characteristics such as pressure, displacement, velocity, and acceleration, and characteristic values such as an amount of consumed air, when the product numbers of a used circuit, a cylinder, and a solenoid valve are entered. The independent characteristic calculation processing means 62 allows the automatically selected results from the standard circuit selection processing means 60 (the selected results from the device selection processing means 102) to be changed, or allows the user to select devices freely.

Figure 22:
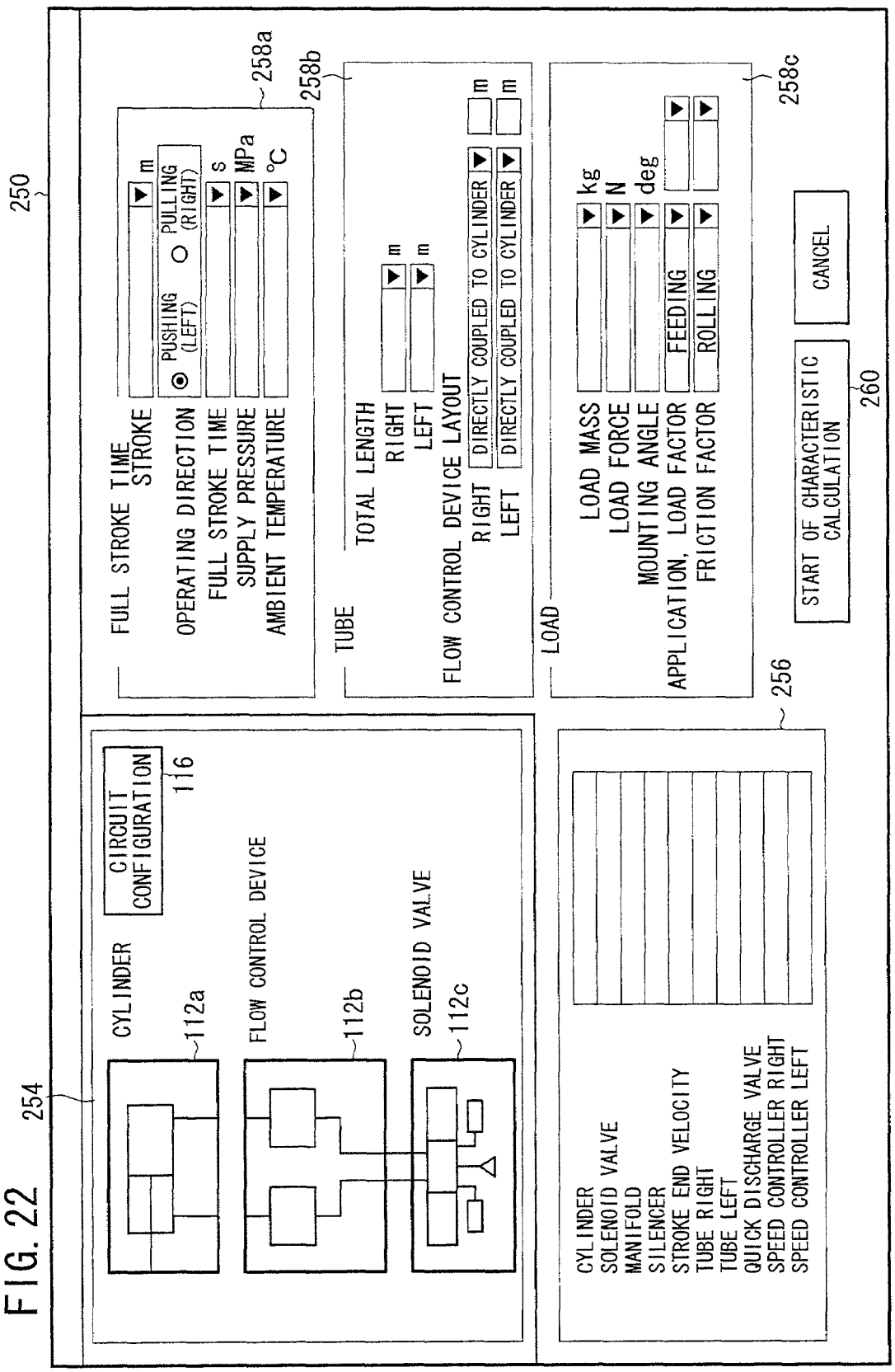
FIG. 22 is a diagram showing a displayed example of a characteristic calculation input screen.

The independent characteristic calculation processing means 62 displays a characteristic calculation input screen 250 shown in FIG. 22 and a characteristic calculation result screen 252 shown in FIG. 23.

As shown in FIG. 22, the characteristic calculation input screen 250, which is essentially identical to the device selection input screen 110 shown in FIG. 7, has a circuit setting area 254 for displaying a circuit configuration which is being set, a product number input area 256 for entering the product numbers of devices, condition setting areas 258a, 258b, 258c for entering usage conditions, and a calculation start button (icon) 260 for requesting a start of characteristic calculations.

As shown in FIG. 23, the characteristic calculation result screen 252 is essentially identical to the device selection result screen 120 shown in FIG. 8. Those parts of the characteristic calculation result screen 252 which are identical to those of device selection result screen 120 are denoted by identical reference characters, and will not be described below.

In the processing sequence of the independent characteristic calculation processing means 62, the independent characteristic calculation processing means 62 displays the characteristic calculation input screen 250 shown in FIG. 22 on the display screen of the display unit 28. Thereafter, the user enters the product numbers of the devices and then enters various usage conditions. The user may enter the usage conditions using the wizard button 118 shown in FIG. 7.

If there is a circuit setting request, then the circuit setting processing means 100 performs its processing sequence. Thereafter, the characteristic calculation processing means 104 performs its processing sequence. These processing sequences have been described above, and will not be described below.

When the processing sequence of the characteristic calculation processing means 104 is finished, the independent characteristic calculation processing means 62 displays the characteristic calculation result screen 252 shown in FIG. 23 on the display screen of the display unit 28. At the time the characteristic calculation result screen 252 is displayed, the calculations performed by the independent characteristic calculation processing means 62 are put to an end.

Figure 24:
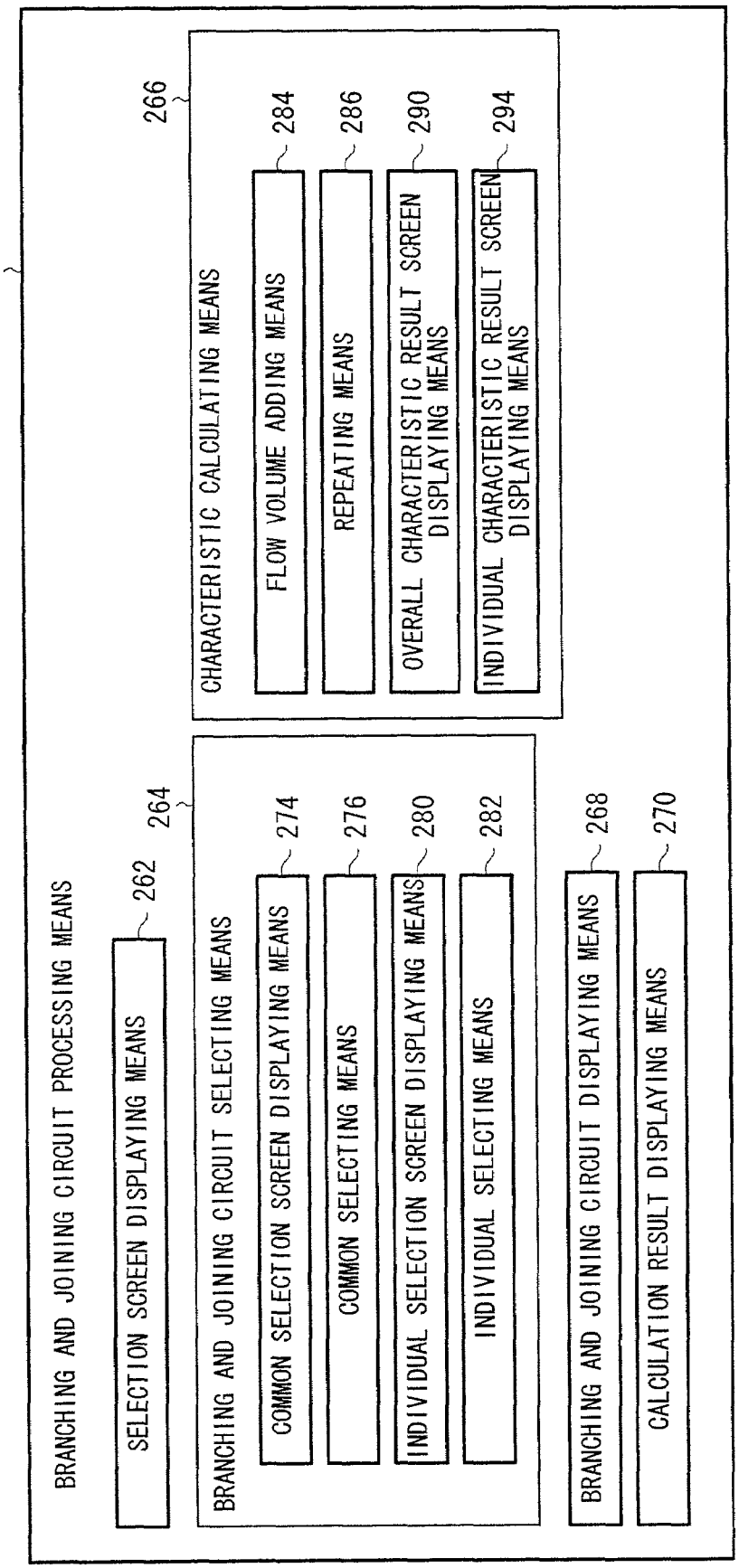
FIG. 24 is a functional block diagram of a branching and joining circuit processing means.

As shown in FIG. 24, the branching and joining circuit processing means 66 has a selection screen displaying means 262 for displaying a branching and joining circuit selection screen 261 (see FIG. 25), a branching and joining circuit selecting means 264 for selecting a branching and joining circuit 64 based on input data from the coordinate input unit 24 or the like, a characteristic calculating means 266 for calculating characteristics of the branching and joining circuit 64 selected by the branching and joining circuit selecting means 264 based on input data from the coordinate input unit 24 or the like, a branching and joining circuit displaying means 268 for displaying the branching and joining circuit 64 which is being selected or which has been selected by the branching and joining circuit selecting means 264, and a calculation result displaying means 270 for displaying results calculated by the characteristic calculating means 266.

The branching and joining circuit selecting means 264 has a common selection screen displaying means 274 for displaying a common selection screen 272 (see FIG. 26), a common selecting means 276 for selecting a common item of selected pneumatic circuits 80, an individual selection screen displaying means 280 for displaying an individual selection screen 278 (see FIG. 27), and an individual selecting means 282 for selecting an individual item of selected pneumatic circuits 80.

Figure 28:
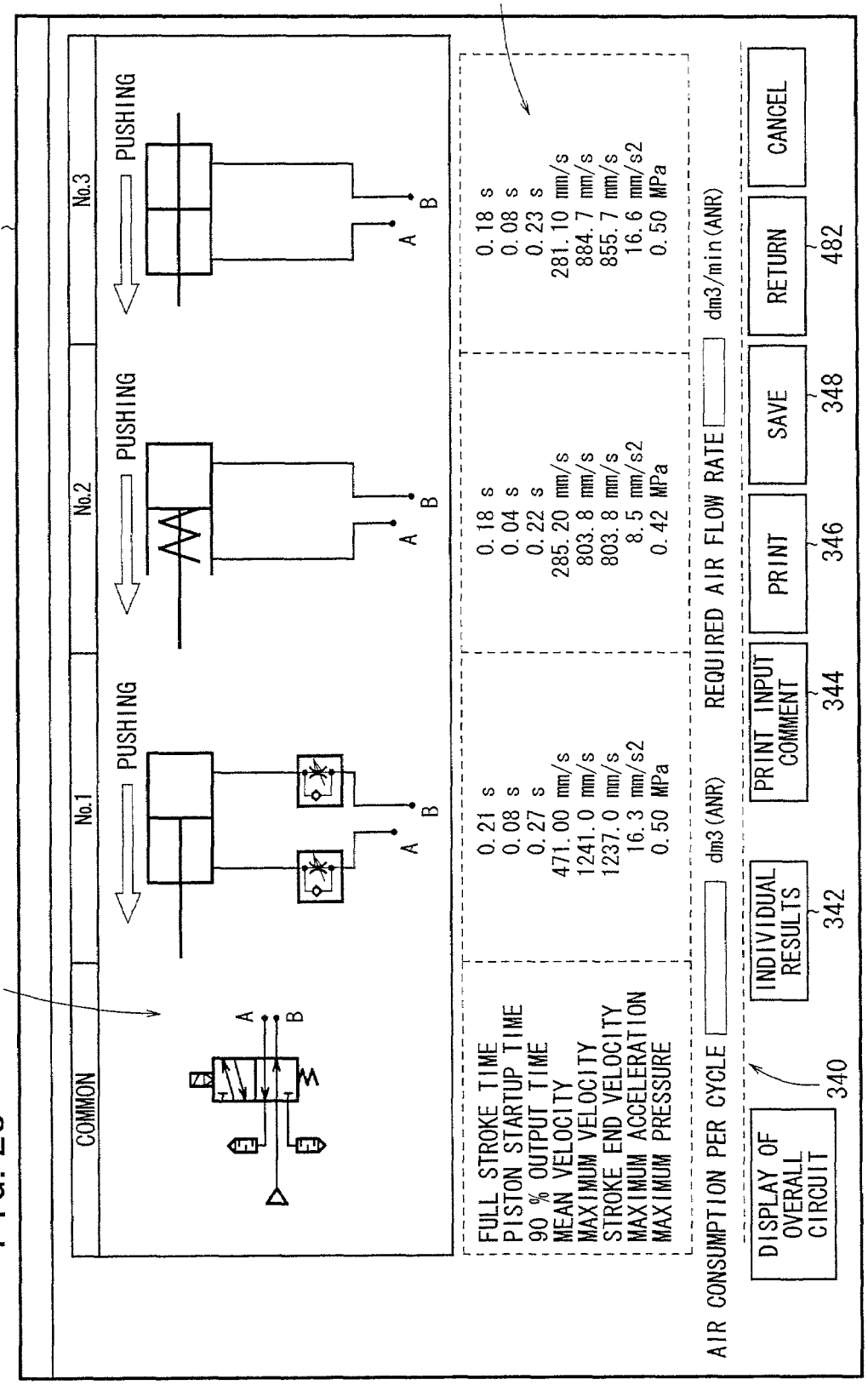
FIG. 28 is a diagram showing a displayed example of an overall characteristic result screen.
Figure 29:
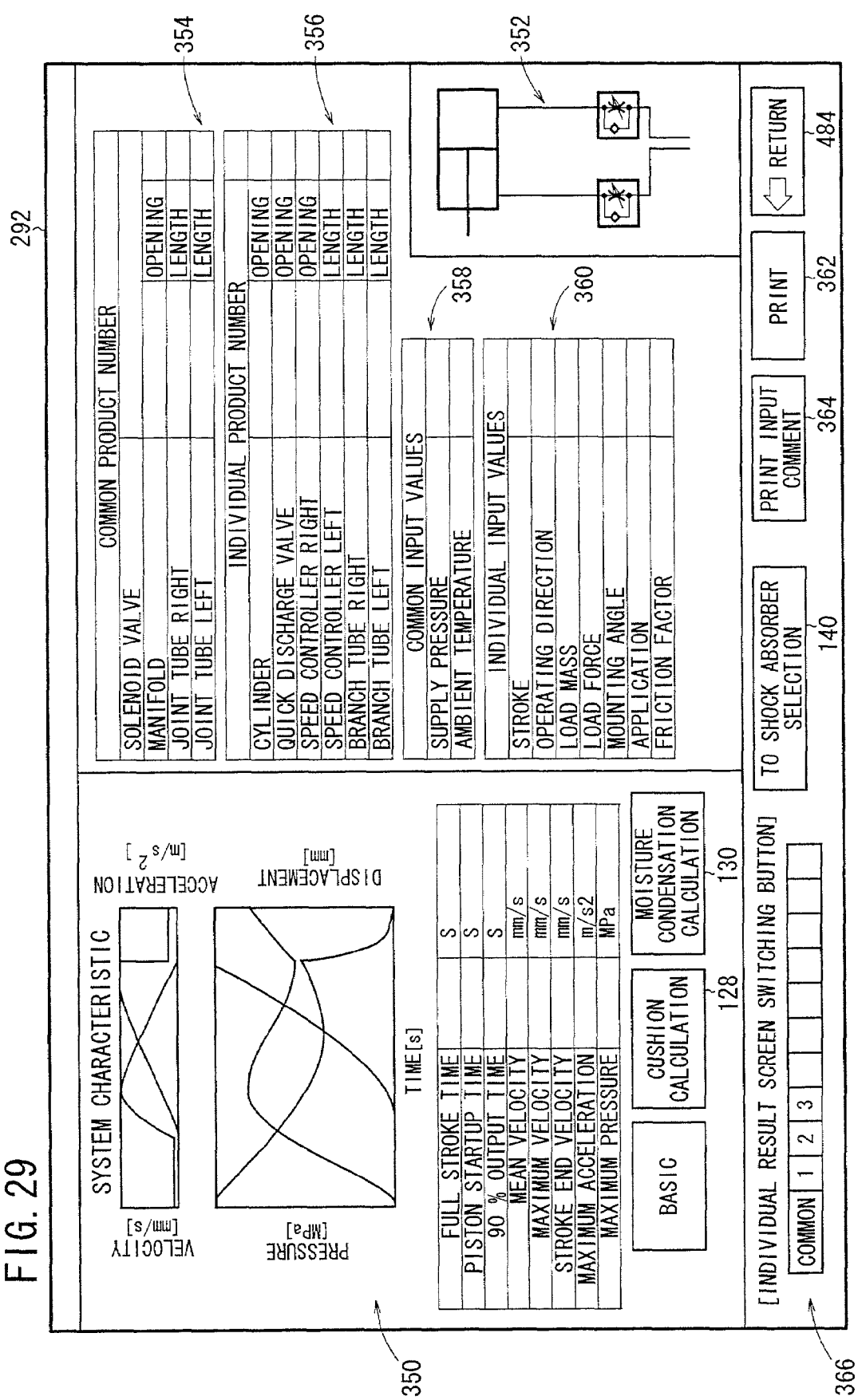
FIG. 29 is a diagram showing a displayed example of an individual characteristic result screen.
Figure 30:
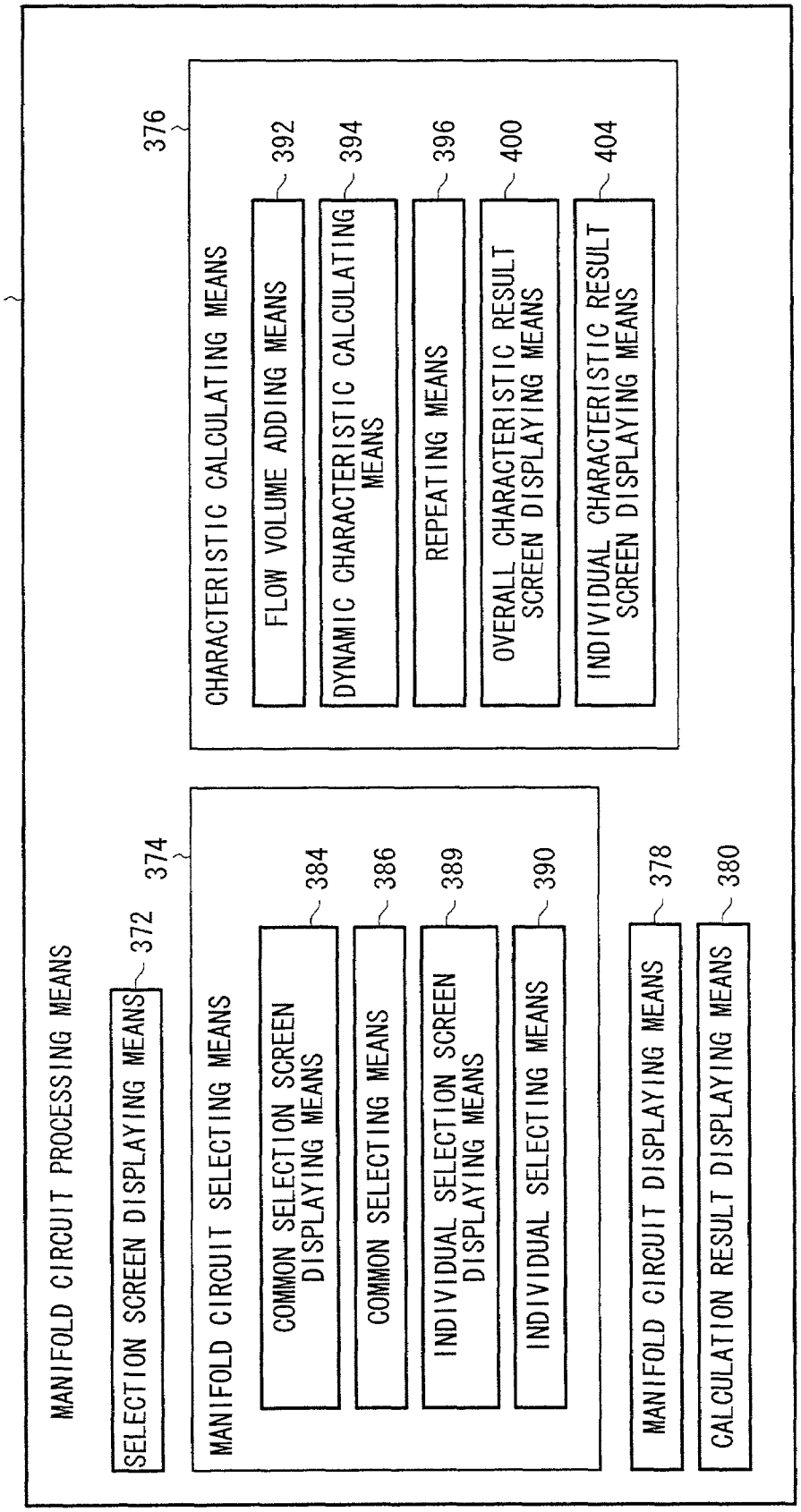
FIG. 30 is a functional block diagram of a branching and joining circuit processing means.

The characteristic calculating means 266 has a flow volume adding means 284 for adding flow volumes of two or more selected pneumatic circuits 80 at predetermined time intervals, a repeating means 286 for performing calculations of the flow volume adding means 284 until all the selected pneumatic circuits 80 reach a stroke end, an overall characteristic result screen displaying means 290 for displaying an overall characteristic result screen 288 (see FIG. 28), and an individual characteristic result screen displaying means 294 for displaying an individual characteristic result screen 292 (see FIG. 29).

Figure 25:
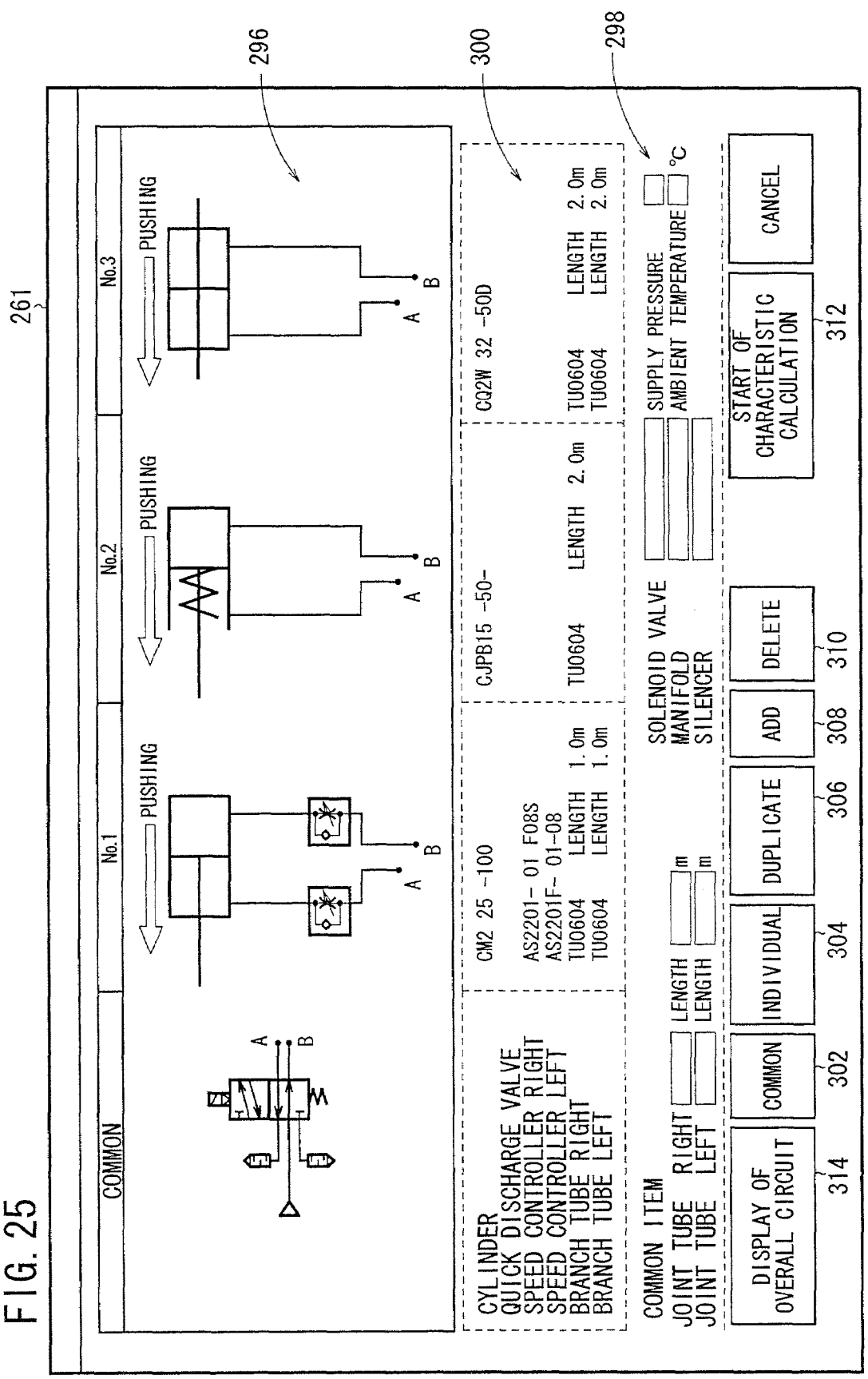
FIG. 25 is a diagram showing a displayed example of a branching and joining circuit selection screen.

As shown in FIG. 25, the branching and joining circuit selection screen 261 has a circuit setting area 296 for displaying a branching and joining circuit 64 which is being set or has been set, a common item display area 298 for displaying a selected common item, an individual item display area 300 for displaying a selected individual item, and icons simulating a plurality of operating buttons.

The operating buttons simulated by these icons include a common button 302 for setting a common item of selected pneumatic circuits 80, an individual button 304 for setting an individual item of selected pneumatic circuits 80, a duplication button 306 for copying a pneumatic circuit 80 and a device which are being selected, an addition button 308 for adding a new device to a pneumatic circuit 80 and a device which are being selected, a delete button 310 for deleting a device from a pneumatic circuit 80 device which is being selected, a characteristic calculation start button 312 for requesting characteristic calculations for each selected pneumatic circuit 80 and characteristic calculations for a branching and joining circuit 64, and an overall circuit display button 314 for displaying a branching and joining circuit 64 in its entirety at an enlarged scale.

Figure 26:
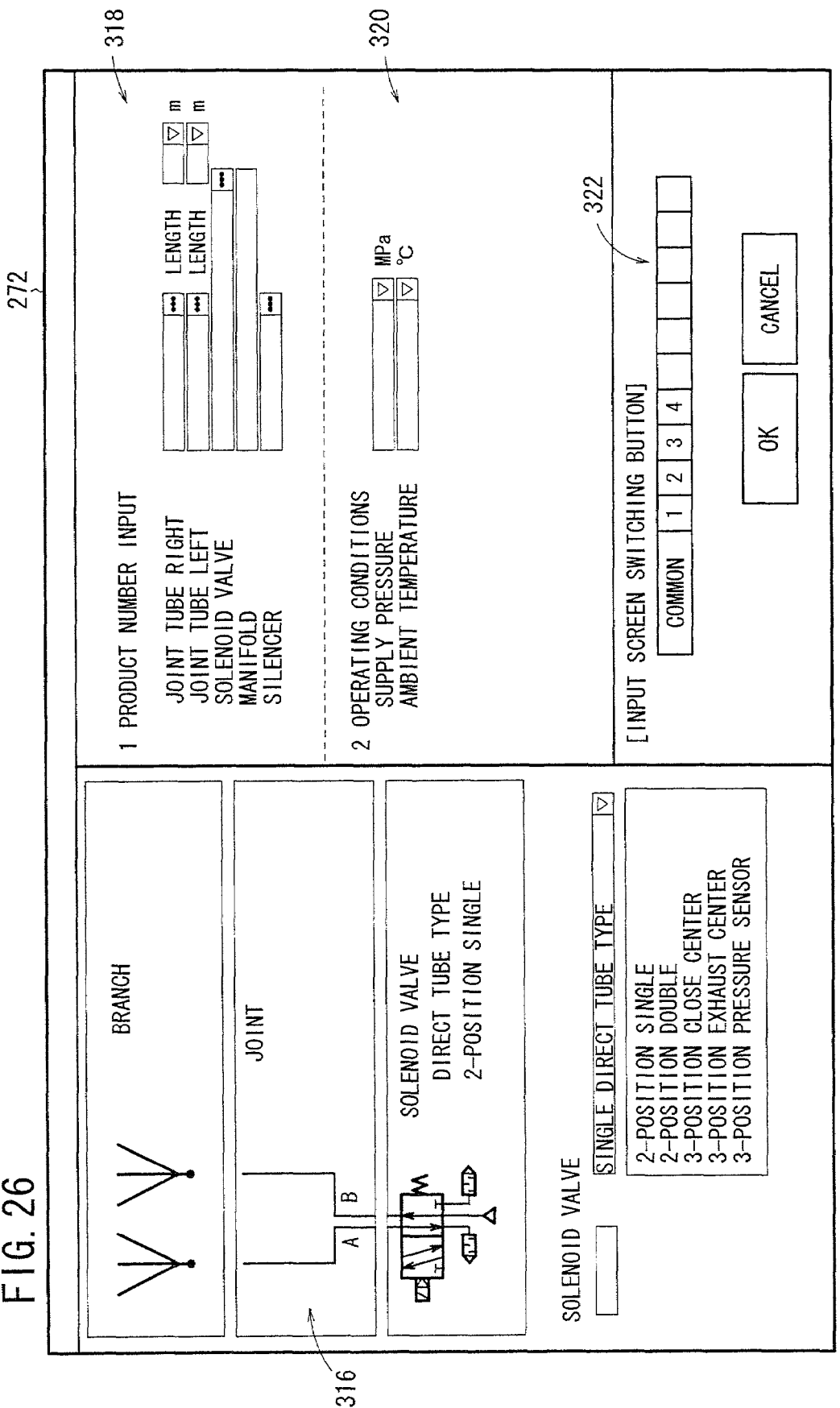
FIG. 26 is a diagram showing a displayed example of a common selection screen.

As shown in FIG. 26, the common selection screen 272 has a circuit setting area 316 for displaying a pneumatic circuit 80 which is being set or has been set, a product number input area 318 for entering the product number of each selected device, an operating condition input area 320 for entering operating conditions of a selected pneumatic circuit 80, and a switching button 322 for switching between selection screens.

Figure 27:
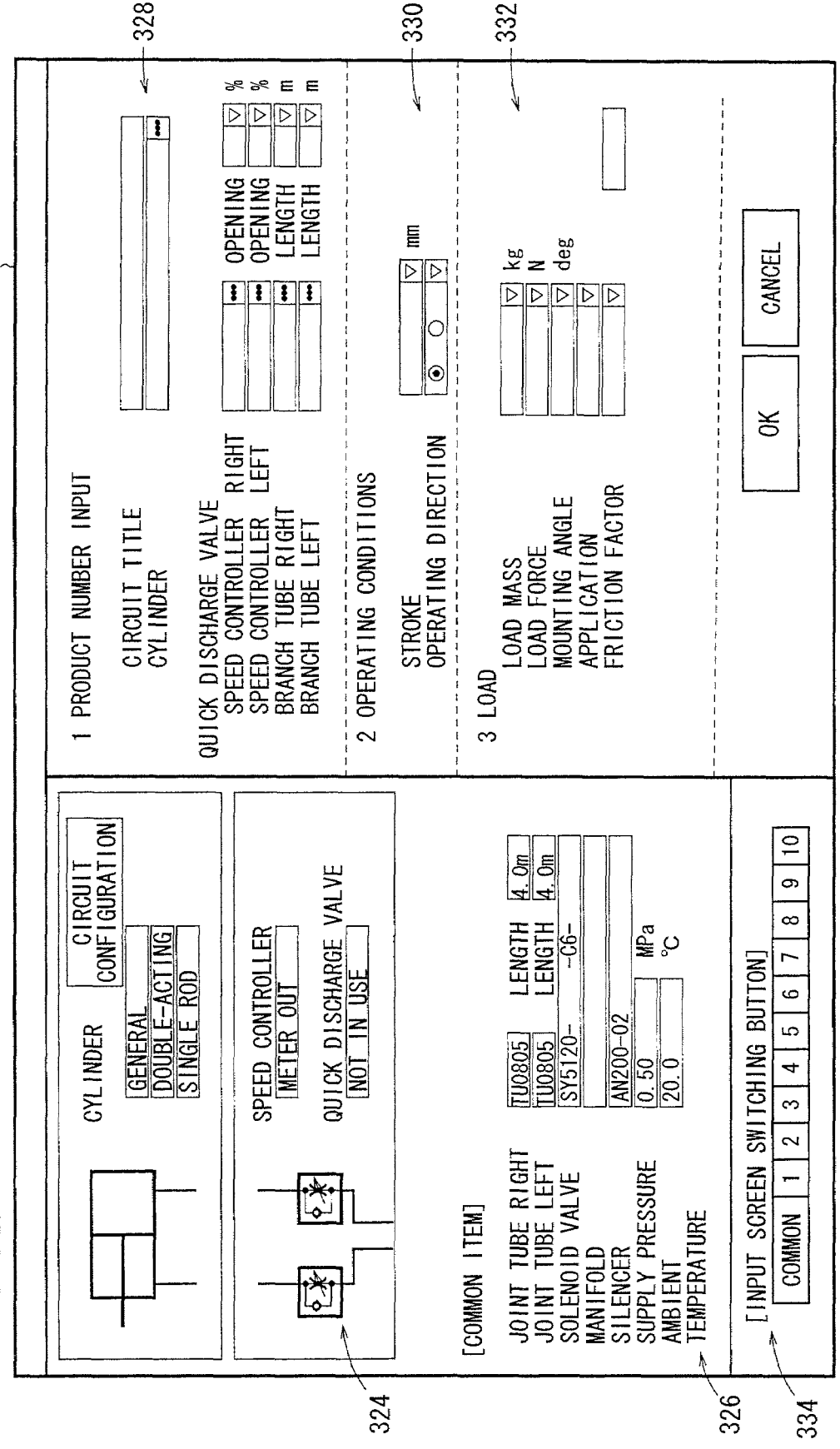
FIG. 27 is a diagram showing a displayed example of an individual selection screen.

As shown in FIG. 27, the individual selection screen 278 has a circuit setting area 324 for displaying a pneumatic circuit 80 which is being set or has been set, a common item display area 326 for displaying a set common item, a product number input area 328 for entering the product number of each selected device, an operating condition input area 330 for entering operating conditions of a selected pneumatic circuit 80, a load input area 332 for entering a load mass, a load force, etc., and a switching button 334 for switching between selection screens.

As shown in FIG. 28, the overall characteristic result screen 288 has a circuit setting area 336 for displaying a selected branching and joining circuit 64, an individual characteristic display area 338 for displaying numerical values of individual characteristics (a full stroke time, a piston startup time, a 90% output time, a mean velocity, a maximum velocity, a stroke end velocity, a maximum acceleration, a maximum pressure, etc.) of a plurality of pneumatic circuits 80 that make up the selected branching and joining circuit 64, an overall characteristic display area 340 for displaying numerical values of overall characteristics (an air consumption per cycle, a required air flow rate, etc.) of the selected branching and joining circuit 64, and icons simulating a plurality of operating buttons.

The operating buttons simulated by these icons include an individual result button 342 for displaying an individual characteristic result screen 292 (see FIG. 29), a print comment input button 344 for going to an input screen for entering comments to be printed on a lower portion of a printed sheet, a print button 346 for requesting the printing of each result and usage conditions, and a save button 348 for requesting the saving of the results of characteristic calculations and usage conditions (on a hard disk, or an optical disk such as a CD-R or a DVD-RAM, etc.).

As shown in FIG. 29, the individual characteristic result screen 292 has a system characteristic display area 350 for displaying the dynamic behavior (graphic representation) and major characteristic values of a designated one of a plurality of pneumatic circuits 80 that make up a selected branching and joining circuit 64, a circuit configuration display area 352 for displaying a circuit configuration diagram which has been set, a common product number display area 354 for displaying the product number of an entered common item, an individual product number display area 356 for displaying the product number of an entered individual item, a common input value display area 358 for displaying a value entered as a common item, and an individual input value display area 360 for displaying a value entered as an individual item.

The individual characteristic result screen 292 has icons simulating a plurality of operating buttons, in addition to the above display areas. The operating buttons simulated by these icons include a cushion calculation button 128 for requesting cushion calculations, a moisture condensation calculation button 130 for requesting moisture condensation calculations, a shock absorber selection button 140 for requesting a shift to the shock absorber selection processing means 72, a print button 362 for requesting the printing of the results of a device selection, cushion calculations, moisture condensation calculations, and usage conditions, a print comment input button 364 for shifting to an input screen for entering comments to be printed on a lower portion of a printed sheet, and a switching button 366 for switching between individual characteristic result screens 292.

The manifold circuit processing means 70 has a selection screen displaying means 372 for displaying a manifold circuit selection screen 370 (see FIG. 31), a manifold circuit selecting means 374 for selecting a manifold circuit 68 based on input data from the coordinate input unit 24 or the like, a characteristic calculating means 376 for calculating characteristics of the manifold circuit 68 selected by the manifold circuit selecting means 374 based on input data from the coordinate input unit 24 or the like, a manifold circuit displaying means 378 for displaying the manifold circuit 68 which is being selected or which has been selected by the manifold circuit selecting means 374, and a calculation result displaying means 380 for displaying results calculated by the characteristic calculating means 376.

The manifold circuit selecting means 374 has a common selection screen displaying means 384 for displaying a common selection screen 382 (see FIG. 32), a common selecting means 386 for selecting a common item of selected pneumatic circuits 80, an individual selection screen displaying means 389 for displaying an individual selection screen 388 (see FIG. 33), and an individual selecting means 390 for selecting an individual item of selected pneumatic circuits 80.

Figure 34:
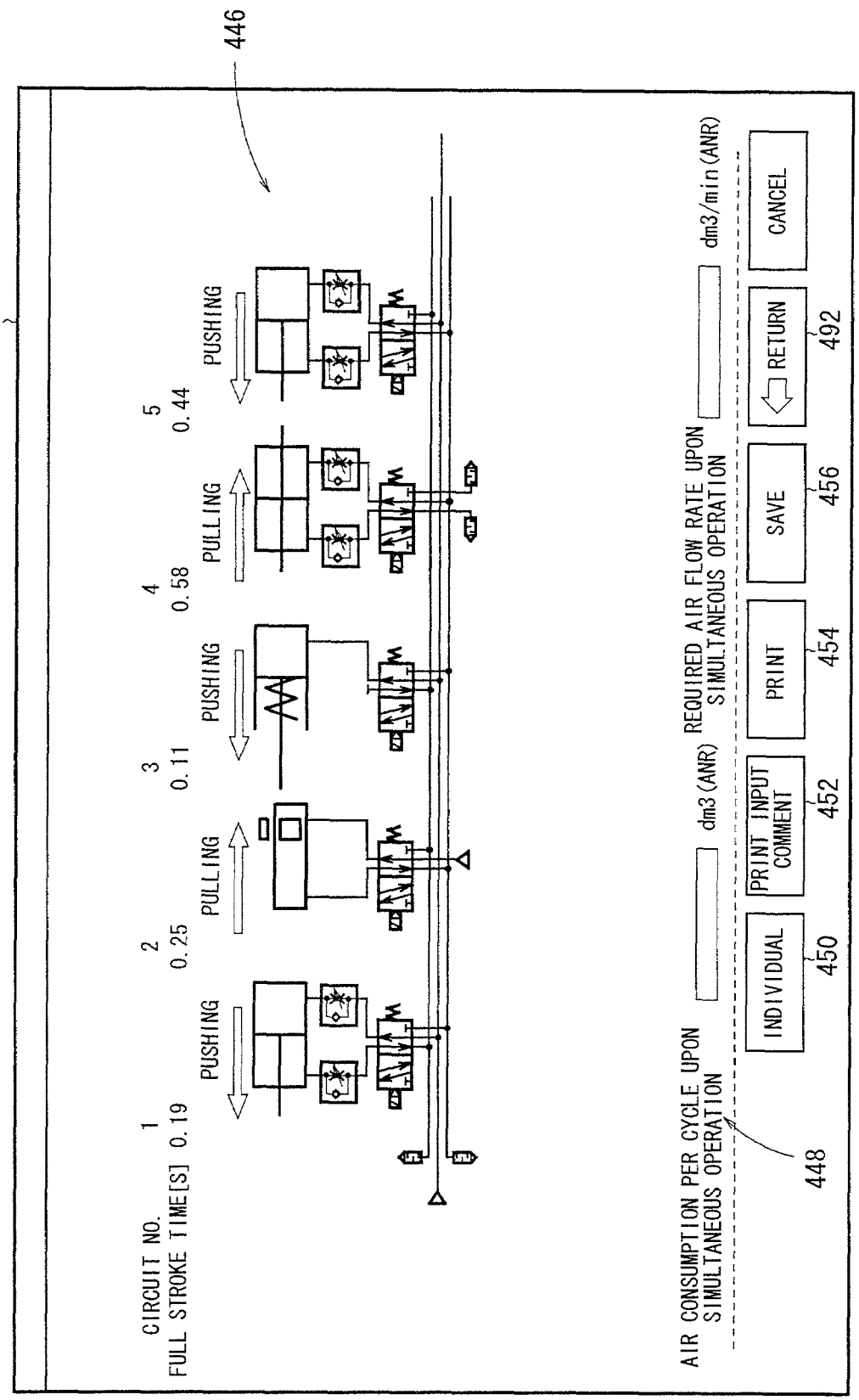
FIG. 34 is a diagram showing a displayed example of an overall characteristic result screen.
Figure 35:
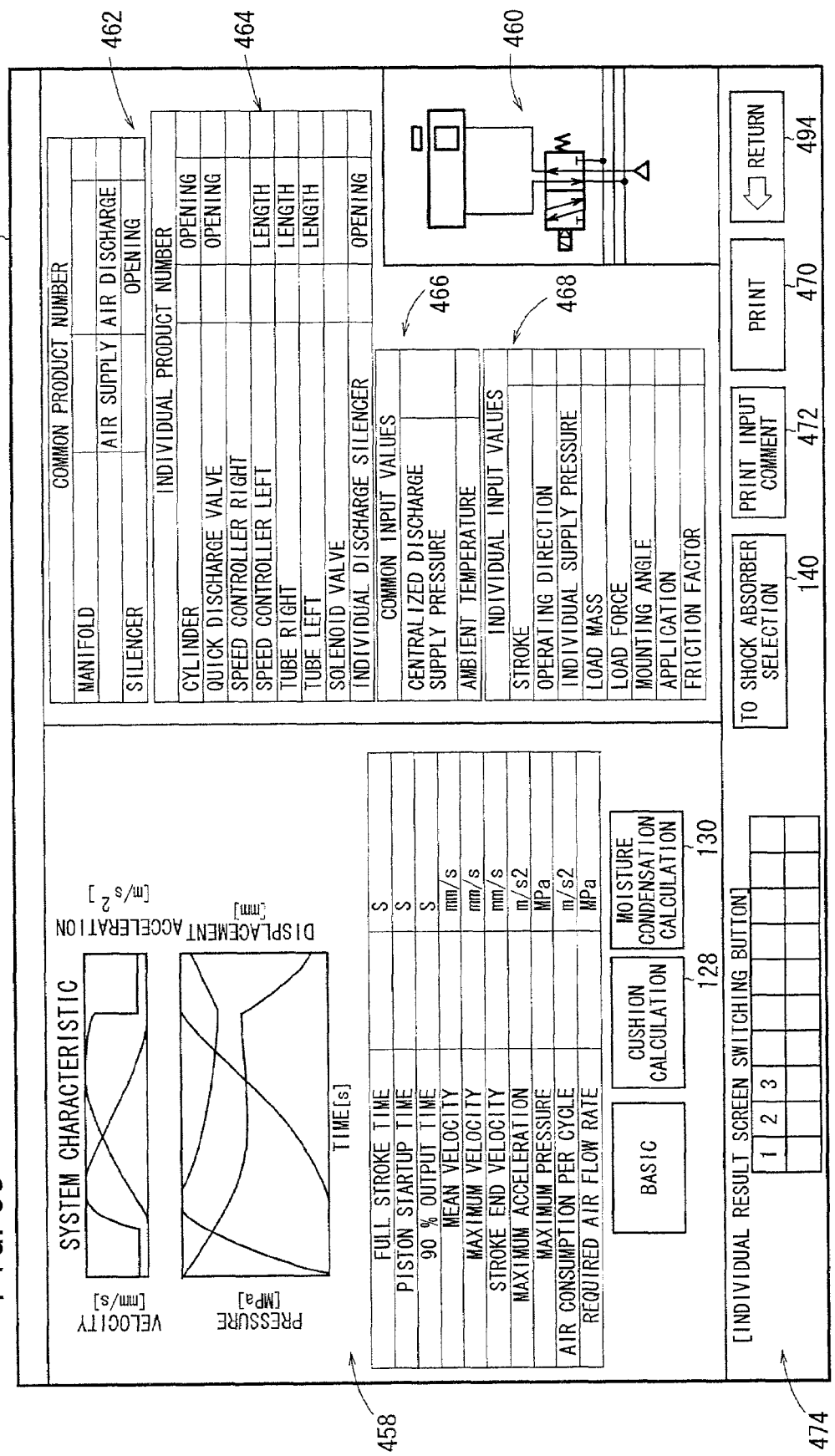
FIG. 35 is a diagram showing a displayed example of an individual characteristic result screen.

The characteristic calculating means 376 has a flow volume adding means 392 for adding flow volumes from solenoid valves 82 in two or more selected pneumatic circuits 80 at predetermined time intervals, a dynamic characteristic calculating means 394 for calculating dynamic characteristics of a manifold 92 based on the sum of flow volumes at predetermined time intervals, a repeating means 396 for performing calculations of the flow volume adding means 392 and calculations of the dynamic characteristic calculating means 394 until all the two or more selected pneumatic circuits 80 reach a stroke end, an overall characteristic result screen displaying means 400 for displaying an overall characteristic result screen 398 (see FIG. 34), and an individual result screen displaying means 404 for displaying an individual characteristic result screen 402 (see FIG. 35).

Figure 31:
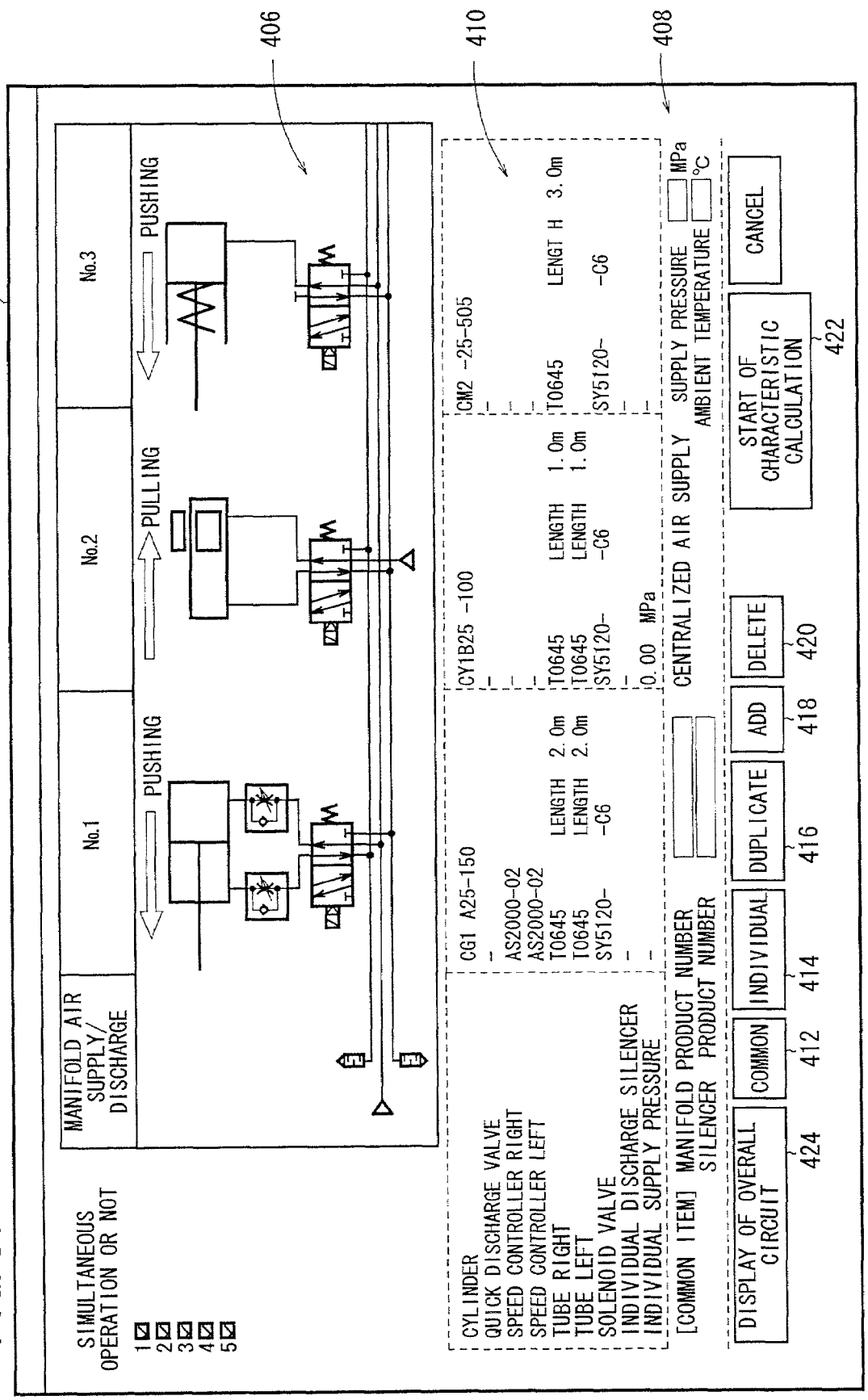
FIG. 31 is a diagram showing a displayed example of a branching and joining circuit selection screen.

As shown in FIG. 31, the manifold circuit selection screen 370 has a circuit setting area 406 for displaying a manifold circuit 68 which is being set or has been set, a common item display area 408 for displaying a selected common item, an individual item display area 410 for displaying a selected individual item, and icons simulating a plurality of operating buttons.

As with the branching and joining circuit selection screen 261 (see FIG. 25) described above, the operating buttons simulated by these icons include a common button 412, an individual button 414, a duplication button 416, an addition button 418, a delete button 420, a characteristic calculation start button 422 for requesting characteristic calculations for each selected pneumatic circuit 80 and characteristic calculations for a manifold circuit 68, and an overall circuit display button 424 for displaying a manifold circuit 68 in its entirety at an enlarged scale.

Figure 32:
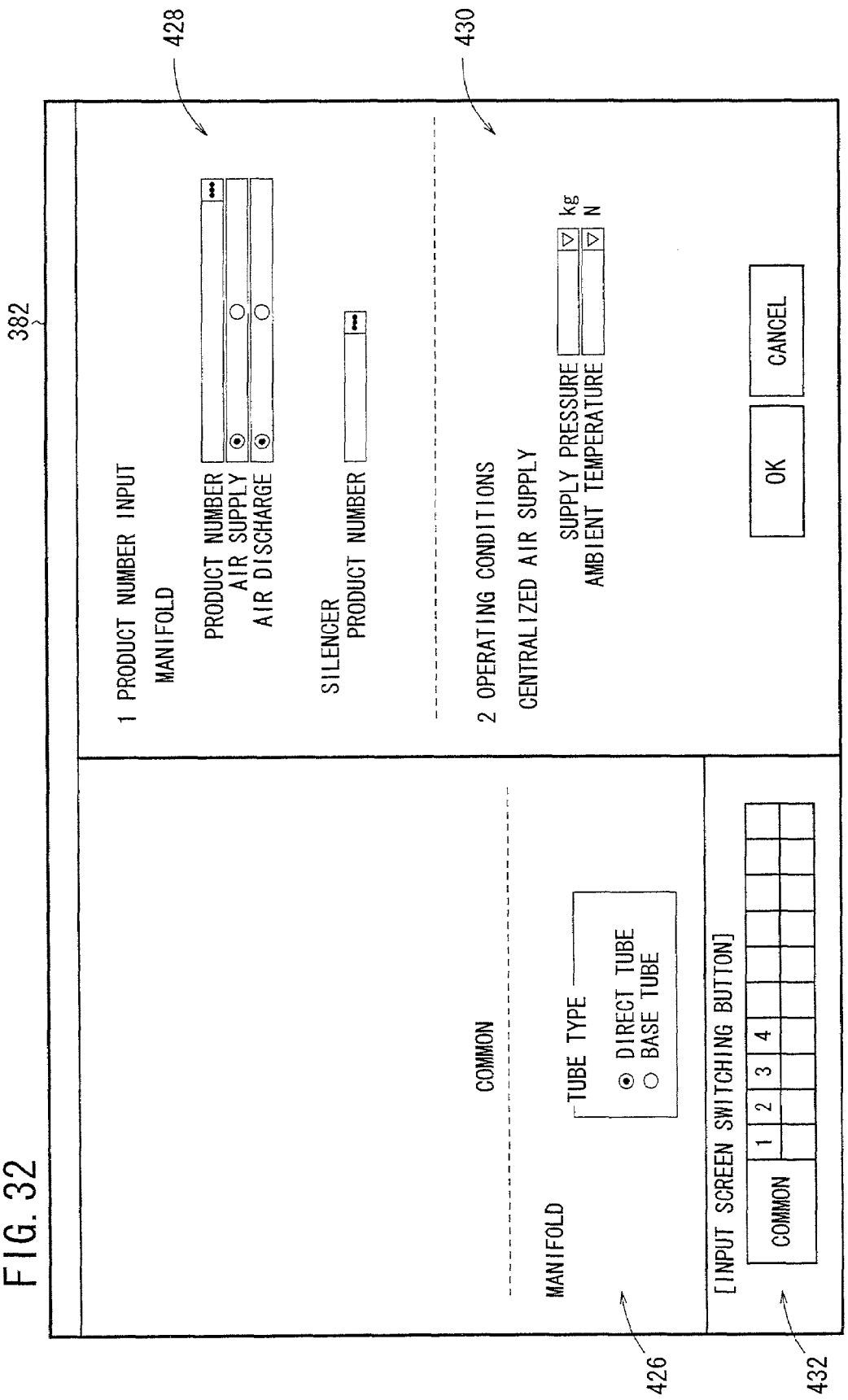
FIG. 32 is a diagram showing a displayed example of a common selection screen.

As shown in FIG. 32, the common selection screen 382 has a piping selection area 426 for selecting a piping type for a manifold 92, a product number input area 428 for entering the product numbers of a manifold 92 and a silencer which are selected, an operating condition input area 430 for entering operating conditions of a selected manifold 92, and a switching button 432 for switching between selection screens.

Figure 33:
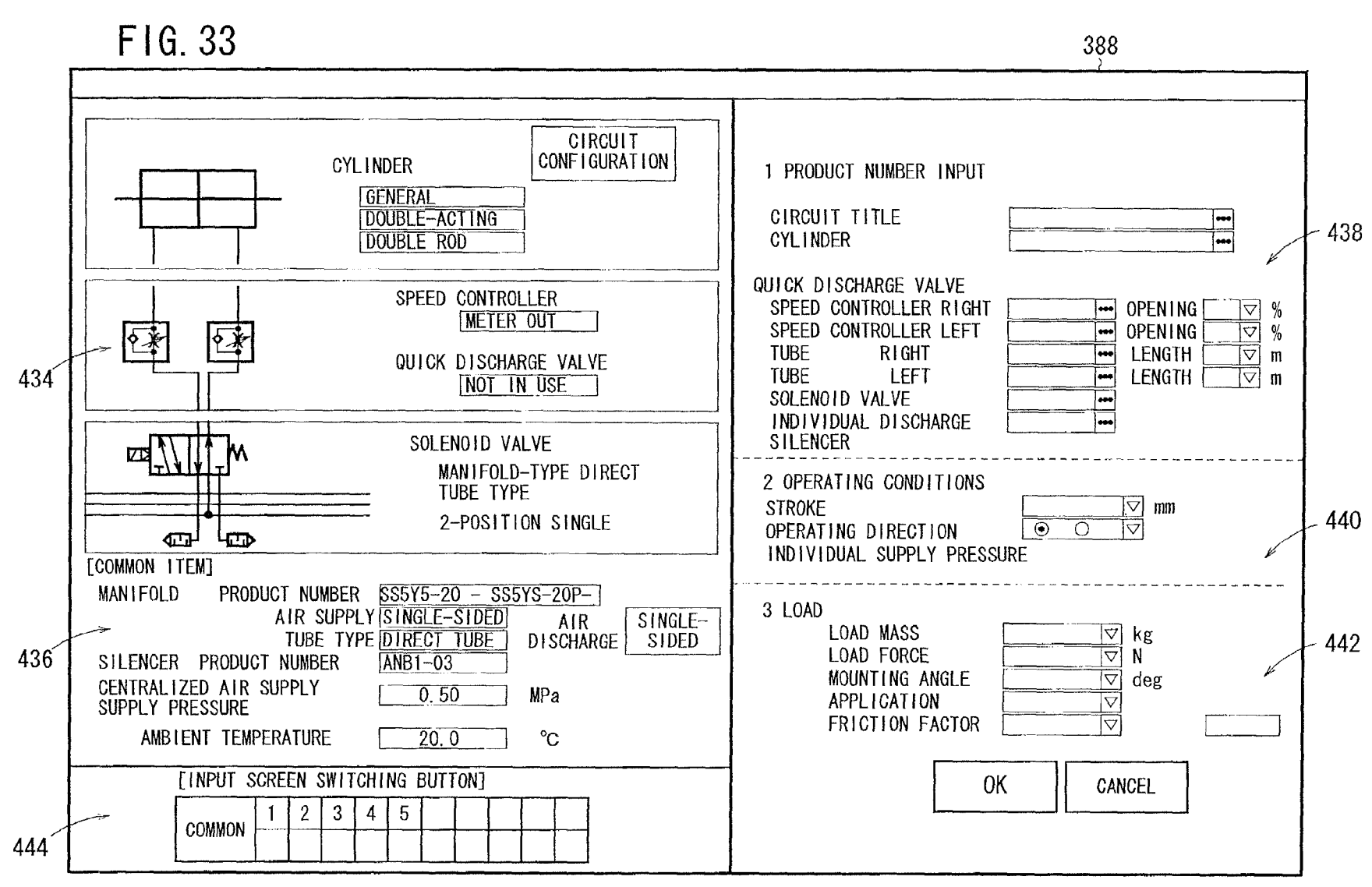

As shown in FIG. 33, the individual selection screen 388 has a circuit setting area 434 for displaying a pneumatic circuit 80 which is being set or has been set, a common item display area 436 for displaying a set common item, a product number input area 438 for entering the product number of each selected device, an operating condition input area 440 for entering operating conditions of a selected pneumatic circuit 80, a load input area 442 for entering a load mass, a load force, etc., and a switching button 444 for switching between selection screens.

As shown in FIG. 34, the overall characteristic result screen 398 has a circuit setting area 446 for displaying a selected manifold circuit 68, an overall characteristic display area 448 for displaying numerical values of overall characteristics (an air consumption per cycle upon simultaneous operation, a required air flow rate upon simultaneous operation, etc.) of the selected manifold circuit 68, and icons simulating a plurality of operating buttons.

As with the overall characteristic result screen 288 (see FIG. 28) described above, the operating buttons simulated by these icons include an individual result button 450 for displaying the individual characteristic result screen 402 (see FIG. 35), a print comment input button 452, a print button 454, and a save button 456.

As shown in FIG. 35, the individual characteristic result screen 402 has a system characteristic display area 458 for displaying the dynamic behavior (graphic representation) and major characteristic values of a designated one of a plurality of pneumatic circuits 80 that make up a selected manifold circuit 68, a circuit configuration display area 460 for displaying a circuit configuration diagram which has been set, a common product number display area 462 for displaying the product number of an entered common item, an individual product number display area 464 for displaying the product number of an entered individual item, a common input value display area 466 for displaying a value entered as a common item, and an individual input value display area 468 for displaying a value entered as an individual item.

The individual characteristic result screen 402 has icons simulating a plurality of operating buttons, in addition to the above display areas. As with the individual characteristic result screen 292 (see FIG. 29) described above, the operating buttons simulated by these icons include a cushion calculation button 128, a moisture condensation calculation button 130, a shock absorber selection button 140 for requesting a shift to the shock absorber selection processing means 72, a print button 470, a print comment input button 472, and a switching button 474 for switching between individual characteristic result screens.

A processing sequence of the branching and joining circuit processing means 66 will be described below with reference to FIGS. 36 through 41.

Figure 36:
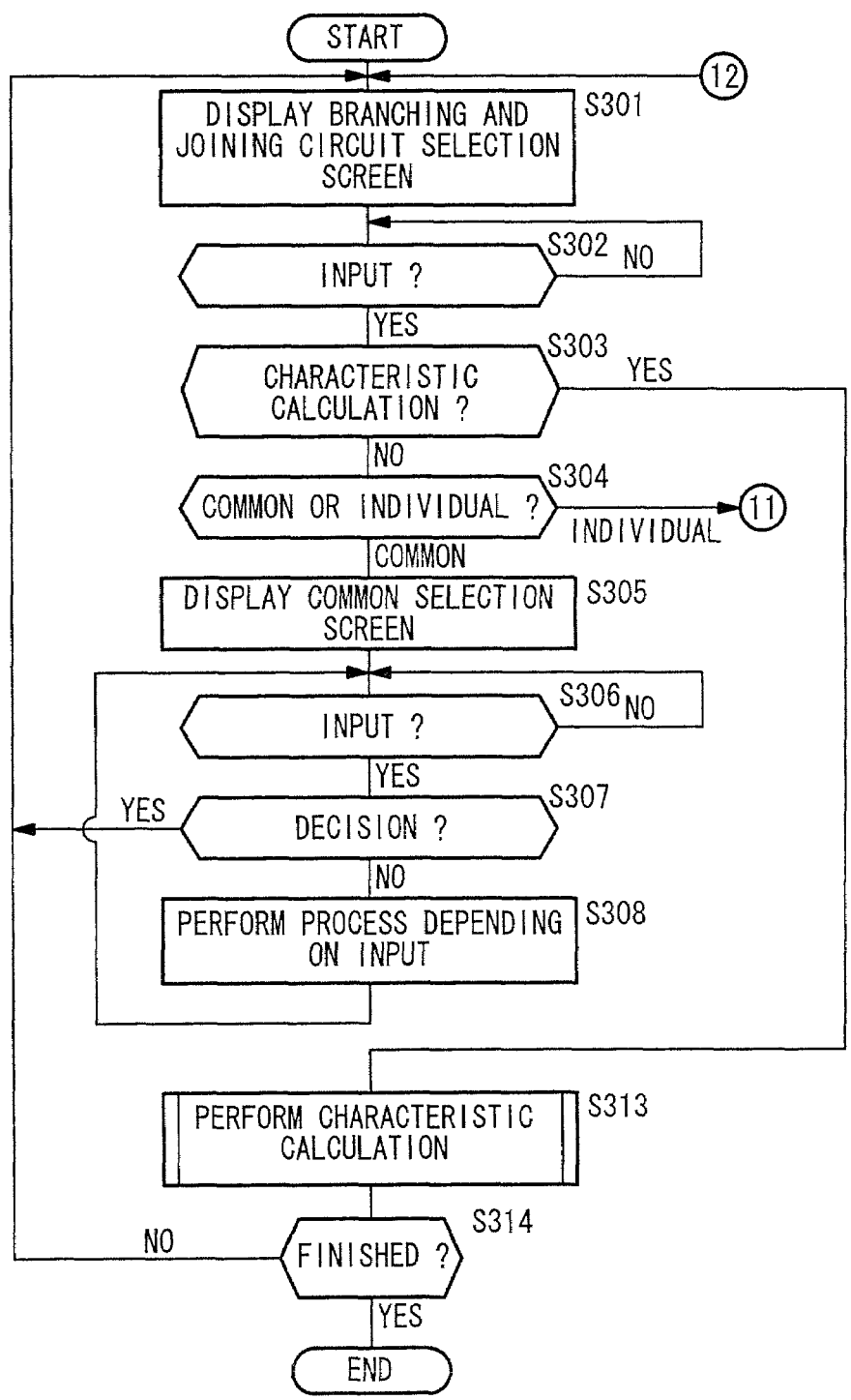
FIG. 36 is a flowchart (part 1) of a processing sequence of the branching and joining circuit processing means.

In step S301 shown in FIG. 36, the selection screen displaying means 262 displays the branching and joining circuit selection screen 261 shown in FIG. 25 on the screen of the display unit 28. Thereafter, an input from the user is awaited in step S302. When there is an input from the user, control goes to step S303 which determines whether there is a characteristic calculation request or not based on whether the characteristic calculation start button 312 is selected (e.g., the mouse is clicked) or not. If there is not a characteristic calculation request, then control goes to step S304 which determines whether there is a common item request or an individual item request based on whether the common button 302 or the individual button 304 is selected. If the common button 302 is selected, then control goes to step S305 in which the common selection screen displaying means 274 displays the common selection screen 272 shown in FIG. 26 on the screen of the display unit 28. Thereafter, an input from the user is awaited in step S306. When there is an input from the user, control goes to step S307 which determines whether there is a decision input or not based on whether there is an input indicative of OK or not. If there is not an input indicative of OK, then control goes to step S308 which performs a process depending on the input from the user. For example, if a product number is entered, then a circuit image of a device corresponding to the product number is displayed in the circuit setting area 316, and the product number is displayed in the product number input area 318. If an operating condition is entered, then an entered numerical value is displayed in the operating condition input area 320. On the common selection screen 272 (see FIG. 26), a solenoid valve is also selected.

When the processing in step S308 is finished, control goes back to step S306, waiting for a next input. If the switching button 322 is selected in step S306, then the display unit 28 displays an individual selection screen 278 (see FIG. 27) corresponding to the number of the switching button 322, and control goes to the processing from step S310.

If it is judged that there is a decision input in step S307, then control goes back to the processing from step S301 which displays the branching and joining circuit selection screen 261 (see FIG. 25), after which a next input is awaited.

Figure 37:
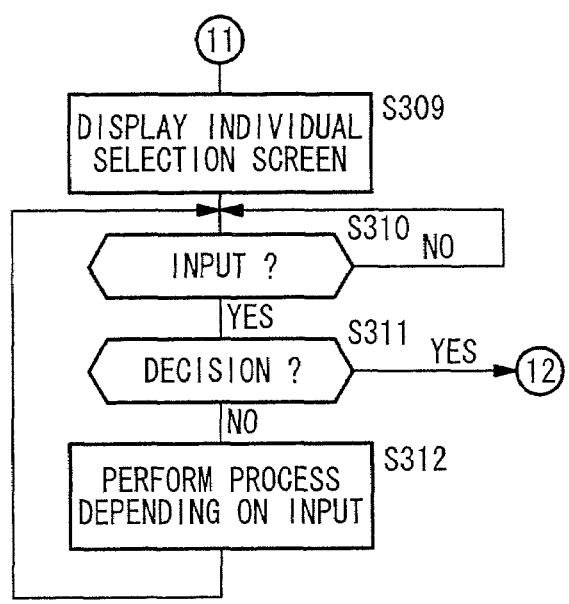
FIG. 37 is a flowchart (part 2) of the processing sequence of the branching and joining circuit processing means.

If it is judged that there is an individual item request in step S304, then control goes to step S309 shown in FIG. 37 in which the individual selection screen displaying means 280 displays the individual selection screen 278 shown in FIG. 27 on the screen of the display unit 28. Thereafter, an input from the user is awaited in step S310. When there is an input from the user, control goes to step S311 which determines whether there is a decision input or not. If there is not a decision input, then control goes to step S312 which performs a process depending on the input from the user. For example, if a product number is entered, then a circuit image of a device corresponding to the product number is displayed in the circuit setting area 324, and the product number is displayed in the product number input area 328. If an operating condition is entered, then an entered numerical value is displayed in the operating condition input area 330. If a load is entered, then an entered numerical value is displayed in the load input area 332. If the switching button 334 is selected in step S310, then the display unit 28 displays an individual selection screen 278 corresponding to the number of the switching button 334. Thereafter, control goes back to step S310 to wait for a next input.

If it is judged that there is a decision input in step S311, control goes back to the processing from step S301 which displays the branching and joining circuit selection screen 261 (see FIG. 25), after which a next input is awaited.

If it is judged that there is a characteristic calculation request in step S303 shown in FIG. 36, then control goes to step S313 in which the characteristic calculating means 266 performs its processing sequence.

Figure 38:
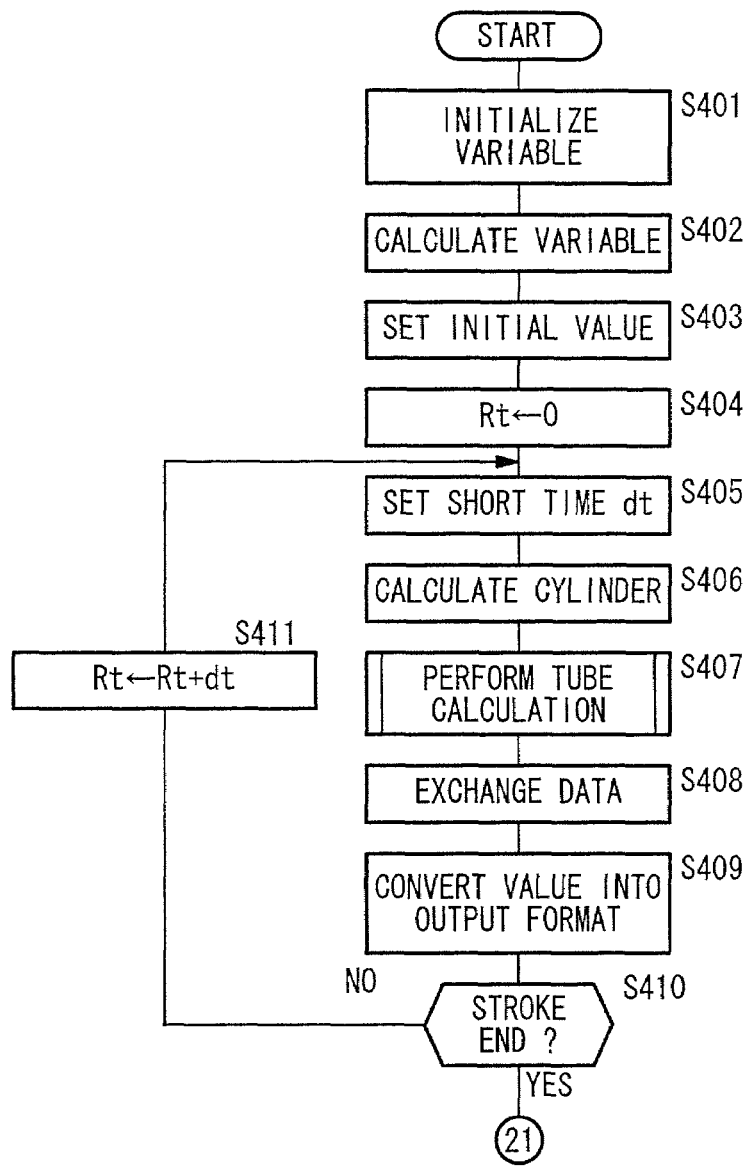
FIG. 38 is a flowchart (part 1) of a processing sequence of a characteristic calculating means of the branching and joining circuit processing means.

In the processing sequence of the characteristic calculating means 266, the characteristic calculating means 266 initializes a calculation result variable such as the full stroke time and a calculation control variable in step S401 shown in FIG. 38. Thereafter, the characteristic calculating means 266 calculates variables required for calculations with respect to devices including a solenoid valve, a cylinder, a tube, a manifold, etc. in step S402. For example, the characteristic calculating means 266 calculates the sonic conductance of a solenoid valve, the piston area of a cylinder, a load mass, the number of divided tubes, etc.

Thereafter, in step S403, an initial value is set as a change (e.g., a cylinder pressure, a piston displacement, the sum of flow volumes at the branch of a branched tube, or the like) used for repetitive calculations. For the characteristic calculations, a differential process for calculating a new state from a preceding state (including an initial state) after elapse of a certain time interval dt is used. Each time a calculation is made, a new calculated value is redefined as a preceding value, which will be used in a next calculation.

Based on the product numbers of a cylinder 78, a solenoid valve 82 (including a discharge processing device), a flow control device, and a tube which have been selected, the circuit configuration on the circuit configuration setting screen, and the entered operating conditions, various characteristic values and dynamic characteristics of each pneumatic circuit 80 and the branching and joining circuit 64 are calculated according to the differential process. As with the characteristic calculation processing means 104 of the standard circuit selection processing means 60 described above, the characteristic calculating means 266 calculates numerical values according to simultaneous basic equations for the cylinder, the solenoid valve, the flow control device, the tube, the fittings, etc. as shown in FIGS. 16A through 16C and FIGS. 20A through 20D.

Figure 40:
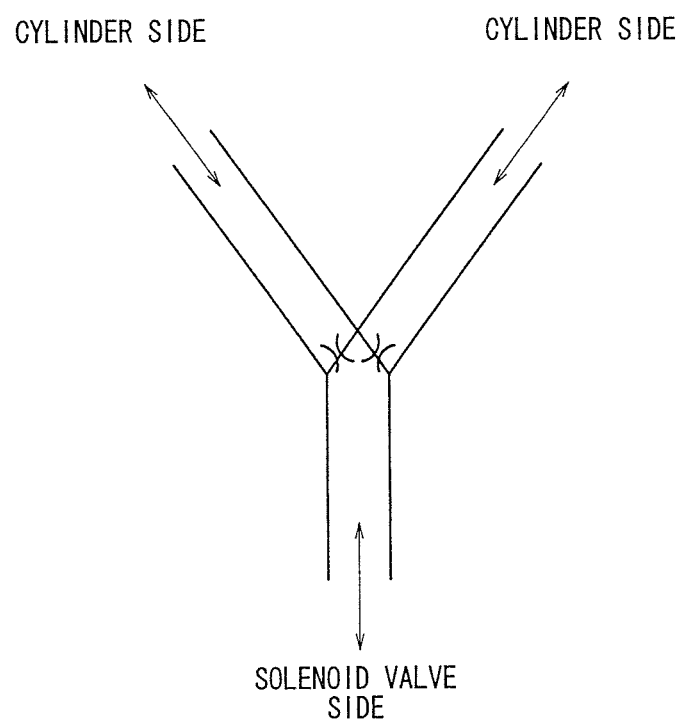
FIG. 40 is a diagram showing a branching and joining model used in the calculations for the branching and joining circuit.
Figure 41:
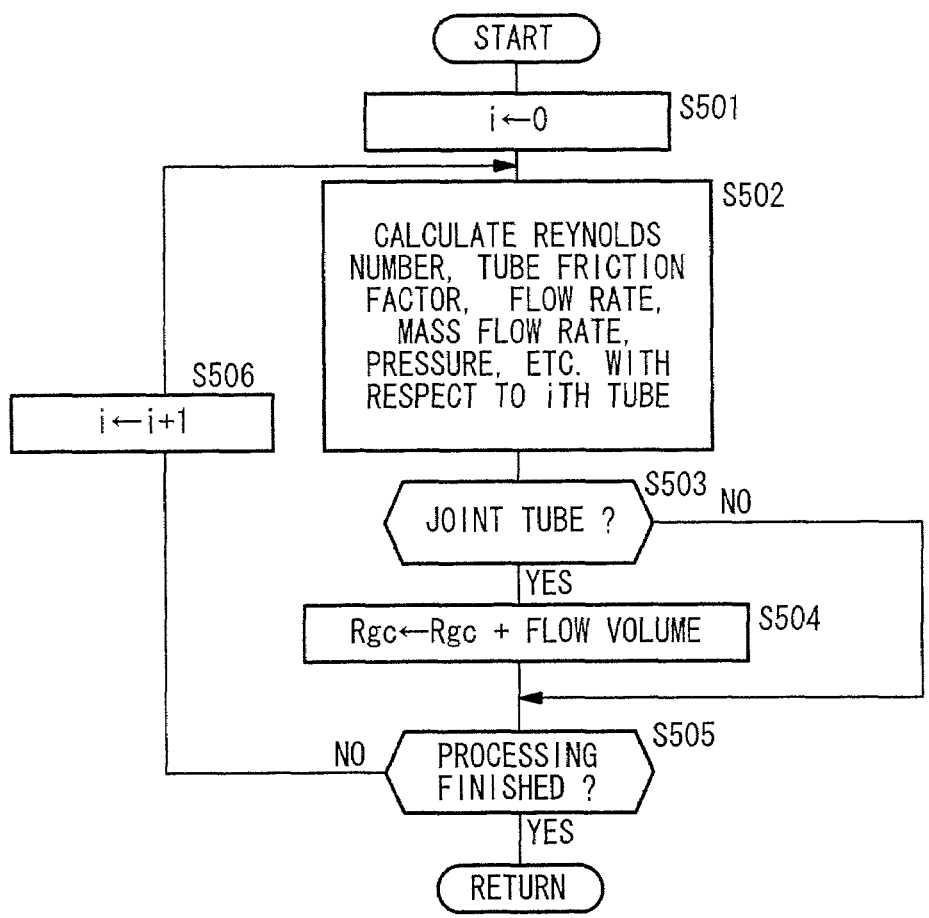
FIG. 41 is a flowchart of a piping calculation processing sequence of the characteristic calculating means of the branching and joining circuit processing means.

In particular, a branching and joining model 480 shown in FIG. 40 is used for calculating the branching and joining circuit 64. With the branching and joining model 480, in order to express a resistive effect due to a pressure loss across the branch, a simple fixed restriction is calculated rather than according to a process based on a generally used loss coefficient. For a cylinder operating, since air is considered to flow only between a joint and a branch, a simple model free of a flow between branching circuits is calculated.

A register Rgc is defined as a register for storing the sum of flow volumes at the branch of a branched tube, and a time counter Rt is defined as a counter for measuring a time.

In step S404, an initial value=0 is stored in the time counter Rt, thereby initializing the time counter Rt. Thereafter, a short time dt is set in step S405. Thereafter, in step S406, a cylinder calculating process is performed. In step S406, the cylinder pressure and the piston displacement of each pneumatic circuit 80 upon elapse of the short time dt are calculated.

Thereafter, in step S407, a tube calculating process is performed. In the tube calculating process, an initial value=0 is stored in an index register i, thereby initializing the index register i in step S501 shown in FIG. 41. Thereafter, in step S502, a Reynolds number, a tube friction factor, a flow rate, a mass flow rate, a pressure, etc. are calculated with respect to an ith tube.

Thereafter, in step S503, it is determined whether the ith tube is a joined pipe or not. If the ith tube is a joined pipe, then the flow volume at the branch of the tube is added in step S504. Specifically, the present flow volume at the branch is added to the value of the register Rgc, and the sum is stored in the register Rgc (Rgc←Rgc+the flow volume). The processing in step S504 is carried out by the flow volume adding means 284.

When the processing in step S504 is finished, or if it is judged that the ith tube is not a joined pipe in step S503, control goes to step S which determines whether the processing sequence has been ended for all the pipes or not based on whether the value of the index register i is greater than the number of divided tubes (the number of tubes) determined in step S402 in FIG. 38 or not. If the processing sequence has not been ended for all the tubes, then control goes to step S506 which updates the value of the index register i by +1. Then, the processing from step S502 is repeated for a next tube. The processing in step S505 is carried out by the repeating means 286.

If it is judged that the processing sequence has been ended for all the tubes in step S505, then the tube calculating process is put to an end.

Control then goes back to the routine shown in FIG. 38. In next step S408, the presently calculated value is redefined as the preceding value. Thereafter, in step S409, the presently defined preceding value is converted into a value according to a unit for output and display.

Then, in step S410, it is determined whether all the cylinders have reached a stroke end or not based on whether or not the measured time up to now (the value of the time counter Rt+the short time dt) has reached all the stroke times of the cylinders 78 of a plurality of pneumatic circuits 80 which make up the branching and joining circuit 64 to be calculated. The processing in step S410 is carried out by the repeating means 286.

If not all the cylinders 78 have reached the stroke end, then the short time dt is added to the present time (the value of the time counter) in step S411. Thereafter, control goes back to the processing from S405 for performing characteristic calculations at a next short time dt.

Figure 39:
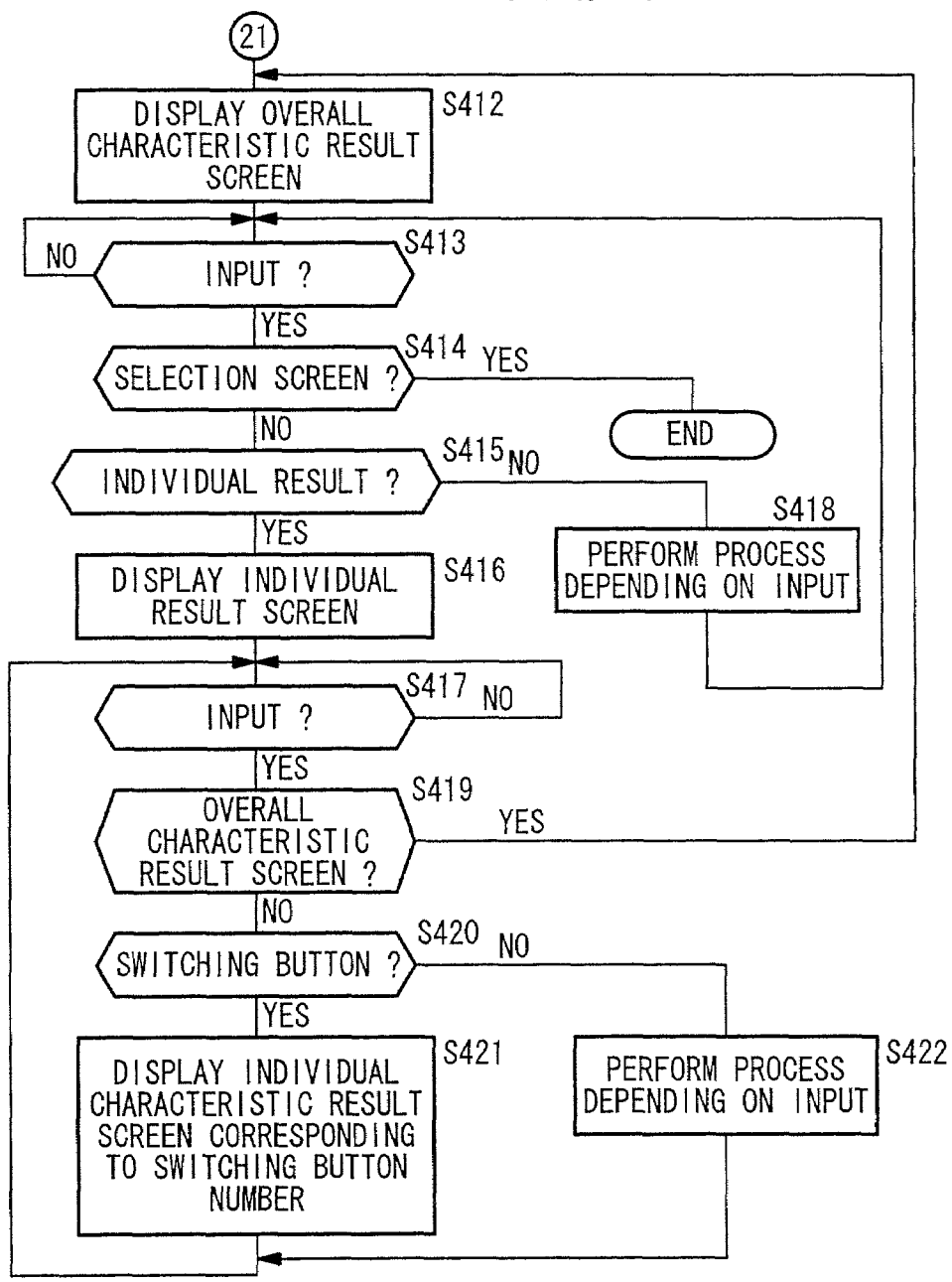
FIG. 39 is a flowchart (part 2) of the processing sequence of the characteristic calculating means of the branching and joining circuit processing means.

If it is judged that all the cylinders 78 have reached the stroke end in step S410, then control goes to step S412 shown in FIG. 39 in which the overall characteristic result screen displaying means 290 displays the overall characteristic result screen 288 shown in FIG. 28. At this time, the calculation result displaying means 270 displays numerical values of individual characteristics (a full stroke time, a piston startup time, a 90% output time, a mean velocity, a maximum velocity, a stroke end velocity, a maximum acceleration, a maximum pressure, etc.) of a plurality of pneumatic circuits 80 that make up the selected branching and joining circuit 64, and also displays numerical values of overall characteristics (an air consumption per cycle, a required air flow rate, etc.) of the selected branching and joining circuit 64.

Thereafter, in step S413, an input from the user is awaited. When there is an input from the user, control goes to step S414 which determines whether it is a request for displaying the branching and joining circuit selection screen 261 (see FIG. 25) or not based on whether a return button 482 on the overall characteristic result screen 288 shown in FIG. 28 is selected or not. If it is not a request for displaying the branching and joining circuit selection screen 261, then control goes to step S415 which determines whether it is a request for displaying the individual characteristic result screen 292 (see FIG. 29) or not based on whether the individual result button 342 is selected or not.

If there is a request for displaying the individual characteristic result screen 292, then control goes to step S416 in which the individual characteristic result screen displaying means 294 displays the individual characteristic result screen 292 shown in FIG. 29. Then, an input from the user is awaited in step S417.

While the overall characteristic result screen 288 is being displayed in step S415, if there is not a request for displaying the individual characteristic result screen 292, then a process depending on the input is performed in step S418. Specifically, if the print comment input button 364 is selected, then an input screen is displayed for entering comments to be printed on a lower portion of a printed sheet. If the print button 362 is selected, then each result and usage conditions are printed by a printer, not shown. Thereafter, control goes to step S413 in which a next input is awaited.

If there is an input in step S417, then control goes to next step S419 which determines whether it is a request for displaying the overall characteristic result screen 288 (see FIG. 28) or not based on whether a return button 484 (see FIG. 29) is selected or not. If it is not a request for displaying the overall characteristic result screen 288, then control goes to step S420 which determines whether the present input is a selecting action on the switching button 366 for switching between individual characteristic result screens or not. If it is a selecting action on the switching button 366 for switching between individual characteristic result screens, then control goes to step S421 in which the individual characteristic result screen displaying means 294 displays an individual characteristic result screen 292 that corresponds to the presently selected number. Thereafter, control goes back to step S417 in which a next input is awaited.

If it is judged in step S420 that the present input is not a selecting action on the switching button 366 for switching between individual characteristic result screens, then a process depending on the input is performed in step S422. Specifically, if the cushion calculation button 128 is selected, then control goes to the process of the cushion calculation processing means 106 of the standard circuit selection processing means 60. If the moisture condensation calculation button 130 is selected, then control goes to the process of the moisture condensation calculation processing means 108. If the print comment input button 364 is selected, then an input screen is displayed for entering comments to be printed on a lower portion of a printed sheet. If the print button 362 is selected, then each result and usage conditions are printed by a printer, not shown. Thereafter, control goes to step S417 in which a next input is awaited. If the shock absorber selection button 140 is selected, then control goes to the process of the shock absorber selection processing means 72 (see FIG. 3).

If it is judged in step S419 that the input is a request for displaying the overall characteristic result screen 288, then control goes back to the processing from step S412. If it is judged in step S414 that the input is a request for displaying the branching and joining circuit selection screen 261 (see FIG. 25), then the processing sequence of the characteristic calculating means 266 is put to an end.

Control then goes back to the main routine shown in FIG. 36. In next step S314, it is determined whether there is an end request for the branching and joining circuit processing means 66 or not. If there is not an end request, then control goes back to the processing from step S301. If there is an end request, then the processing sequence of the branching and joining circuit processing means 66 is put to an end.

A processing sequence of the manifold circuit processing means 70 will be described below with reference to FIGS. 42 through 47.

Figure 42:
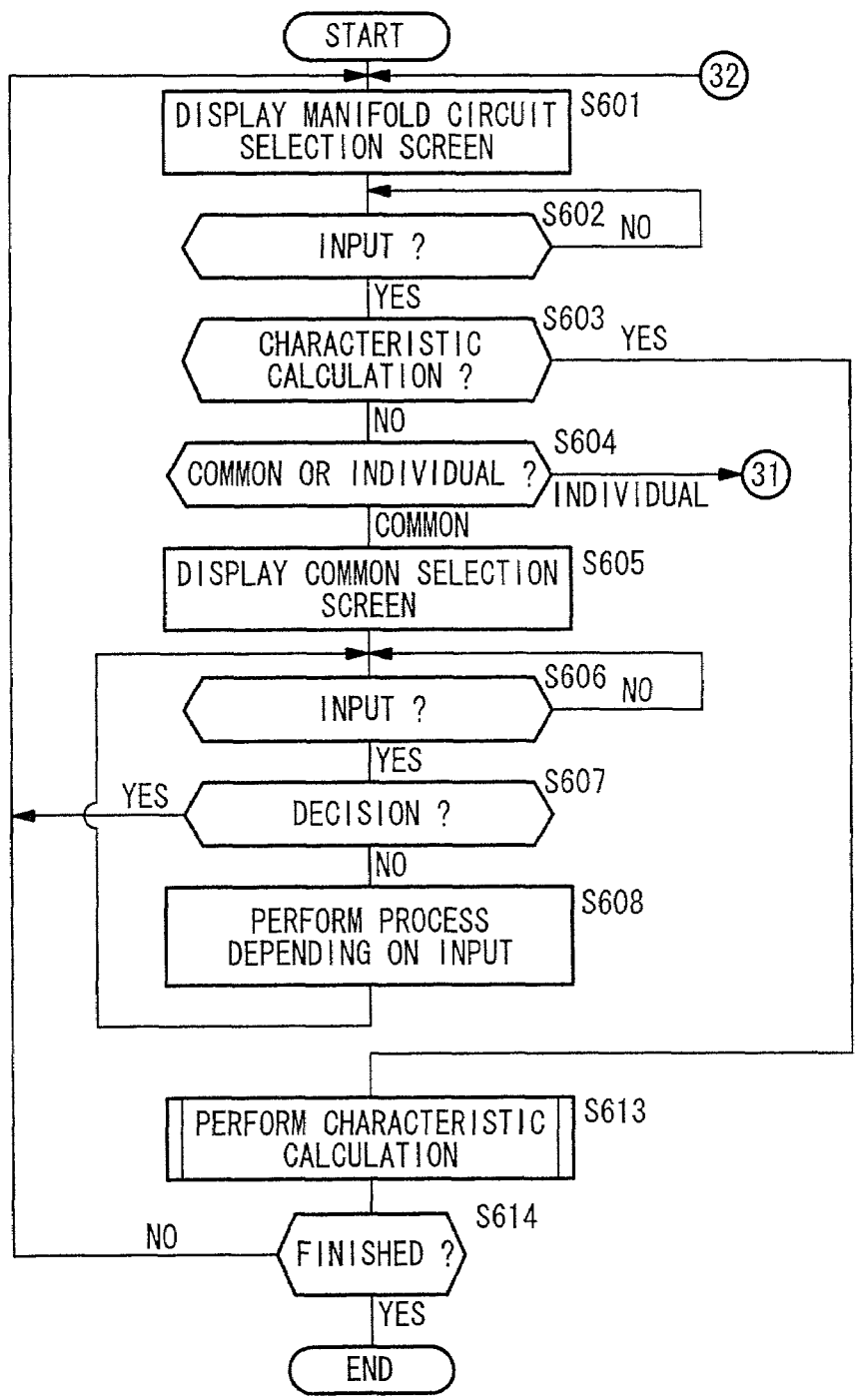
FIG. 42 is a flowchart (part 1) of a processing sequence of the manifold circuit processing means.

In step S601 shown in FIG. 42, the selection screen displaying means 372 displays the manifold circuit selection screen 370 shown in FIG. 31 on the screen of the display unit 28. Thereafter, an input from the user is awaited in step S602. When there is an input from the user, control goes to step S603 which determines whether there is a characteristic calculation request or not based on whether the characteristic calculation start button 422 is selected or not. If there is not a characteristic calculation request, then control goes to step S604 which determines whether there is a common item request or an individual item request based on whether the common button 412 or the individual button 414 is selected. If the common button 412 is selected, then control goes to step S605 in which the common selection screen displaying means 384 displays the common selection screen 382 shown in FIG. 32 on the screen of the display unit 28. Thereafter, an input from the user is awaited in step S606. When there is an input from the user, control goes to step S607 which determines whether there is a decision input or not based on whether there is an input indicative of OK or not. If there is not an input indicative of OK, then control goes to step S608 which performs a process depending on the input from the user. For example, if a product number is entered, then the product number is displayed in the product number input area 428. If an operating condition is entered, then an entered numerical value is displayed in the operating condition input area 430. On the common selection screen 382, a manifold piping type is also selected.

When the processing in step S608 is finished, control goes back to step S606, waiting for a next input. If the switching button 432 is selected in step S606, then the display unit 28 displays an individual selection screen 388 (see FIG. 33) corresponding to the number of the switching button 432, and control goes to the processing from step S610.

If it is judged that there is a decision input in step S607, then control goes back to the processing from step S601 which displays the manifold circuit selection screen 370 (see FIG. 31), after which a next input is awaited.

Figure 43:
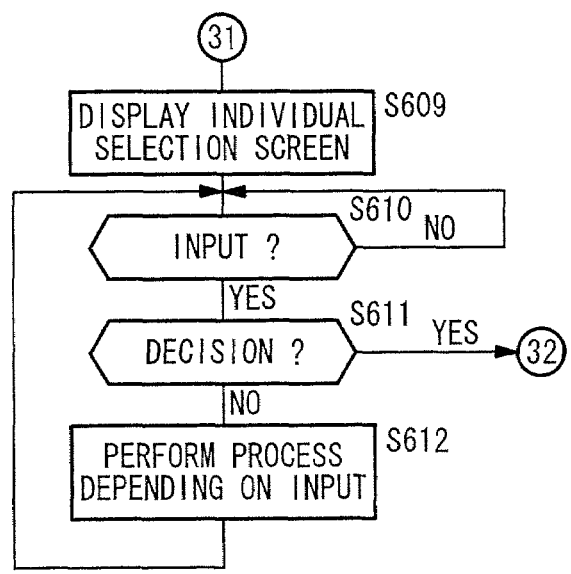
FIG. 43 is a flowchart (part 2) of the processing sequence of the manifold circuit processing means.

If it is judged that there is an individual item request in step S604, then control goes to step S609 shown in FIG. 43 in which the individual selection screen displaying means 389 displays the individual selection screen 388 shown in FIG. 33 on the screen of the display unit 28. Thereafter, an input from the user is awaited in step S610. When there is an input from the user, control goes to step S611 which determines whether there is a decision input or not. If there is not a decision input, then control goes to step S612 which performs a process depending on the input from the user. For example, if a product number is entered, then a circuit image of a device corresponding to the product number is displayed in the circuit setting area 434, and the product number is displayed in the product number input area 438. If an operating condition is entered, then an entered numerical value is displayed in the operating condition input area 440. If a load is entered, then an entered numerical value is displayed in the load input area 442. If the switching button 444 is selected in step S610, then the display unit 28 displays an individual selection screen 388 corresponding to the number of the switching button 444. Thereafter, control goes back to step S610 to wait for a next input.

If it is judged that there is a decision input in step S611, control goes back to the processing from step S601 shown in FIG. 42 which displays the manifold circuit selection screen 370 (see FIG. 31), after which a next input is awaited.

If it is judged that there is a characteristic calculation request in step S603 shown in FIG. 42, then control goes to step S613 in which the characteristic calculating means 376 performs its processing sequence.

Figure 44:
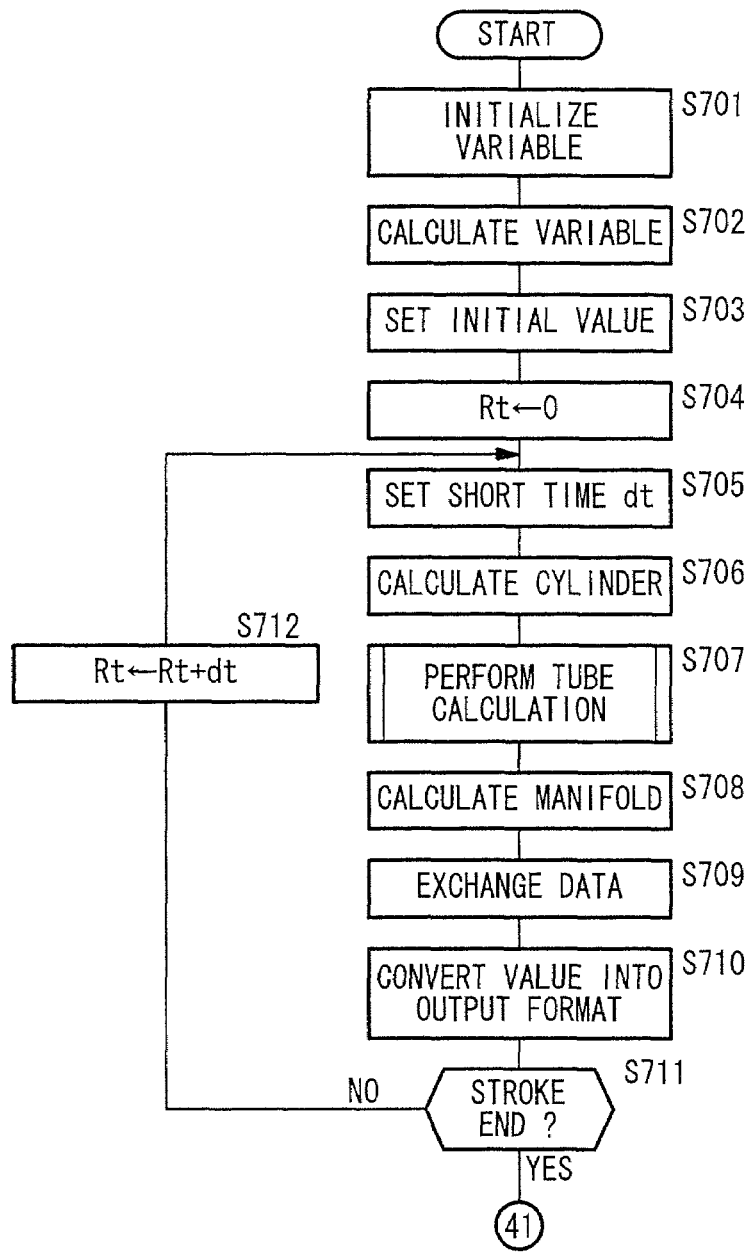
FIG. 44 is a flowchart (part 1) of a processing sequence of a characteristic calculating means of the manifold circuit processing means.

In the processing sequence of the characteristic calculating means 376, the characteristic calculating means 376 initializes a calculation result variable such as the full stroke time and a calculation control variable in step S701 shown in FIG. 44. Thereafter, the characteristic calculating means 376 calculates variables required for calculations with respect to devices including a solenoid valve, a cylinder, a tube, a manifold, etc. in step S702. For example, the characteristic calculating means 376 calculates the sonic conductance of a solenoid valve, the piston area of a cylinder, a load mass, the number of divided tubes, etc.

Thereafter, in step S703, an initial value is set as a change (e.g., a cylinder pressure, a piston displacement, the sum of flow volumes on the side of the air supply chamber of the solenoid valve, the sum of flow volumes on the side of the air discharge chamber of the solenoid valve, or the like) used for repetitive calculations. For the characteristic calculations, a differential process for calculating a new state from a preceding state (including an initial state) after elapse of a certain time interval dt is used. Each time a calculation is made, a new calculated value is redefined as a preceding value, which will be used in a next calculation.

Based on the product numbers of a cylinder 78, a solenoid valve 82 (including a discharge processing device), a flow control device, and a tube which have been selected, the circuit configuration on the circuit configuration setting screen, and the entered operating conditions, various characteristic values and dynamic characteristics of each pneumatic circuit 80 and the manifold circuit 68 are calculated according to the differential process. As with the characteristic calculation processing means 104 of the standard circuit selection processing means 60 described above, the characteristic calculating means 376 calculates numerical values according to simultaneous basic equations for the cylinder, the solenoid valve, the flow control device, the tube, the fittings, etc. as shown in FIGS. 16A through 16C and FIGS. 20A through 20D.

Figure 46:
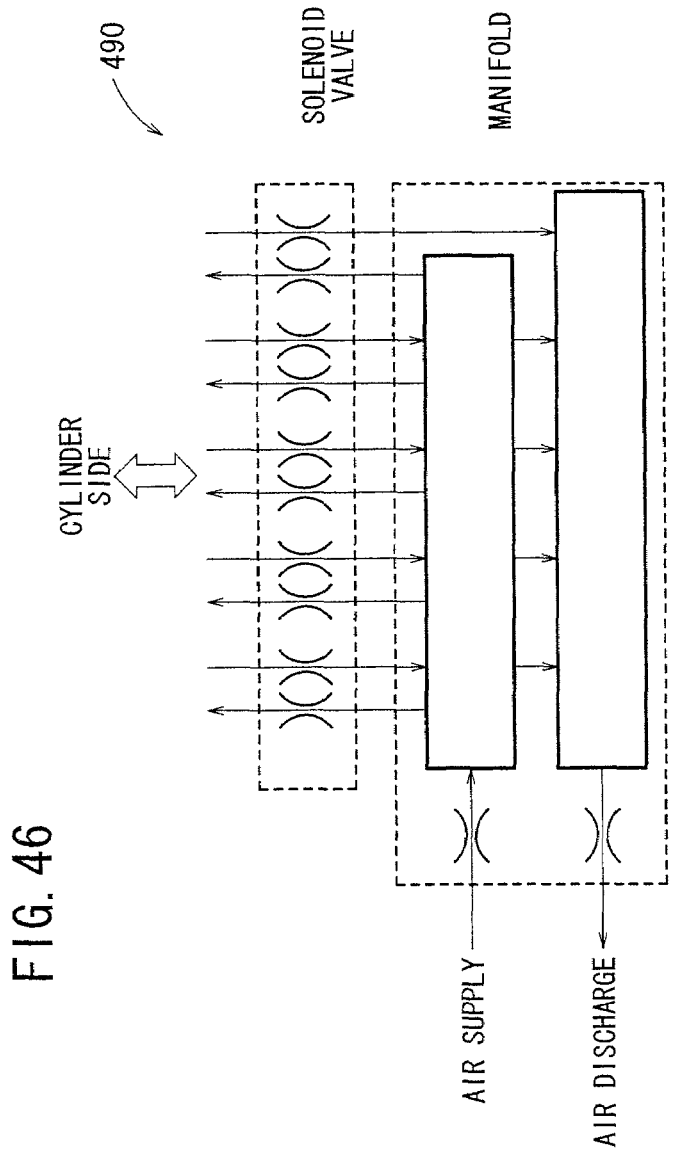
FIG. 46 is a diagram showing a manifold model used in the calculations for the manifold circuit.
Figure 47:
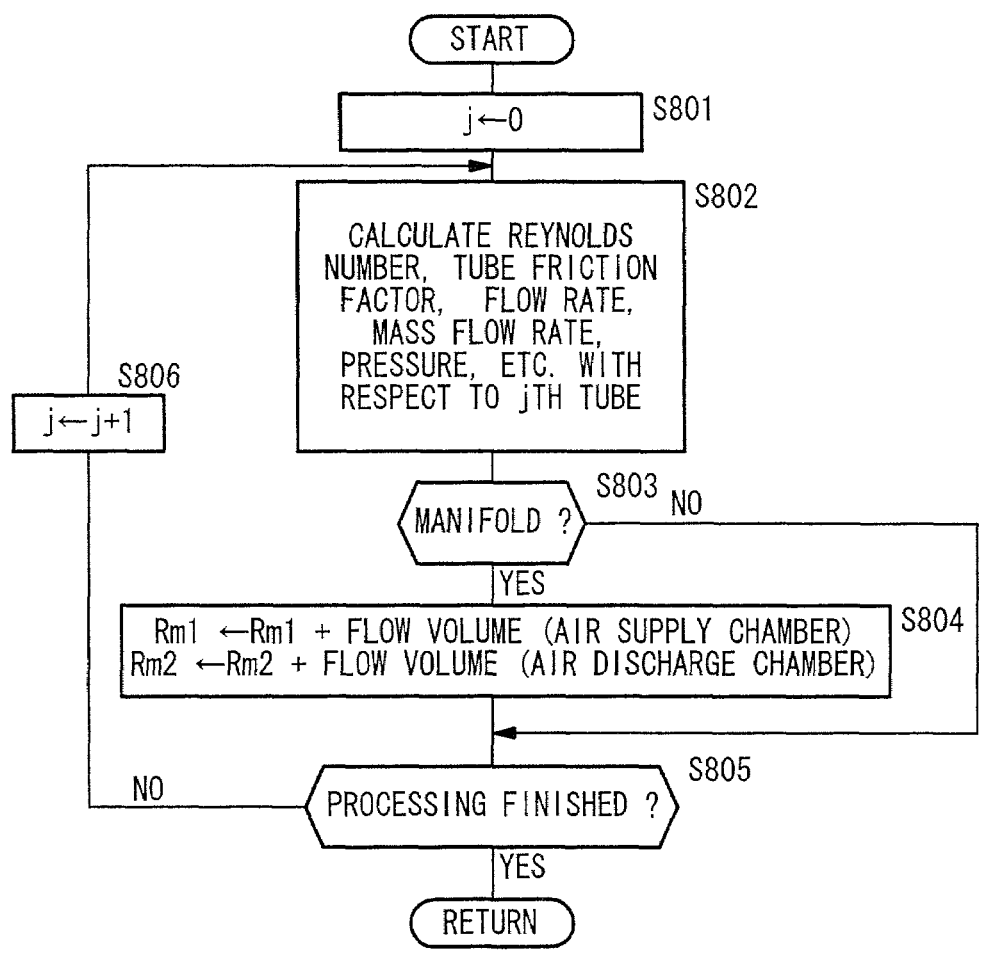
FIG. 47 is a flowchart of a piping calculation processing sequence of the characteristic calculating means of the manifold circuit processing means.

In particular, a manifold model 490 shown in FIG. 46 is used for calculating the manifold circuit 68. With the manifold model 490, it is assumed that the pressure distributions in an air supply chamber and an air discharge chamber of the manifold 92 are uniform, and the manifold circuit 68 is calculated as a simple tank charging/discharging model based on the air supply chamber and the air discharge chamber.

A register Rm1 is defined as a register for storing the sum of flow volumes in the air supply chamber of the solenoid valve, a register Rm2 is defined as a register for storing the sum of flow volumes in the air discharge chamber of the solenoid valve, and a time counter Rt is defined as a counter for measuring a time.

In step S704, an initial value=0 is stored in the time counter Rt, thereby initializing the time counter Rt. Thereafter, a short time dt is set in step S705. Thereafter, in step S706, a cylinder calculating process is performed. In step S706, the cylinder pressure and the piston displacement of each pneumatic circuit 80 upon elapse of the short time dt are calculated.

Thereafter, in step S707, a tube calculating process is performed. In the tube calculating process, an initial value=0 is stored in an index register j, thereby initializing the index register j in step S801 shown in FIG. 47. Thereafter, in step S802, a Reynolds number, a tube friction factor, a flow rate, a mass flow rate, and a pressure are calculated with respect to a jth tube.

Thereafter, in step S803, it is determined whether the device connected to the jth tube on the solenoid valve side is the manifold 92 or not. If it is the manifold 92, then the flow volume in the tube on the side of the air supply chamber of the solenoid valve is added, and the flow volume in the tube on the side of the air discharge chamber is added in step S804. Specifically, the present flow volume on the side of the air supply chamber of the solenoid valve is added to the value of the register Rm1, and the sum is stored in the register Rm1 (Rm1←Rm1+the flow volume on the side of the air supply chamber). The present flow volume on the side of the air discharge chamber of the solenoid valve is added to the value of the register Rm2, and the sum is stored in the register Rm2 (Rm2←Rm2+the flow volume on the side of the air discharge chamber). The processing in step S804 is carried out by the flow volume adding means 392.

When the processing in step S804 is finished, or if it is judged that the device connected to the jth tube on the solenoid valve side is not the manifold 92, control goes to step S805 which determines whether the processing sequence has been ended for all the pipes or not based on whether the value of the index register j is greater than the number of divided tubes (the number of tubes) determined in step S702 in FIG. 44 or not. If the processing sequence has not been ended for all the tubes, then control goes to step S806 which updates the value of the index register j by +1. Then, the processing from step S802 is repeated for a next tube. The processing in step S805 is carried out by the repeating means 396.

If it is judged that the processing sequence has been ended for all the tubes in step S805, then the tube calculating process is put to an end.

Control then goes back to the routine shown in FIG. 44. In next step S708, a manifold calculating process is performed. In the manifold calculating process, dynamic characteristics of the manifold 92 are calculated based on the sum of flow volumes on the side of the air supply chamber and the sum of flow volumes on the side of the air discharge chamber.

Thereafter, in step S709, the presently calculated value is redefined as the preceding value. Thereafter, in step S710, the presently defined preceding value is converted into a value according to a unit for output and display.

Then, in step S711, it is determined whether all the cylinders have reached a stroke end or not based on whether or not the measured time up to now (the value of the time counter Rt+the short time dt) has reached all the stroke times of the cylinders 78 of a plurality of pneumatic circuits 80 which make up the manifold circuit 68 to be calculated. The processing in step S711 is carried out by the repeating means 396.

If not all the cylinders have reached the stroke end, then the short time dt is added to the present time (the value of the time counter Rt) in step S712. Thereafter, control goes back to the processing from S705 for performing characteristic calculations at a next short time dt.

Figure 45:
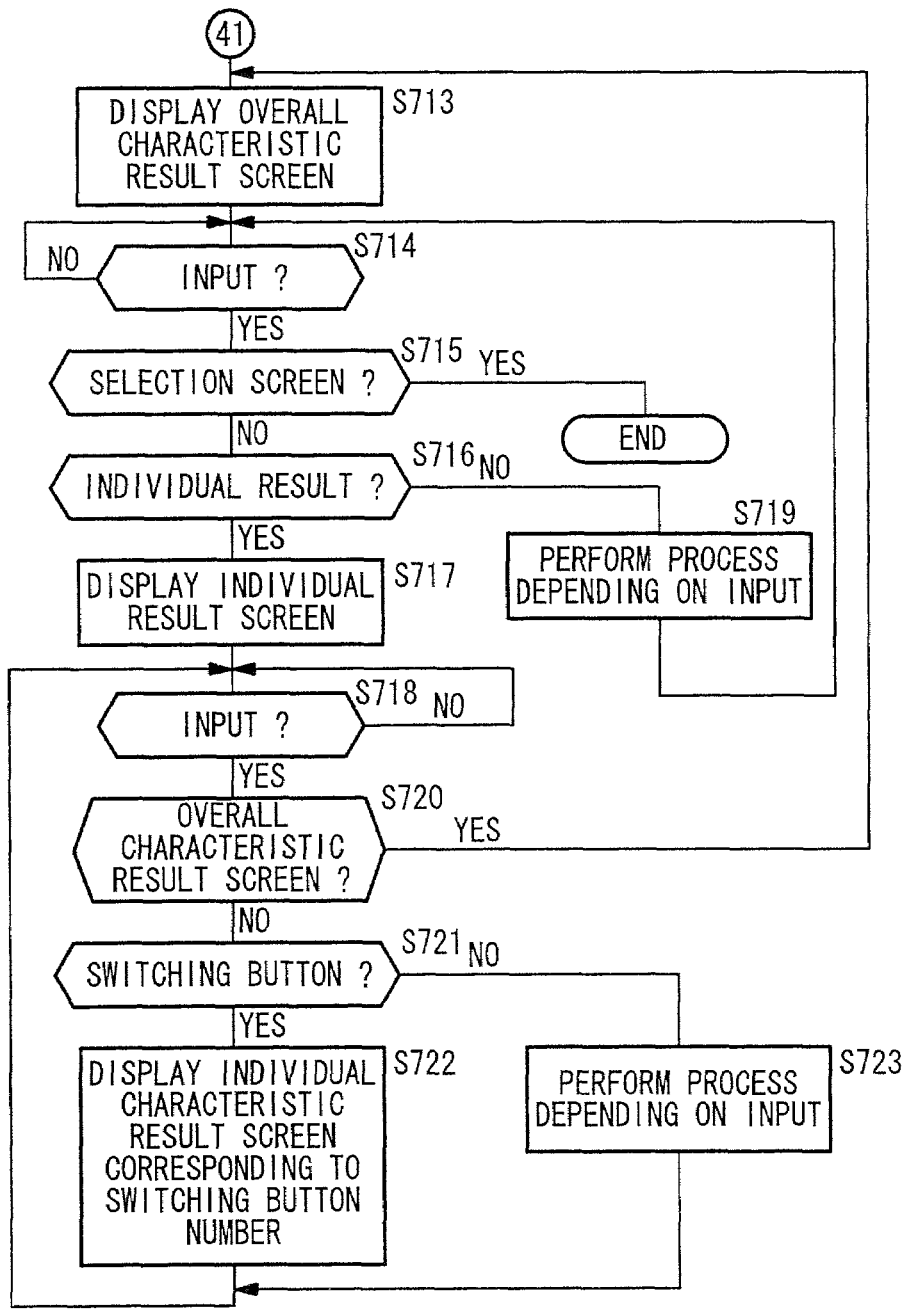
FIG. 45 is a flowchart (part 2) of the processing sequence of a characteristic calculating means of the manifold circuit processing means.

If it is judged that all the cylinders 78 have reached the stroke end in step S711, then control goes to step S713 shown in FIG. 45 in which the overall characteristic result screen displaying means 400 displays the overall characteristic result screen 398 shown in FIG. 34. At this time, the calculation result displaying means 380 displays numerical values of overall characteristics (an air consumption per cycle, a required air flow rate, etc.) of the selected branching and joining circuit 64.

Thereafter, in step S714, an input from the user is awaited. When there is an input from the user, control goes to step S715 which determines whether it is a request for displaying the manifold circuit selection screen 370 (see FIG. 31) or not based on whether a return button 492 on the overall characteristic result screen 398 shown in FIG. 34 is selected or not, for example. If it is not a request for displaying the manifold circuit selection screen 370, then control goes to step S716 which determines whether the present input is a request for displaying the individual characteristic result screen 402 (see FIG. 35) or not based on whether the individual result button 450 is selected or not.

If there is a request for displaying the individual characteristic result screen 402, then control goes to step S717 in which the individual result screen displaying means 404 displays the individual characteristic result screen 402 shown in FIG. 35. Then, an input from the user is awaited in step S718.

While the overall characteristic result screen 398 is being displayed in step S716, if there is not a request for displaying the individual characteristic result screen 402, then a process depending on the input is performed in step S719. Specifically, if the print comment input button 452 is selected, then an input screen is displayed for entering comments to be printed on a lower portion of a printed sheet. If the print button 454 is selected, then each result and usage conditions are printed by a printer, not shown. Thereafter, control goes to step S714 in which a next input is awaited.

If there is an input in step S718, then control goes to next step S720 which determines whether it is a request for displaying the overall characteristic result screen 398 (see FIG. 34) or not based on whether a return button 494 (see FIG. 35) is selected or not, for example. If it is not a request for displaying the overall characteristic result screen 398, then control goes to step S721 which determines whether the present input is a selecting action on the switching button 474 for switching between individual characteristic result screens or not. If it is a selecting action on the switching button 474 for switching between individual characteristic result screens, then control goes to step S722 in which the individual result screen displaying means 404 displays an individual characteristic result screen 402 that corresponds to the presently selected number. Thereafter, control goes back to step S718 in which a next input is awaited.

If it is judged in step S721 that the present input is not a selecting action on the switching button 474 for switching between individual characteristic result screens, then in step S723, a process depending on the input is performed. Specifically, if the cushion calculation button 128 is selected, then control goes to the process of the cushion calculation processing means 106 of the standard circuit selection processing means 60. If the moisture condensation calculation button 130 is selected, then control goes to the process of the moisture condensation calculation processing means 108. If the print comment input button 472 is selected, then an input screen is displayed for entering comments to be printed on a lower portion of a printed sheet. If the print button 470 is selected, then each result and usage conditions are printed by a printer, not shown. Thereafter, control goes to step S718 in which a next input is awaited. If the shock absorber selection button 140 is selected, then control goes to the process of the shock absorber selection processing means 72 (see FIG. 3).

If it is judged in step S720 that the input is a request for displaying the overall characteristic result screen 398, then control goes back to the processing from step S713. If it is judged in step S715 that the input is a request for displaying the manifold circuit selection screen 370 (see FIG. 31), then the processing sequence of the characteristic calculating means 376 is put to an end.

Control then goes back to the main routine shown in FIG. 42. In next step S614, it is determined whether there is an end request for the manifold circuit processing means 70 or not. If there is not an end request, then control goes back to the processing from step S601. If there is an end request, then the processing sequence of the manifold circuit processing means 70 is put to an end.

The shock absorber selection processing means 72 will be described below with reference to FIGS. 48 through 51. The shock absorber selection processing means 72 has been developed for the purpose of automatically selecting a shock absorber. The shock absorber selection processing means 72 has main functions including a function to select shock absorber product numbers and a function to calculate a particular moment.

According to the function to select shock absorber product numbers, when a series name of shock absorbers, an impact style, and usage conditions are entered, the product numbers of shock absorbers which satisfy the absorption energy are automatically selected from the series, and a plurality of candidate devices are displayed in a sequence of sizes.

According to the function to calculate a particular moment, when a particular load type is selected and a mass and dimensions are entered, an inertial moment of the load is calculated.

The shock absorber selection processing means 72 performs an automatic optimizing process for calculating an absorption energy which is represented by the sum of a kinetic energy and a thrust energy of the load, and selecting a device of minimum size which satisfies the absorption energy.

The shock absorber selection processing means 72 can handle a wide variety of impact styles as combinations of motion types including linear and rotational impacts in horizontal, upward, and downward directions and at any desired angles and various external thrust types including cylinder and motor drive modes.

Figure 48:
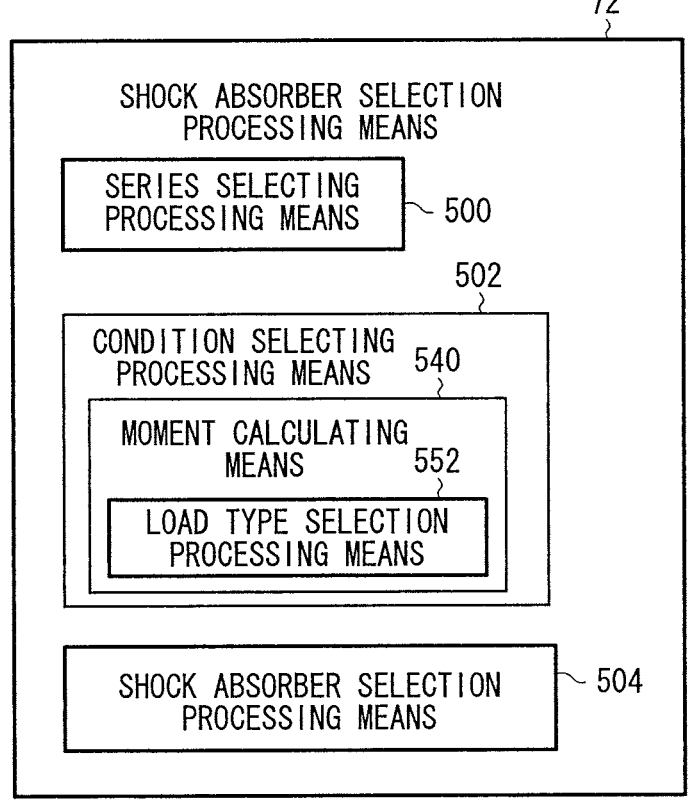
FIG. 48 is a functional block diagram of a shock absorber selection processing means.

As shown in FIG. 48, the shock absorber selection processing means 72 has a series setting processing means 500 for setting a series of shock absorbers based on input data from the coordinate input unit 24 or the like, a condition setting processing means 502 for setting at least an impact style and usage conditions based on input data from the coordinate input unit 24 or the like, and a shock absorber selection processing means 504 for selecting a shock absorber of optimum size from the set series of shock absorbers.

The condition setting processing means 502 has a function to set conditions with input data from the coordinate input unit 24 and also automatically set conditions (e.g., the product number, the load mass, the friction factor, the supply pressure, etc. of a cylinder) required to select a shock absorber, among the usage conditions set by the standard circuit selection processing means 60.

Specifically, the shock absorber selection processing means 72 is activated when the item of shock absorber selection in the menu screen 52 shown in FIG. 2 is clicked and also when the shock absorber selection button 140 in the device selection result screen 120 shown in FIG. 8, the cushion calculation screen 230 shown in FIG. 9, the moisture condensation calculation screen 240 shown in FIG. 10, the characteristic calculation result screen 252 shown in FIG. 23, the individual characteristic result screen 292 shown in FIG. 29, and the individual characteristic result screen 402 shown in FIG. 35 is clicked.

The shock absorber selection processing means 72 is linked with the standard circuit selection processing means 60, the branching and joining circuit processing means 66, and the manifold circuit processing means 70, and selects a shock absorber under impact conditions based on the results of calculations obtained from the device selection processing means 102 through the characteristic calculation processing means 104, or the results of calculations obtained from the independent characteristic calculation processing means 62, or the results of calculations obtained from the branching and joining circuit processing means 66 through the characteristic calculating means 266, or the results of calculations obtained from the manifold circuit processing means 70 through the characteristic calculating means 376.

Figure 49:
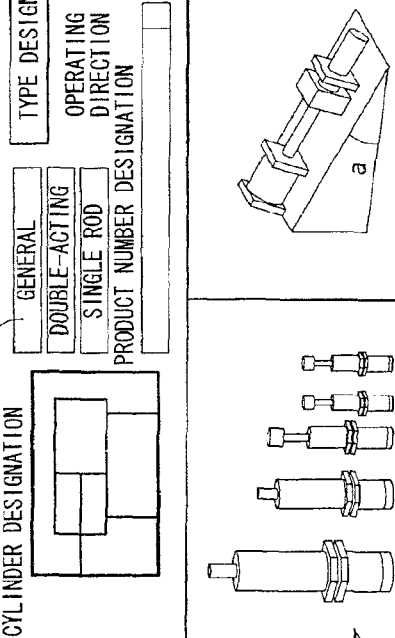
FIG. 49 is a diagram showing a displayed example of a first shock absorber selection input screen.
Figure 50:
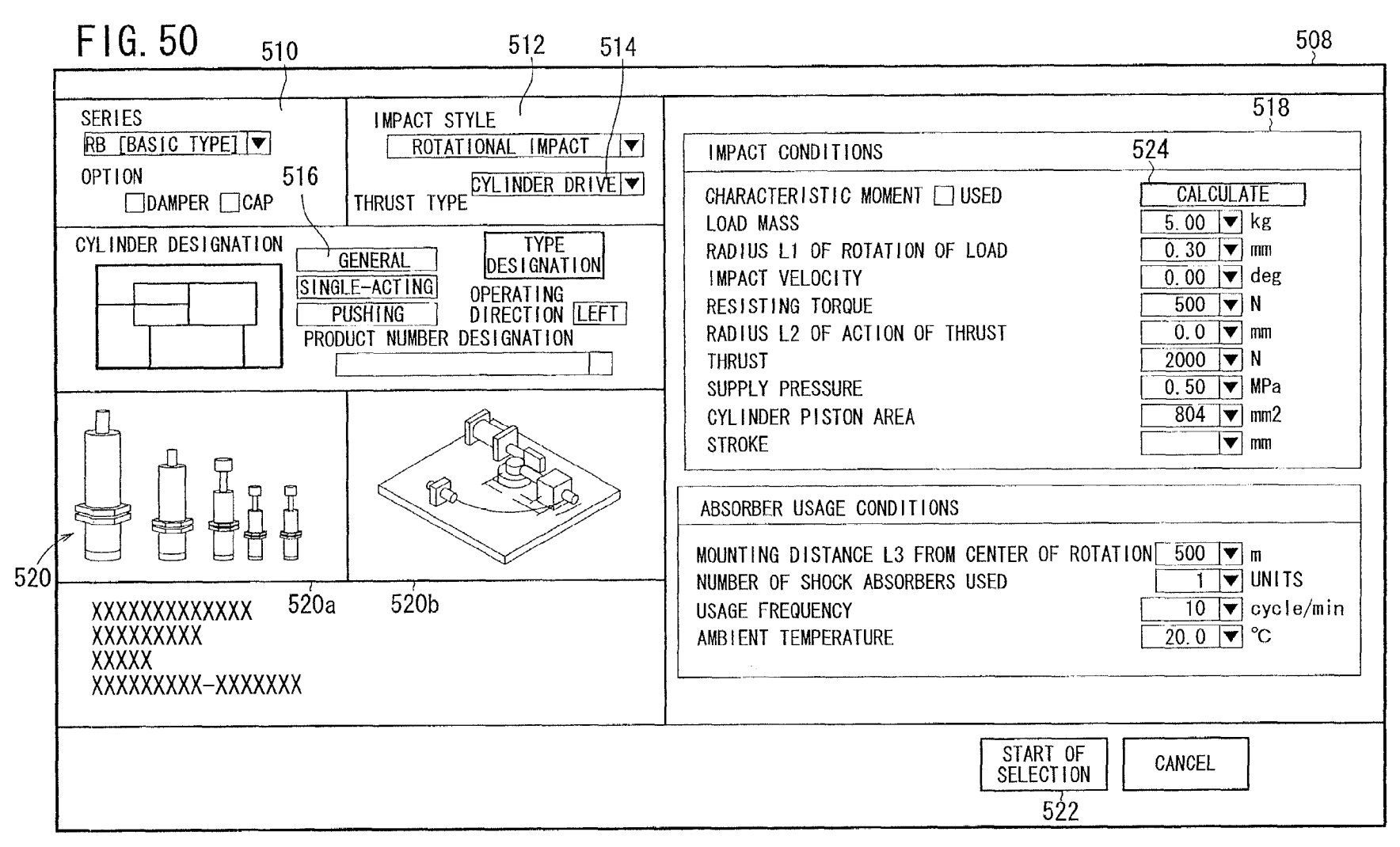

The shock absorber selection processing means 72 displays first and second shock absorber selection input screens 506, 508 (see FIGS. 49 and 50). As shown in FIG. 49, the first shock absorber selection input screen 506 is a screen in relation to a linear impact, and has a series selection display area 510 for displaying a list of series for selecting a shock absorber series, an impact style display area 512 for selecting a style in which a load impinges on a shock absorber, a thrust display area 514 for selecting a thrust type acting on a shock absorber, a cylinder product number display area 516 for selecting a type and product number of a cylinder if a thrust type is a cylinder operating mode, a condition input area 518 for entering impact conditions and shock absorber usage conditions, an image display area 520 for displaying an image of a selected shock absorber, and a selection start button (icon) 522 for requesting a start of the selection of a shock absorber.

The image display area 520 includes a first screen 520a for displaying the images of the appearances of selected shock absorbers, and a second screen 520b for displaying an impact image in animation. Since an impact image is displayed in animation for each impact style, the user can easily recognize the impact image, finding it easy to enter items.

Of the items in the condition input area 518, an impact velocity represents a piston velocity at the time the piston (rod) of the cylinder impinges on an external stopper at a stroke end or any desired position, and a resisting force represents the sum of external forces other than a gravitational component of the load mass acting in the direction of operation of the piston, and a frictional force.

The second shock absorber selection input screen 508 is a screen in relation to a rotational impact. As shown in FIG. 50, while the second shock absorber selection input screen 508 is substantially similar to the first shock absorber selection input screen 506 (see FIG. 49) described above, the second shock absorber selection input screen 508 differs from the first shock absorber selection input screen 506 in that the condition input area 518 additionally includes a calculation request button (icon) 524 for requesting moment calculations.

Of the items in the condition input area 518, a resisting torque represents the sum of torques other than a gravitational component torque of the load mass acting in the direction of rotation of a rotary actuator, a motor, etc., and a frictional torque.

The shock absorber selection processing means 72 also displays a shock absorber selection result screen 526 shown in FIG. 51. As shown in FIG. 51, the shock absorber selection result screen 526 has a calculation result display area 528 for displaying calculation results including an absorption energy, an impact object equivalent mass, etc., a selection result display area 530 for displaying a list of product numbers of selected shock absorbers according to a sequence of maximum absorption energies, and a specification display area 532 for displaying a mounting dimension diagram and major specifications of a shock absorber selected from the list of selection results.

The shock absorber selection result screen 526 also has icons simulating a plurality of operating buttons in addition to the above display areas 528, 530. These icons include a print button 534 for requesting the printing of selection results, calculation results, and entered conditions, a print comment input button 536 for shifting to an input screen for entering comments to be printed on a lower portion of a printed sheet, and a save button 538 for requesting the saving of the selection results, the calculation results, and the entered conditions (on a hard disk, or an optical disk such as a CD-R or a DVD-RAM, etc.).

As shown in FIG. 48, the condition setting processing means 502 has a moment calculating means 540 for calculating an inertial moment based on input data from the coordinate input unit or the like if a set impact style is a rotational impact mode. The moment calculating means 540 is activated when the calculation request button 524 in the second shock absorber selection input screen 508 shown in FIG. 50 is selected.

As shown in FIG. 48, the moment calculating means 540 further has a load type selection processing means 552 for selecting the shape of a load type and a rotational axis based on input data from the coordinate input unit 24 or the like.

A processing sequence of the shock absorber selection processing means 72 will briefly be described below. The shock absorber selection processing means 72 displays the shock absorber selection input screen 506 or 508 on the display screen of the display unit 28. Thereafter, the condition setting processing means 502 performs its processing sequence, particularly, a condition input processing sequence. In the condition input processing sequence, the condition setting processing means 502 selects a shock absorber series based on input data from the coordinate input unit 24 or the like, and then selects the type of an impact style and the type of a thrust. Information about the types of impact styles and thrust types that can be selected, the relationship between calculation formulas, and details of the calculation formulas depending on the types of impact styles, mounting types and the thrust types is registered as a shock absorber information table on a hard disk, for example. In a calculation process for selecting a shock absorber, as described later on, the impact style, the mounting type, and the thrust type, for example, which have been entered are used as indexes to read necessary calculation formulas for use in calculations.

If a cylinder operating mode has been selected as the thrust type, then the condition setting processing means 502 selects the type of a cylinder and the product number thereof based on input data from the coordinate input unit 24 or the like.

Thereafter, the condition setting processing means 502 performs a numerical value input processing sequence. In the numerical value input processing sequence, the condition setting processing means 502 maintains input items depending on the impact style and the thrust type which have been selected in the condition input processing sequence, in association with the entered numerical values.

If input data does not represent numerical data, but a moment calculation request, then the moment calculating means 540 performs its processing sequence. In the processing sequence of the moment calculating means 540, if input data represents a load type change request, then the shape (classification) of a load type and a rotational axis are selected based on input data from the coordinate input unit 24 or the like.

Calculation formulas are prepared in association with the shapes of load types. Information representing these details is registered as a moment information table on a hard disk, for example. In a moment calculation process, as described later on, the shape of a load type and the type of a rotational axis, for example, which have been entered are used as indexes to read necessary calculation formulas for use in calculations. Thereafter, moment calculations are performed based on the entered numerical values and the corresponding calculation formulas.

In the processing sequence of the shock absorber selection processing means 504, the shock absorber selection processing means 504 calculates an impact velocity. Then, the shock absorber selection processing means 504 temporarily selects a minimum-size shock absorber in the selected series.

The shock absorber selection processing means 504 calculates an absorbable impact object equivalent mass Me1 of the temporarily selected shock absorber. To calculate the absorbable impact object equivalent mass Me1, the shock absorber selection processing means 504 reads parameters for calculating the absorbable impact object equivalent mass Me1 of the temporarily selected shock absorber from the sixth database DB6.

Thereafter, the shock absorber selection processing means 504 calculates a kinetic energy E1 based on various conditions that have been entered. The shock absorber selection processing means 504 calculates a thrust energy E2 based on various conditions that have been entered. Thereafter, the shock absorber selection processing means 504 adds the calculated kinetic energy E1 and the calculated thrust energy E2 into an absorption energy E.

The shock absorber selection processing means 504 calculates an actual impact object equivalent mass Me2 from the calculated absorption energy and various conditions that have been entered according to the following equation:

$$Me2 = 2 \times E / (V2 \times N)$$

where V represents an impact velocity and N the number of shock absorbers that are used.

Thereafter, the shock absorber selection processing means 504 determines whether the temporarily selected shock absorber matches the application based on whether the absorbable impact object equivalent mass Me1 of the temporarily selected shock absorber is greater than the actual impact object equivalent mass Me2.

If the absorbable impact object equivalent mass Me1 is equal to or smaller than the actual impact object equivalent mass Me2, indicating that the temporarily selected shock absorber does not match the application, then the shock absorber selection processing means 504 searches for a next greater shock absorber in the selected series, and thereafter determines whether a corresponding shock absorber exists or not. If no such a shock absorber exists in the selected series, then the shock absorber selection processing means 504 displays an error message, e.g., "NO CORRESPONDING DEVICE EXISTS IN SELECTED SERIES", on the display screen of the display unit 28. If a next greater shock absorber exists in the selected series, then the shock absorber selection processing means 504 temporarily selects the shock absorber and determines whether the temporarily selected shock absorber matches the application or not.

If it is judged that the temporarily selected shock absorber matches the application, then the shock absorber selection processing means 504 determines the product number of the temporarily selected shock absorber to be a selected product number, and displays the shock absorber selection result screen 526 shown in FIG. 51.

Subsequently, though not illustrated in detail, when the print button 534 is selected, the results (the various energy values, the impact object equivalent mass, the various characteristic values, etc.) of the shock absorber selection are printed. When the save button 538 is selected, these results (the various energy values, the impact object equivalent mass, the various characteristic values, etc.) of the shock absorber selection are saved on a hard disk, an optical disk or the like.

A program for realizing one of the items on the menu screen 52 shown in FIG. 2, i.e., "OPTIONS" will be described below with reference to FIGS. 52 through 54.

Figure 52:
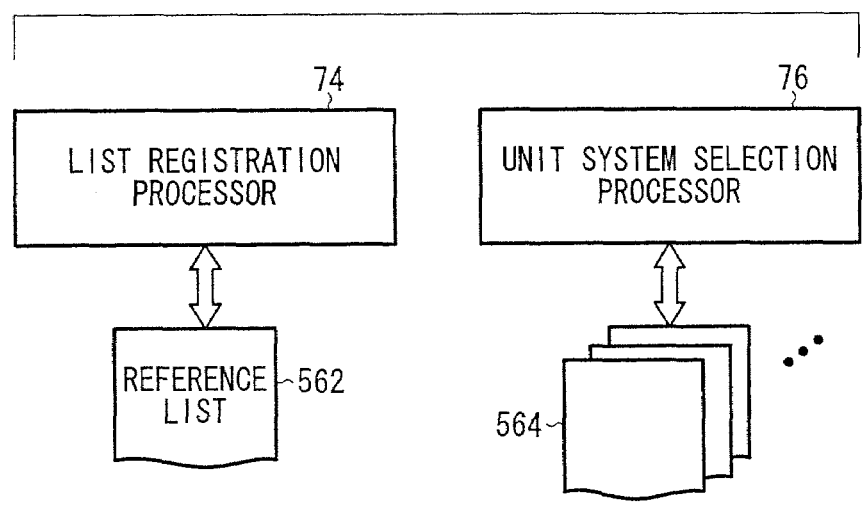
FIG. 52 is a functional block diagram of a list registration processing means and a unit system selection processing means.

As shown in FIG. 52, the general-purpose master of the options is realized when the list registration processing means 74 is activated. The list registration processing means 74 has a function to register, in advance, input values that are used highly frequently, in a reference list 562 which corresponds to the input items used to select a cylinder operating system and a shock absorber with the standard circuit selection processing means 60 and the shock absorber selection processing means 72.

The list registration processing means 74 displays a general-purpose master screen 600 shown in FIG. 53. The general-purpose master screen 600 has a tag display area 602 for displaying a plurality of functions selectively with tags, an input item display area 604 for displaying a pull-down list of input items, a general-purpose data display area 606 for displaying a list of data registered in input items selected from the input item display area 604, an addition button (icon) 608 for adding general-purpose data, and a delete button (icon) 610 for deleting general-purpose data.

For editing general-purpose data, the general-purpose data is clicked and only numerical data is changed.

Use of the general-purpose master allows the reference list 562 to be used to refer to values that are used highly frequently for entering settings, so that the time required to enter data can be shortened efficiently.

The unit master of the options is realized when the unit system selection processing means 76 shown in FIG. 52 is activated. The unit system selection processing means 76 has a function to select a list 564 of a unit system based on input data from the coordinate input unit 24 or the like, among a plurality of lists 564 on which unit systems to be used are registered in advance.

The unit system selection processing means 76 displays a unit master screen 620 shown in FIG. 54. As shown in FIG. 54, the unit master screen 620 has a unit standard display area 622 for displaying a list of standards of registered units, a registered unit display area 624 for displaying a list of units registered in a unit standard, and a select button (icon) 626 for selecting a unit standard to be used among a plurality of unit standards displayed in the unit standard display area 622.

Use of the unit master allows a unit system to be selected at the time of entering data, thus permitting entered numerical values to be used as they are, without the need for converting units.

The pneumatic device selection system, the pneumatic device selection method, the recording medium, and the pneumatic device selection program according to the present invention provide the standard circuit selection processing means 60 for selecting a cylinder operating system based on input data from the coordinate input unit 24 or the like, and the shock absorber selection processing means 72 for selecting a shock absorber based on input data from the coordinate input unit 24 and/or the selected result from the standard circuit selection processing means 60. Therefore, the pneumatic device selection system, the pneumatic device selection method, the recording medium, and the pneumatic device selecting program according to the present invention have more functions than the proposed method of selecting a pneumatic device (see Japanese Laid-Open Patent Publication No. 2000-179503), improve calculation processes, and increase the accuracy with which to select a pneumatic device.

In particular, according to the present embodiment, since the pneumatic device selection system has the branching and joining circuit processing means 66, the accuracy as to the process of selecting not only a pneumatic circuit 80 alone, but also a pneumatic device having a branching and joining circuit 64 including a plurality of pneumatic circuits 80 is increased, and the ease with which to select various devices is increased.

Furthermore, according to the present embodiment, since the pneumatic device selection system has the manifold circuit processing means 70, the accuracy as to the method of selecting a pneumatic device having a manifold circuit 68 including a plurality of pneumatic circuits 80 is increased, and the ease with which to select various devices is increased.

The pneumatic device selection system, the pneumatic device selection method, the recording medium, and the pneumatic device selection program according to the present invention are not limited to the above embodiment, but may take various configurations without departing from the scope of the present invention.

EXAMPLES

Figure 55:
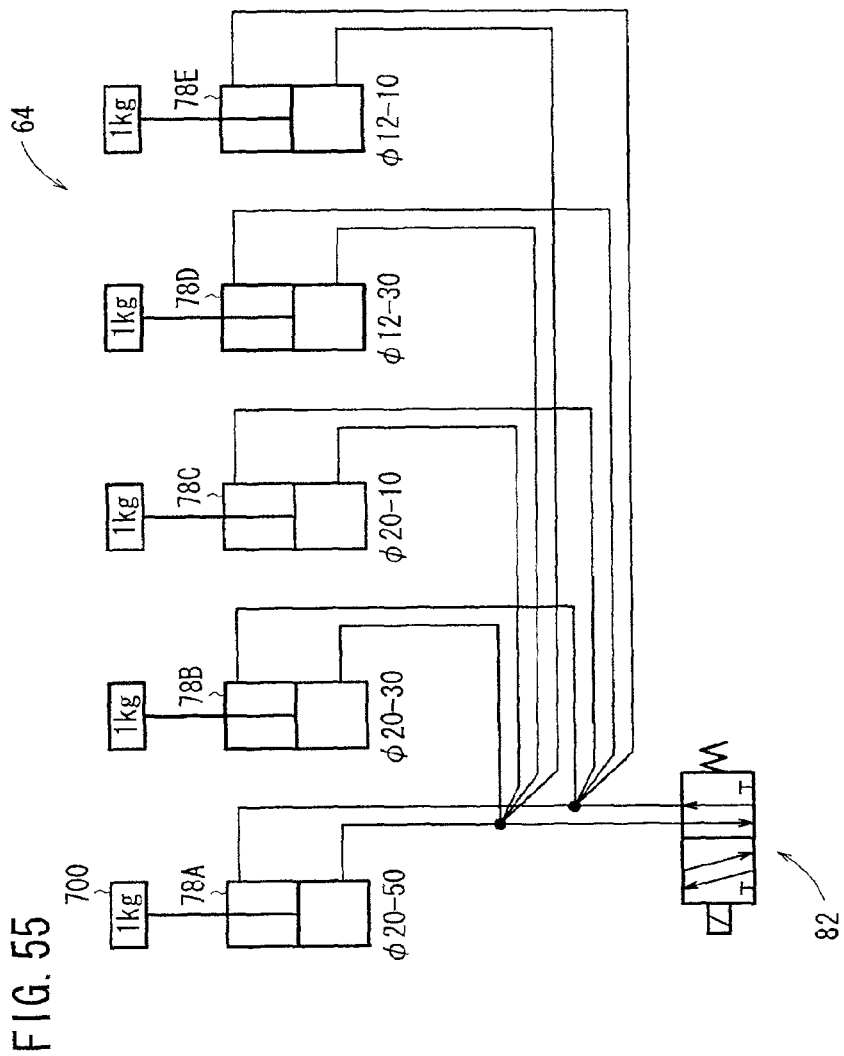
FIG. 55 is a circuit diagram of a branching and joining circuit used as a calculation example of a program of the pneumatic device selection system according to the embodiment.

As an example of calculations by programs of the pneumatic device selection system 10 according to the present embodiment, calculations and experimental verification were carried out with respect to a branching and joining circuit 64 shown in FIG. 55.

The branching and joining circuit 64 is a system for simultaneously driving five cylinders 78A through 78E of different sizes with a single solenoid valve 82.

Figure 56:
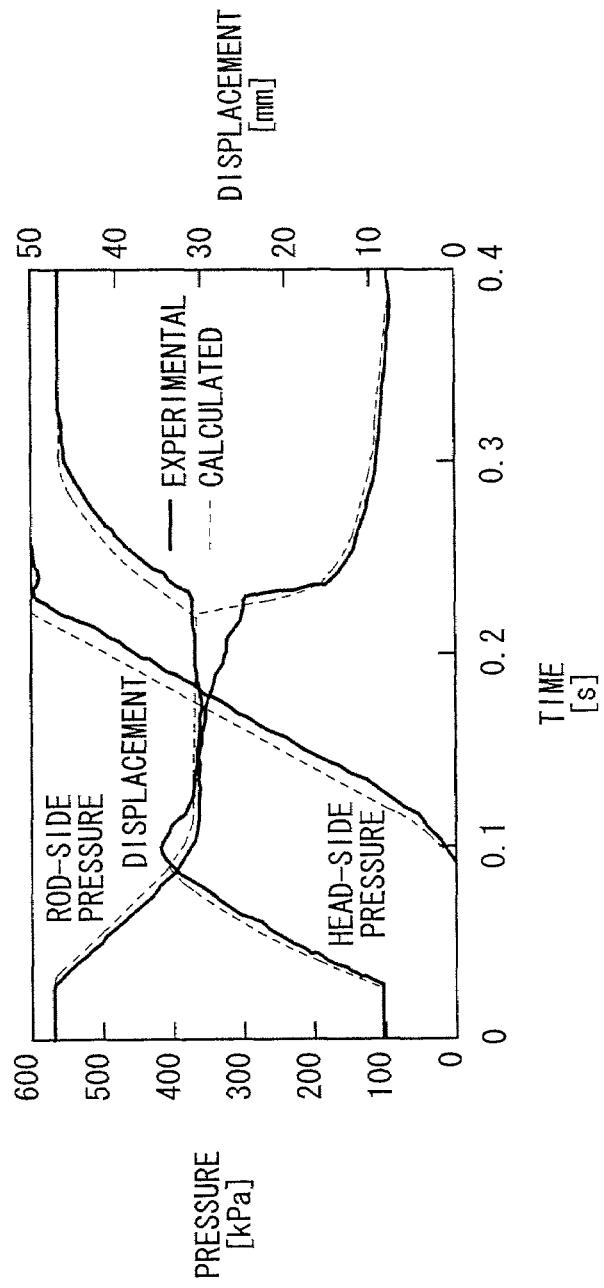
FIG. 56 is a characteristic diagram showing calculated results and experimental results at the time a 20-50-diameter cylinder in the branching and joining circuit has its piston rod projected.

The cylinders 78A through 78E actuate respective loads 700 of 1 kg in a vertically upward orientation. Examples of results are shown in FIGS. 56 and 57. FIGS. 56 and 57 show a comparison between calculated and experimental results of the 20-50-diameter cylinder 78A in the branching and joining circuit 64 shown in FIG. 55. FIG. 56 shows a comparison between calculated results and experimental results at the time the cylinder has its piston rod projected, and FIG. 57 shows a comparison between calculated results and experimental results at the time the cylinder has its piston rod retracted. In FIGS. 56 and 57, the calculated results are indicated by broken-line curves, and the experimental results are indicated by solid-line curves.

It can be seen from these results that both when the piston is projected and when the piston is retracted, the pressure in the cylinder chamber and the displacement of the piston which have been calculated are essentially in agreement with the experimental results.

The invention claimed is:

1. A pneumatic device selection system including:
a computer;
an input unit connected to said computer, for entering input data based on an input action of an operator into said computer; and
a display unit connected to said computer, for displaying processed information from said computer;
wherein said pneumatic device selection system comprises:
branching and joining circuit selecting means for selecting a branching and joining circuit having one solenoid valve and at least two pneumatic circuits each having at least one cylinder, based on input data from said input unit, said branching and joining circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;
means for determining whether or not all of the cylinders in said at least two pneumatic circuits have reached a stroke end based on whether or not a measured time up to a present time has reached all of the stroke end times of the cylinders that make up the selected branching and joining circuit, and for adding a predetermined time interval to said present time to thereby increment said present time if said present time has not yet reached all of the stroke end times of said cylinders that make up the selected branching a jointing circuit;
characteristic calculating means for calculating, following each time that said predetermined time interval is added to said present time, a characteristic of said branching and joining circuit selected by said branching and joining circuit selecting means, based on input data from said input unit;
means for displaying said branching and joining circuit which is being selected or has been selected by said branching and joining circuit selecting means; and
means for displaying results calculated by said characteristic calculating means,
said means for displaying results further comprising:
an overall characteristic result screen displaying means for displaying on said display unit an overall characteristic result screen, the overall characteristic result screen displaying a selected branching and joining circuit, numerical values of individual characteristics of the at least two pneumatic circuits that make up the selected branching and joining circuit, and overall characteristics of the selected branching and joining circuit; and
an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

2. A pneumatic device selection system according to claim 1, wherein said characteristic calculating means for said branching and joining circuit has:
flow volume adding means for adding flow volumes from the selected at least two pneumatic circuits at predetermined time intervals; and
repeating means for performing calculations at said flow volume adding means until all of the selected at least two pneumatic circuits reach a stroke end.

3. A pneumatic device selection system including:
a computer;
an input unit connected to said computer, for entering input data based on an input action of an operator into said computer; and
a display unit connected to said computer, for displaying processed information from said computer;
wherein said pneumatic device selection system comprises:
manifold circuit selecting means for selecting a manifold circuit having at least one manifold and at least two pneumatic circuits each having at least a cylinder and a solenoid valve, based on input data from said input unit, said manifold circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;
means for determining whether or not all of the cylinders in said at least two pneumatic circuits have reached a stroke end based on whether or not a measured time up to a present time has reached all of the stroke end times of the cylinders that make up the selected manifold circuit, and for adding a predetermined time interval to said present time to thereby increment said present time if said present time has not yet reached all of the stroke end times of said cylinders that make up the selected manifold circuit;
characteristic calculating means for calculating, following each time that said predetermined time interval is added to said present time, a characteristic of said manifold circuit selected by said manifold circuit selecting means, based on input data from said input unit;

means for displaying said manifold circuit which is being selected or has been selected by said manifold circuit selecting means; and means for displaying results calculated by said characteristic calculating means, said means for displaying results further comprising:

an overall characteristic result screen displaying means for displaying on said display unit an overall characteristic result screen, the overall characteristic result screen displaying a selected manifold circuit, numerical values of individual characteristics of the at least two pneumatic circuits that make up the selected manifold circuit, and overall characteristics of the selected manifold circuit; and an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

4. A pneumatic device selection system according to claim 3, wherein said characteristic calculating means for said manifold circuit has:

flow volume adding means for adding flow volumes from respective solenoid valves of the selected at least two pneumatic circuits at predetermined time intervals;

dynamic characteristic calculating means for calculating a dynamic characteristic of said manifold based on the sum of the flow volumes at each of the predetermined time intervals; and repeating means for performing calculations at said flow volume adding means and calculations at said dynamic characteristic calculating means until all of the selected at least two pneumatic circuits reach a stroke end.

5. A pneumatic device selection system including:

a computer;

an input unit connected to said computer, for entering input data based on an input action of an operator into said computer; and a display unit connected to said computer, for displaying processed information from said computer;

wherein said pneumatic device selection system comprises:

branching and joining circuit selecting means for selecting a branching and joining circuit having one solenoid valve and at least two pneumatic circuits each having at least one cylinder, based on input data from said input unit, said branching and joining circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

manifold circuit selecting means for selecting a manifold circuit having at least one manifold and at least two pneumatic circuits each having at least a cylinder and a solenoid valve, based on input data from said input unit, said manifold circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

means for determining whether or not all of the cylinders in said at least two pneumatic circuits have reached a stroke end based on whether or not a measured time up to a present time has reached all of the stroke end times of said cylinders that make up the selected branching and joining circuit or the selected manifold circuit, and for adding a predetermined time interval to said present time to thereby increment said present time if said present time has not yet reached all of the stroke end times of said cylinders that make up the selected branching and joining circuit or the selected manifold circuit;

characteristic calculating means for calculating, following each time that said predetermined time interval is added to said present time, a characteristic of said branching and joining circuit selected by said branching and joining circuit selecting means, or a characteristic of said manifold circuit selected by said manifold circuit selecting means, based on input data from said input unit;

means for displaying said branching and joining circuit which is being selected or has been selected by said branching and joining circuit selecting means;

means for displaying said manifold circuit which is being selected or has been selected by said manifold circuit selecting means; and means for displaying results calculated by said characteristic calculating means, said means for displaying results further comprising:

an overall characteristic result screen displaying means for displaying on said display unit an overall characteristic result screen, the overall characteristic result screen displaying a selected branching and joining circuit or a selected manifold circuit, numerical values of individual characteristics of the at least two pneumatic circuits that make up the selected branching and joining circuit or the selected manifold circuit, and overall characteristics of the selected branching and joining circuit or the selected manifold circuit; and an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit or the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

6. A pneumatic device selection system according to claim 5, wherein said characteristic calculating means for said branching and joining circuit has:
flow volume adding means for adding flow volumes from the selected at least two pneumatic circuits at predetermined time intervals; and
repeating means for performing calculations at said flow volume adding means until all of the selected at least two pneumatic circuits reach a stroke end.

7. A pneumatic device selection system according to claim 5, wherein said characteristic calculating means for said manifold circuit has:
flow volume adding means for adding flow volumes from respective solenoid valves of the selected at least two pneumatic circuits at predetermined time intervals;
dynamic characteristic calculating means for calculating a dynamic characteristic of said manifold based on the sum of the flow volumes at each of the predetermined time intervals; and
repeating means for performing calculations at said flow volume adding means and calculations at said dynamic characteristic calculating means until all of the selected at least two pneumatic circuits reach a stroke end.

8. A pneumatic device selection method embodied in a non-transitory computer readable storage medium for use in a pneumatic device selection system including a computer, an input unit connected to said computer, for entering input data based on an input action of an operator into said computer, and a display unit connected to said computer, for displaying processed information from said computer, said pneumatic device selection method comprising the steps of:
selecting a branching and joining circuit having one solenoid valve and at least two pneumatic circuits each having at least one cylinder, based on input data from said input unit, said step of selecting a branching and joining circuit further comprising displaying at least one common item that is common to said at least two pneumatic circuits and enabling properties of said at least one common item to be set, and displaying, separately from said at least one common item, an individual item of only one of said at least two pneumatic circuits and enabling properties of said individual item to be set, wherein when said individual item is displayed, the properties of said at least one common item, which were set when said at least one common item was displayed, are displayed together with said individual item;
determining whether or not all of the cylinders in said at least two pneumatic circuits have reached a stroke end based on whether or not a measured time up to a present time has reached all of the stroke end times of the cylinders that make up the selected branching and joining circuit, and adding a predetermined time interval to said present time to thereby increment said present time if said present time has not yet reached all of the stroke end times of said cylinders that make up the selected branching and joining circuit;
calculating, following each time that said predetermined time interval is added to said present time, a characteristic of said branching and joining circuit selected in the branching and joining circuit selecting step, based on input data from said input unit;
displaying said branching and joining circuit which is being selected or has been selected in the branching and joining circuit selecting step; and
displaying results calculated by the calculating step, the step of displaying results further comprising the steps of:
displaying on said display unit an overall characteristic result screen, the overall characteristic result screen displaying a selected branching and joining circuit, numerical values of individual characteristics of the at least two pneumatic circuits that make up the selected branching and joining circuit, and overall characteristics of the selected branching and joining circuit; and
displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

9. A pneumatic device selection method embodied in a non-transitory computer readable storage medium for use in a pneumatic device selection system including a computer, an input unit connected to said computer, for entering input data based on an input action of an operator into said computer, and a display unit connected to said computer, for displaying processed information from said computer, said pneumatic device selection method comprising the steps of:
selecting a manifold circuit having at least one manifold and at least two pneumatic circuits each having at least a cylinder and a solenoid valve, based on input data from said input unit, said step of selecting a manifold circuit further comprising displaying at least one common item that is common to said at least two pneumatic circuits and enabling properties of said at least one common item to be set, and displaying, separately from said at least one common item, an individual item of only one of said at least two pneumatic circuits and enabling properties of said individual item to be set, wherein when said individual item is displayed, the properties of said at least one common item, which were set when said at least one common item was displayed, are displayed together with said individual item;
determining whether or not all of the cylinders in said at least two pneumatic circuits have reached a stroke end based on whether or not a measured time up to a present time has reached all of the stroke end times of the cylinders that make up the selected manifold circuit, and adding a predetermined time interval to said present time to thereby increment said present time if said present time has not yet reached all of the stroke end times of said cylinders that make up the selected manifold circuit;
calculating, following each time that said predetermined time interval is added to said present time, a characteristic of said manifold circuit selected in the manifold circuit selecting step, based on input data from said input unit;

displaying said manifold circuit which is being selected or has been selected in the manifold circuit selecting step; and displaying results calculated by the calculating step, the step of displaying results further comprising the steps of:

displaying on said display unit an overall characteristic result screen, the overall characteristic result screen displaying a selected manifold circuit, numerical values of individual characteristics of the at least two pneumatic circuits that make up the selected manifold circuit, and overall characteristics of the selected manifold circuit; and displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

10. A pneumatic device selection method embodied in a non-transitory computer readable storage medium for use in a pneumatic device selection system including a computer, an input unit connected to said computer, for entering input data based on an input action of an operator into said computer, and a display unit connected to said computer, for displaying processed information from said computer, said pneumatic device selection method comprising the steps of:

selecting a branching and joining circuit having one solenoid valve and at least two pneumatic circuits each having at least one cylinder, based on input data from said input unit, said step of selecting a branching and joining circuit further comprising displaying at least one common item that is common to said at least two pneumatic circuits and enabling properties of said at least one common item to be set, and displaying, separately from said at least one common item, an individual item of only one of said at least two pneumatic circuits and enabling properties of said individual item to be set, wherein when said individual item is displayed, the properties of said at least one common item, which were set when said at least one common item was displayed, are displayed together with said individual item;

selecting a manifold circuit having at least one manifold and at least two pneumatic circuits each having at least a cylinder and a solenoid valve, based on input data from said input unit, said step of selecting a branching and joining circuit further comprising displaying at least one common item that is common to said at least two pneumatic circuits and enabling properties of said at least one common item to be set, and displaying, separately from said at least one common item, an individual item of only one of said at least two pneumatic circuits and enabling properties of said individual item to be set, wherein when said individual item is displayed, the properties of said at least one common item, which were set when said at least one common item was displayed, are displayed together with said individual item;

determining whether or not all of the cylinders in said at least two pneumatic circuits have reached a stroke end based on whether or not a measured time up to a present time has reached all of the stroke end times of the cylinders that make up the selected branching and joining circuit or the selected manifold circuit, and adding a predetermined time interval to said present time to thereby increment said present time if said present time has not yet reached all of the stroke end times of said cylinders that make up the selected branching and joining circuit or the selected manifold circuit;

calculating, following each time that said predetermined time interval is added to said present time, a characteristic of said branching and joining circuit selected in the branching and joining circuit selecting step, or a characteristic of said manifold circuit selected in the manifold circuit selecting step, based on input data from said input unit;

displaying said branching and joining circuit which is being selected or has been selected in the branching and joining circuit selecting step;

displaying said manifold circuit which is being selected or has been selected in the manifold circuit selecting step; and displaying results calculated by the calculating step, the step of displaying results further comprising the steps of:

displaying on said display unit an overall characteristic result screen, the overall characteristic result screen displaying a selected branching and joining circuit or a selected manifold circuit, numerical values of individual characteristics of the at least two pneumatic circuits that make up the selected branching and joining circuit or the selected manifold circuit, and overall characteristics of the selected branching and joining circuit or the selected manifold circuit; and displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit or the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

11. A non-transitory computer-readable recording medium having recorded therein a program enabling a pneumatic device selection system including a computer, an input unit connected to said computer, for entering input data based on an input action of an operator into said computer, and a display unit connected to said computer, for displaying processed information from said computer, to function as:

branching and joining circuit selecting means for selecting a branching and joining circuit having one solenoid valve and at least two pneumatic circuits each having at least one cylinder, based on input data from said input unit, said branching and joining circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

means for determining whether or not all of the cylinders in said at least two pneumatic circuits have reached a stroke end based on whether or not a measured time up to a present time has reached all of the stroke end times of the cylinders that make up the selected branching and joining circuit, and for adding a predetermined time interval to said present time to thereby increment said present time if said present time has not yet reached all of the stroke end times of said cylinders that make up the selected branching a jointing circuit;

characteristic calculating means for calculating, following each time that said predetermined time interval is added to said present time, a characteristic of said branching and joining circuit selected by said branching and joining circuit selecting means, based on input data from said input unit;

means for displaying said branching and joining circuit which is being selected or has been selected by said branching and joining circuit selecting means; and means for displaying results calculated by said characteristic calculating means, said means for displaying results further comprising:

an overall characteristic result screen displaying means for displaying on said display unit an overall characteristic result screen, the overall characteristic result screen displaying a selected branching and joining circuit, numerical values of individual characteristics of the at least two pneumatic circuits that make up the selected branching and joining circuit, and overall characteristics of the selected branching and joining circuit; and an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

12. A non-transitory computer-readable recording medium having recorded therein a program enabling a pneumatic device selection system including a computer, an input unit connected to said computer, for entering input data based on an input action of an operator into said computer, and a display unit connected to said computer, for displaying processed information from said computer, to function as:

manifold circuit selecting means for selecting a manifold circuit having at least one manifold and at least two pneumatic circuits each having at least a cylinder and a solenoid valve, based on input data from said input unit, said manifold circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

means for determining whether or not all of the cylinders in said at least two pneumatic circuits have reached a stroke end based on whether or not a measured time up to a present time has reached all of the stroke end times of the cylinders that make up the selected manifold circuit, and for adding a predetermined time interval to said present time to thereby increment said present time if said present time has not yet reached all of the stroke end times of said cylinders that make up the selected manifold circuit;

characteristic calculating means for calculating, following each time that said predetermined time interval is added to said present time, a characteristic of said manifold circuit selected by said manifold circuit selecting means, based on input data from said input unit;

means for displaying said manifold circuit which is being selected or has been selected by said manifold circuit selecting means; and means for displaying results calculated by said characteristic calculating means, said means for displaying results further comprising:

an overall characteristic result screen displaying means for displaying on said display unit an overall characteristic result screen, the overall characteristic result screen displaying a selected manifold circuit, numerical values of individual characteristics of the at least two pneumatic circuits that make up the selected manifold circuit, and overall characteristics of the selected manifold circuit; and an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

13. A non-transitory computer-readable recording medium having recorded therein a program enabling a pneumatic device selection system including a computer, an input unit connected to said computer, for entering input data based on an input action of an operator into said computer, and a display unit connected to said computer, for displaying processed information from said computer, to function as:

branching and joining circuit selecting means for selecting a branching and joining circuit having one solenoid valve and at least two pneumatic circuits each having at least one cylinder, based on input data from said input unit, said branching and joining circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

manifold circuit selecting means for selecting a manifold circuit having at least one manifold and at least two pneumatic circuits each having at least a cylinder and a solenoid valve, based on input data from said input unit, said manifold circuit selecting means further comprising common selecting means for selecting and displaying at least one common item that is common to said at least two pneumatic circuits and enabling properties of said at least one common item to be set, and individual selecting means for selecting and displaying, separately from said at least one common item, an individual item of only one of said at least two pneumatic circuits and enabling properties of said individual item to be set, wherein when said individual item is displayed, the properties of said at least one common item, which were set through said common selecting means, are displayed together with said individual item;

means for determining whether or not all of the cylinders in said at least two pneumatic circuits have reached a stroke end based on whether or not a measured time up to a present time has reached all of the stroke end times of said cylinders that make up the selected branching and joining circuit or the selected manifold circuit, and for adding a predetermined time interval to said present time to thereby increment said present time if said present time has not yet reached all of the stroke end times of said cylinders that make up the selected branching and joining circuit or the selected manifold circuit;

characteristic calculating means for calculating, following each time that said predetermined time interval is added to said present time, a characteristic of said branching and joining circuit selected by said branching and joining circuit selecting means, or a characteristic of said manifold circuit selected by said manifold circuit selecting means, based on input data from said input unit;

means for displaying said branching and joining circuit which is being selected or has been selected by said branching and joining circuit selecting means;

means for displaying said manifold circuit which is being selected or has been selected by said manifold circuit selecting means; and means for displaying results calculated by said characteristic calculating means, said means for displaying results further comprising:

an overall characteristic result screen displaying means for displaying on said display unit an overall characteristic result screen, the overall characteristic result screen displaying a selected branching and joining circuit or a selected manifold circuit, numerical values of individual characteristics of the at least two pneumatic circuits that make up the selected branching and joining circuit or the selected manifold circuit, and overall characteristics of the selected branching and joining circuit or the selected manifold circuit; and an individual characteristic result screen displaying means for displaying on said display unit, separately from said overall characteristic result screen, an individual characteristic result screen, the individual characteristic result screen graphically displaying dynamic behavior and a plurality of different values over time of only a designated individual one of the at least two pneumatic circuits that make up the selected branching and joining circuit or the selected manifold circuit, said plurality of different values over time comprising velocity over time, acceleration over time, pressure over time, and displacement over time of said designated individual one pneumatic circuit, said individual characteristic result screen further including a plurality of individual result screen switching buttons, which enable the designated individual one of the at least two pneumatic circuits to be switched.

* * * * *